United States Patent
Wolk et al.

(10) Patent No.: US 8,547,015 B2
(45) Date of Patent: Oct. 1, 2013

(54) LIGHT EXTRACTION FILMS FOR ORGANIC LIGHT EMITTING DEVICES (OLEDS)

(75) Inventors: Martin B. Wolk, Woodbury, MN (US); Sergey Lamansky, Apple Valley, MN (US); William Blake Kolb, West Lakeland, MN (US); Encai Hao, Woodbury, MN (US); Jun-Ying Zhang, Woodbury, MN (US); David S. Thompson, West Lakeland, MN (US); Vivan W. Jones, Woodbury, MN (US); Kevin R. Schaffer, Woodbury, MN (US); Audrey A. Sherman, Saint Paul, MN (US); Zhaohui Yang, North Oaks, MN (US); Leslie A. Todero, Saint Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 100 days.

(21) Appl. No.: 12/908,798

(22) Filed: Oct. 20, 2010

(65) Prior Publication Data

US 2012/0098421 A1    Apr. 26, 2012

(51) Int. Cl.
   *H05B 33/00*    (2006.01)
(52) U.S. Cl.
   USPC .......................................... 313/512; 313/503
(58) Field of Classification Search
   USPC ................................................ 313/498–512
   See application file for complete search history.

(56) References Cited

U.S. PATENT DOCUMENTS

| 2,801,185 | A | 7/1957 | Iler |
| 3,213,753 | A | 10/1965 | Rogers |
| 4,379,201 | A | 4/1983 | Heilmann et al. |
| 4,522,958 | A | 6/1985 | Das et al. |
| 4,737,559 | A | 4/1988 | Kellen et al. |
| 5,440,446 | A | 8/1995 | Shaw et al. |
| 5,877,895 | A | 3/1999 | Shaw et al. |
| 6,010,751 | A | 1/2000 | Shaw et al. |

(Continued)

FOREIGN PATENT DOCUMENTS

| JP | 2005-266293 | 9/2005 |
| WO | WO 2006/026743 | 3/2006 |

(Continued)

OTHER PUBLICATIONS

Lu et al., "Optimization of external coupling and light emission in organic light-emitting devices: modeling and experiment", J. Appl. Phys. 91 (Jan. 15, 2002), pp. 595-604).

(Continued)

*Primary Examiner* — Joseph L Williams

(57) ABSTRACT

Optical films for enhancing light extraction from self-emissive light sources such as bottom-emitting or top-emitting OLEDs are disclosed. The extraction films typically include a flexible carrier film, and a first and second layer carried by the carrier film. The first or second layer has a nanovoided morphology and includes a polymer binder, and may also have a refractive index less than 1.35 or 1.3. An embedded structured surface of light extraction elements is formed between the first and second layers. The light extraction elements may be primarily diffractive elements adapted to be disposed within an evanescent zone of the OLED, or they may be primarily refractive elements adapted to be disposed outside the evanescent zone. The extraction film may also include a third layer, and a second embedded structured surface may be formed between the third layer and the first layer.

30 Claims, 20 Drawing Sheets

(56) References Cited

U.S. PATENT DOCUMENTS

| | | |
|---|---|---|
| 6,285,001 B1 | 9/2001 | Fleming et al. |
| 7,018,713 B2 | 3/2006 | Padiyath et al. |
| 7,094,122 B2 | 8/2006 | Toguchi et al. |
| 7,098,590 B2 | 8/2006 | Lim et al. |
| 7,122,845 B2 | 10/2006 | Uchida |
| 7,165,959 B2 | 1/2007 | Humlicek et al. |
| 7,210,836 B2 | 5/2007 | Sasagawa |
| 7,224,529 B2 | 5/2007 | King et al. |
| 7,247,394 B2 | 7/2007 | Hatwar et al. |
| 7,547,476 B2 | 6/2009 | Jones et al. |
| 7,589,461 B2 | 9/2009 | Park et al. |
| 7,602,117 B2 | 10/2009 | Yamada et al. |
| 2005/0052750 A1 | 3/2005 | King et al. |
| 2005/0185279 A1 | 8/2005 | Mullen et al. |
| 2005/0196552 A1* | 9/2005 | Lehmann et al. ............... 428/1.1 |
| 2006/0219676 A1 | 10/2006 | Taylor et al. |
| 2007/0065638 A1* | 3/2007 | Wang et al. ................... 428/141 |
| 2008/0084519 A1 | 4/2008 | Brigham et al. |
| 2009/0015142 A1 | 1/2009 | Potts et al. |
| 2009/0015757 A1 | 1/2009 | Potts et al. |
| 2009/0257324 A1 | 10/2009 | Seigler |
| 2009/0316058 A1 | 12/2009 | Huizinga et al. |
| 2010/0110551 A1 | 5/2010 | Lamansky et al. |
| 2010/0150513 A1 | 6/2010 | Zhang et al. |

FOREIGN PATENT DOCUMENTS

| | | |
|---|---|---|
| WO | WO 2010/120422 | 10/2010 |
| WO | WO 2010/120468 | 10/2010 |
| WO | WO 2010/120845 | 10/2010 |
| WO | WO 2010/120864 | 10/2010 |
| WO | WO 2010/120871 | 10/2010 |
| WO | WO 2010/120971 | 10/2010 |
| WO | WO 2010/121019 | 10/2010 |

OTHER PUBLICATIONS

U.S. Appl. No. 12/643,503, "Optical Films Enabling Autostereoscopy", filed Dec. 21, 2009.

U.S. Appl. No. 61/359,634, "Lighting Assembly Having Viscoelastic Lightguide", filed Jun. 29, 2010.

U.S. Appl. No. 61/294,610, "Microstructured Low Refractive Index Viscoelastic Articles", filed Jan. 13, 2010.

U.S. Appl. No. 61/294,600, "Microstructured Low Refractive Index Articles", filed Jan. 13, 2010.

U.S. Appl. No. 61/294,577, "Microstructured Low Refractive Index Article Process", filed Jan. 13, 2010.

U.S. Appl. No. 61/303,152, "Optical Device Having Lightguide and Nanovoided Polymeric Layer", filed Feb. 10, 2010.

* cited by examiner

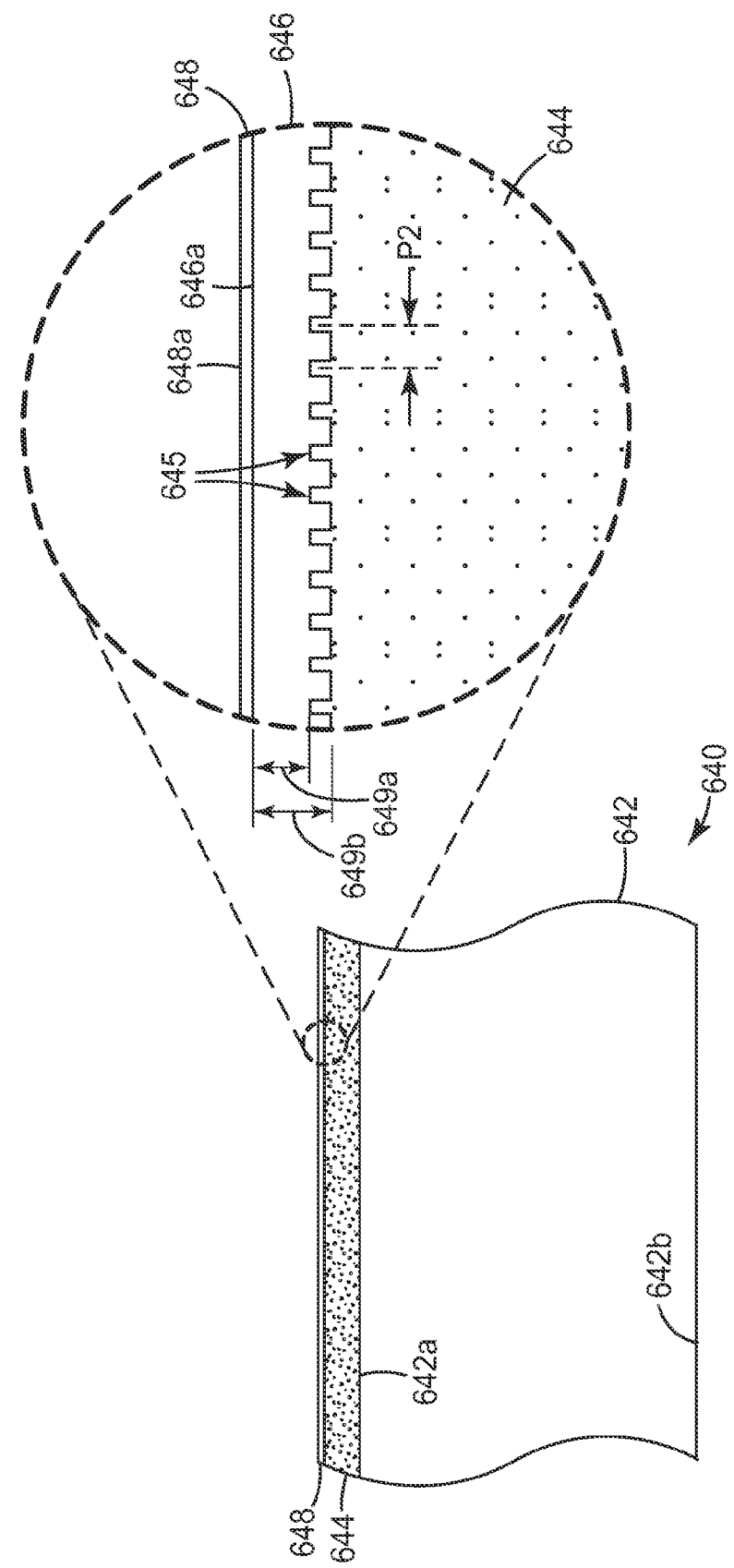

LIGHT EXTRACTION FILMS FOR ORGANIC LIGHT EMITTING DEVICES (OLEDS)

FIELD OF THE INVENTION

This invention relates generally to optical films having structured surfaces tailored to couple light out of solid state self-emissive lighting devices to increase the brightness thereof, with particular application to self-emissive lighting devices known as organic light emitting devices (OLEDs) (sometimes also referred to as organic light emitting diodes). The invention also pertains to related articles, systems, and methods.

BACKGROUND

A wide variety of OLEDs are known. Some OLEDs, referred to as "bottom emitting" OLEDS, emit light through a transparent substrate on which the OLED is fabricated. Others, referred to as "top emitting" OLEDs, emit light in the opposite direction, i.e., away from the substrate on which the OLED is fabricated. Some OLEDs are patterned to form an array of individually addressable OLED emitters, referred to individually as pixels (picture elements) or subpixels (one of several neighboring emitters of different colors that are grouped together as a pixel but are individually addressable). Such pixelated OLEDs are becoming increasingly popular for use in digital display devices such as for mobile phones and similar end uses. In contrast to pixelated OLEDs, other OLEDs are designed to have only one emitting area, which may be small and narrow or large and extended depending on the intended application.

One issue of concern to some OLED manufacturers and designers is the less-than-ideal efficiencies exhibited by OLEDs due to peculiarities of their design. The external efficiency of an OLED, or of any other self-emissive light source, can be calculated as the power of all optical radiation emitted by the device divided by the total electrical power consumed by the device. OLED external efficiency is a significant design parameter for many different OLED applications, ranging for example from pixelated OLEDs used in high-resolution displays to non-pixelated OLEDs used in lighting systems, since the external efficiency affects such device characteristics as power consumption, luminance, and lifetime. A number of groups have demonstrated that OLED external efficiency is significantly limited by optical losses within the active emitting layers of the OLED stack itself (due to waveguiding modes within high refractive index organic layers and indium tin oxide), within intermediate-refractive index substrates, and finally due to exciton quenching at the cathode (anode) metal's surface plasmon polaritons. In an OLED device that exhibits the maximum possible internal efficiency (i.e., 100% internal efficiency), about 75-80% of the generated optical radiation is dissipated internally due to the above-mentioned losses, resulting in a corresponding reduction in external efficiency. If additional optical components such as color filters or circular polarizers are included as elements of the OLED device, such components can produce additional optical losses and even lower external efficiencies.

Some optical films have already been proposed to enhance light extraction from OLED devices. Reference in this regard is made to U.S. Patent Application Publications US 2009/0015142 (Potts et al.), US 2009/0015757 (Potts et al.) (now issued as U.S. Pat. No. 8,179,034), and US-2010/0110551 (Lamansky et al.), which are incorporated herein by reference in their entireties.

BRIEF SUMMARY

We have developed a new family of optical films that can be used in combination with OLEDs and other self-emissive light sources to extract light from such devices so as to increase the emitted light and reduce losses. The disclosed optical extraction films are particularly effective in combination with various types of OLEDs. Some of the disclosed extraction films are designed to enhance light extraction by reducing the amount of light lost to waveguiding modes. Some of the extraction films are designed to enhance light extraction by reducing the amount of light that is totally internally reflected at an outermost surface or boundary of the OLED. Some of the extraction films are designed to enhance light extraction by reducing both of these types of loss mechanisms.

The disclosed optical films are useful for enhancing light extraction from self-emissive light sources such as bottom-emitting or top-emitting OLEDs. The extraction films typically include a flexible carrier film, and a first and second layer carried by the carrier film. The first or second layer may have a nanovoided morphology and may include a polymer binder, and may also have a refractive index less than 1.35 or 1.3. An embedded structured surface of light extraction elements is formed between the first and second layers. The light extraction elements may be primarily diffractive elements adapted to be disposed within an evanescent zone of the OLED, or they may be primarily refractive elements, which may be disposed outside the evanescent zone. The extraction film may also include a third layer, and a second embedded structured surface may be formed between the third layer and the first layer.

The present application also discloses, inter alia, optical extraction films that includes a flexible carrier film, and a first and second layer carried by the carrier film. The first and second layers define therebetween a first embedded interface, which forms a first structured surface of first light extraction elements. The first layer has a nanovoided morphology and comprises a polymer binder, the first layer also preferably having a refractive index less than 1.35. The second layer has a refractive index greater than that of the first layer.

In some cases, the first layer may have a refractive index less than 1.3. In some cases, the second layer may have a refractive index greater than 1.4. In some cases, a refractive index difference between the first and second layers is at least 0.3, or at least 0.4, or at least 0.5. In some cases, the first layer may be disposed between the carrier film and the second layer. In some cases, the first light extraction elements are small enough, and the second layer is thin enough, so that a substantial portion of the extraction elements are disposed within an evanescent zone of the self-emissive light source when the extraction film is combined with the self-emissive light source. In some cases, the first light extraction elements may comprise diffractive elements. In some cases, the first light extraction elements may have a pitch of less than 1 micrometer. In some cases, the first light extraction elements may have a pitch of greater than 1 micrometer. In some cases, the first light extraction elements may comprise refractive elements. In some embodiments, the first light extraction elements may have associated therewith a land, and the land may have a thickness of less than 50 microns. In some cases, the land thickness may be less than 25 microns. In other cases, the first light extraction elements may have no land. In some cases, the second layer may comprise a light transmissive viscoelastic material. In some cases, the film may further include a release liner covering a major surface of the second layer opposite the first structured surface.

In some cases, the extraction film may be adapted for application to the self-emissive light source which is fabricated separately from the extraction film. In some cases, the extraction film may be adapted as a substrate on which the self-emissive light source can be fabricated. In some cases, the carrier film may have physical characteristics making it suitable as a free-standing support film in roll-to-roll processing. In some cases, neither the first layer nor the second layer may have physical characteristics making it suitable as a free-standing support film in roll-to-roll processing.

In some cases, the extraction film may further include a third layer carried by the carrier film, the first and third layers defining therebetween a second embedded interface, and the second embedded interface may form a second structured surface of second light extraction elements. In some cases, the first light extraction elements may have a pitch less than 1 micron, and the second light extraction elements may have a pitch greater than 1 micron. In some cases, a substantial portion of the first light extraction elements may be adapted to be disposed within an evanescent zone of the self-emissive light source when the extraction film is combined with the self-emissive light source. In some cases, the second light extraction elements may have associated therewith a land, and the land may have a thickness of less than 50 microns. In some cases, the land thickness may be less than 25 microns. In some cases, the self-emissive light source may comprise an OLED. In some cases, the extraction film may be combined with the self-emissive light source, and the first and second layers may be disposed between the flexible carrier film and the self-emissive light source.

We also disclose devices that include an OLED and an optical extraction film attached to the OLED. The optical extraction film may include a flexible carrier film and a first and second layer carried by the carrier film, the first and second layers defining therebetween a first embedded interface that forms a first structured surface of first light extraction elements. The first layer may have a nanovoided morphology and comprise a polymer binder, and may also have a refractive index less than 1.35. The second layer may also have a refractive index greater than that of the first layer, and may be disposed between the first layer and the OLED. In some cases, a high refractive index region is associated with the OLED, the high refractive index region including at least one organic light generating layer and at least one transparent electrode layer, and a substantial portion of the first light extraction elements may be disposed within an evanescent zone of the high refractive index region. In some cases, the at least one transparent electrode layer may be part of the optical extraction film. In some cases, the first light extraction elements may include refractive elements and have a pitch of greater than 1 micron. In some cases, the first light extraction elements may have associated therewith a land, and the land may have a thickness of less than 50 microns. In some cases, the land may have a thickness of less than 25 microns.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

FIGS. 6a-6c are schematic side or cross-sectional views optical extraction films that can be used with bottom-emitting OLEDs;

In the figures, like reference numerals designate like elements.

DETAILED DESCRIPTION OF ILLUSTRATIVE EMBODIMENTS

Figure 1:
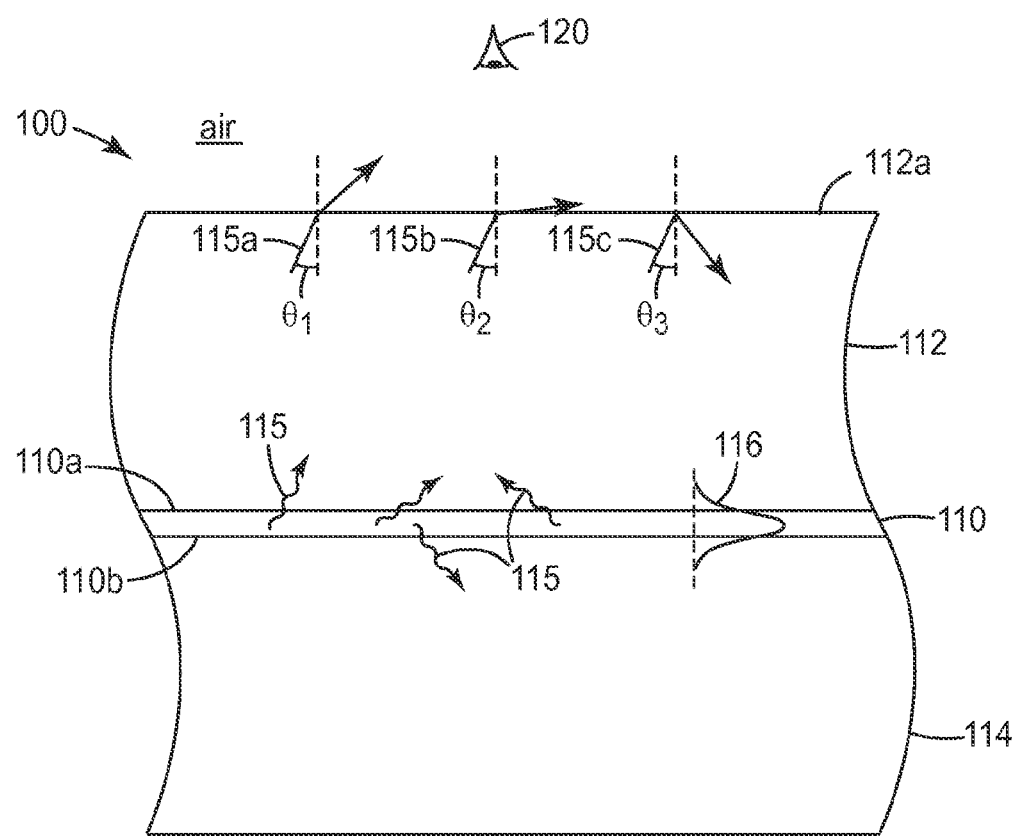
FIG. 1 is a schematic side or cross-sectional view of generalized OLED light source.

FIG. 1 depicts in an oversimplified schematic fashion a portion of one embodiment of an OLED 100. The OLED 100, which may be either a bottom-emitting or a top-emitting OLED, includes a thin emitting region 110 sandwiched between two optically thick layers 112, 114. The layers 112, 114 may serve as barrier layers to keep water vapor and oxygen away from the emitting region 110, and one of the layers 112, 114 may serve as a substrate upon which the other components of the OLED 100 are grown, deposited, or laminated. In alternative embodiments one of the thick layers 112, 114 may be omitted or replaced with an inert gas or vacuum. The emitting region 110 may include one or more conventional organic layers tailored to emit light of a desired wavelength in response to an applied electric current or field. The applied electric current may be supplied by electrodes whose major surfaces may coincide with the outer surfaces 110a, 110b of the emitting region. At least one electrode, e.g., the one disposed at surface 110a, is transparent. The electrodes and organic emitting layer(s) are typically made of materials whose refractive indices are substantially greater than about 1.5. For example, a transparent electrode made of indium tin oxide (ITO) has a refractive index of about 1.8, and typical light-emissive organic materials may have a refractive index in a range from 1.6 to 1.8. Besides having a relatively high refractive index, the emitting region is also typically very thin, e.g., on the order of a wavelength of visible light or less. For example, an ITO electrode layer may have a thickness on the order of about 150 nm, and an emissive organic layer may have a thickness on the order of about 100 nm, although of course other thicknesses may be used.

In contrast to the emitting region, the layers 112, 114 are not only optically thick, i.e., have thicknesses substantially greater than a wavelength of visible light, but they also have refractive indices that are less than those of the emitting region 110. For example, the layers 112, 114 may comprise glass or plastic whose refractive index is on the order of 1.5. As a result, the thin emitting region 110 can trap some of the light emitted by the organic material in one or more waveguiding modes, depicted generally in FIG. 1 as a waveguiding electromagnetic field 116. When electric current is applied to energize the organic material in the emitting region 110, light is emitted in all directions. Some of this light, represented by light rays 115, propagates in directions that allow the light to refract into the layer 112 or 114 and escape the emitting region 110. Another portion of the emitted light becomes trapped in the high refractive index region 110, propagating along that region as one or more waveguiding modes represented by field 116. The field 116 typically has a field strength that decays exponentially as a function of distance from the boundaries or surfaces 110a, 110b, the details of the decay depending on factors such as the refractive index difference between the region 110 and the adjacent optically thick layer 112 or 114, as well as the particular waveguiding mode if more than one mode is supported. The exponentially decaying portion of the field 116 outside of the region 110 is referred to as an evanescent wave. In most practical cases, the evanescent wave can be considered to be present within only a very short distance of the emitting region 110, e.g., in a boundary region of layer 112 or 114 adjacent the corresponding outer surface of region 110 and whose thickness may be on the order of a wavelength of visible light, e.g., on the order of 1 micrometer or less, or may be somewhat greater if the optically thick layer has a refractive index that is closer to that of the high refractive index region.

Of the light 115 that escapes the emitting region 110, some of that light travels along directions that deviate from the thickness axis or optical axis of the OLED 110 by angles that are small enough so that the light is refracted out of the layer 112. Such light is thus able to escape the OLED 100 into the surrounding air medium (note that the "air" medium of FIG. 1 may refer to any one of standard atmospheric air, or vacuum, or a suitable inert gas) and eventually reach an observer 120 or other optical component. Light rays 115a and 115b are exemplary of this escaping light. Ray 115a strikes the air interface at outer surface 112a at an angle $\theta_1$, which angle is small enough so that the light is refracted out of the OLED device and into the surrounding air medium. Ray 115b strikes the air interface at an angle $\theta_2$, which is greater than $\theta_1$ and close to the critical angle for layer 112 but still slightly smaller than the critical angle, such that the refracted light exits into the surrounding air medium at a near-glancing angle. If we follow this progression to light ray 115c, we see that some of the light 115 that escapes the emitting region 110 travels along directions that deviate from the thickness or optical axis of the OLED 100 by angles that are too large to be refracted out of the layer 112. Thus, light ray 115c strikes the air interface at an angle $\theta_3$ that is greater than the critical angle for layer 112, thus causing the ray 115c to be totally internally reflected at the surface 112 and trapped within the OLED 100.

We thus see that light can be trapped within the OLED device 100 in one of two ways: in a waveguiding mode associated with emitting region 110, and by total internal reflection (TIR) at an air interface 112a of the device. In both cases, the trapped light is typically eventually absorbed, and results in reduced brightness, reduced efficiency, and increased losses for the OLED 100. We refer to losses associated with light trapped in the emitting region as waveguide losses, and losses associated with light trapped by TIR at the outer surface of the OLED as substrate losses. Further discussion of loss mechanisms in OLEDs can be found in Lu et al., "Optimization of external coupling and light emission in organic light-emitting devices: modeling and experiment", 91 J. Appl. Phys. (Jan. 15, 2002), pp. 595-604.

Nanovoided Layers

Exemplary optical extraction films disclosed herein incorporate at least one nanovoided layer. The nanovoided layer may include a plurality of interconnected voids or a network of voids dispersed in a binder. At least some of the voids in the plurality or network are connected to one another via hollow tunnels or hollow tunnel-like passages. The voids preferably occupy a sufficiently large fraction of the volume of the layer, but are individually of a small enough size, so that the nanovoided layer behaves optically like a material of very low refractive index, e.g., less than 1.35 or less than 1.3. Such a layer is particularly advantageous for use in an optical extraction film as demonstrated more fully below. In some cases, the nanovoided layer may exhibit a refractive index in a range from 1.15 to 1.35, or from 1.15 to 1.3, for example. The nanovoided layer preferably has at least one major surface that is microstructured, i.e., deliberately tailored to have a non-smooth or non-flat surface with relief features that have at least one dimension that is less than 1 millimeter, and in some cases the at least one dimension may be in a range from 50 nanometers to 500 micrometers, or from 50 nanometers to 100 microns, or from 50 nanometers to 1 micron.

Figure 2:
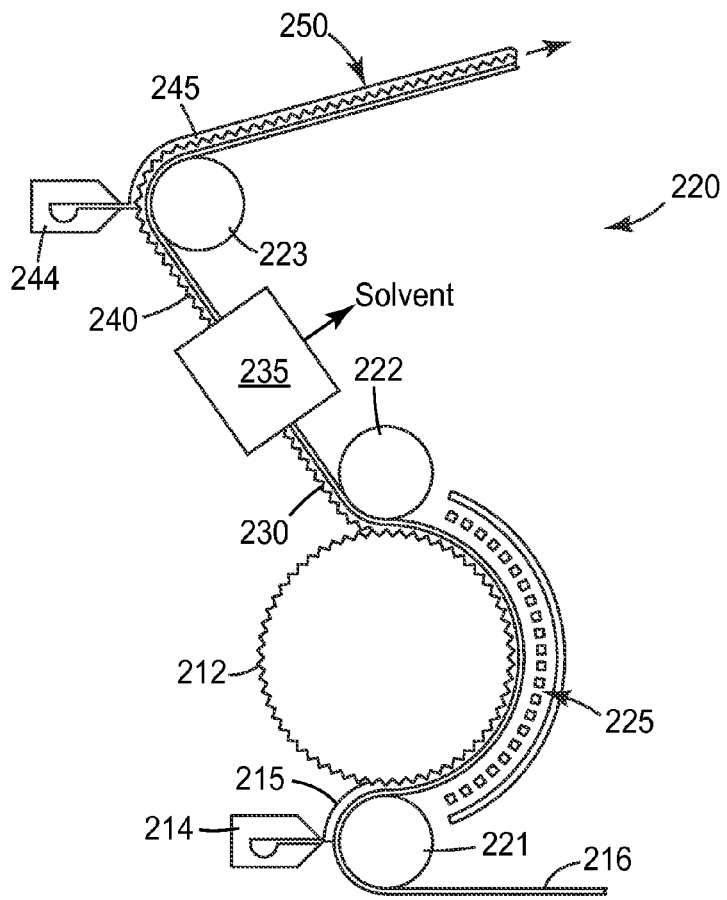
FIG. 2 is a schematic diagram of an illustrative process of forming a backfilled nanovoided microstructured article.
Figure 3:
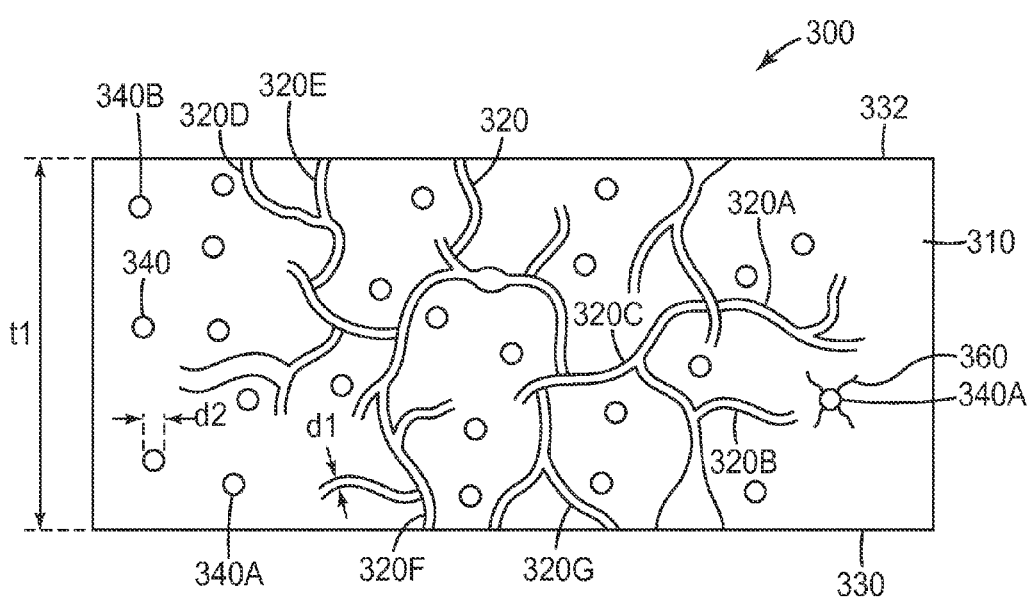
FIG. 3 is a schematic side elevational view of a portion of a nanovoided microstructured layer.

In connection with FIGS. 2 and 3, we describe exemplary methods of fabricating a nanovoided layer, as well as features and characteristics that such layers may exhibit. Further details regarding suitable nanovoided layers and their manufacture can be found in commonly assigned provisional U.S. patent application 61/405,128 entitled "Optical Films With Microstructured Low Refractive Index Nanovoided Layers and Methods Therefor", filed on Oct. 20, 2010 and incorporated herein by reference in its entirety.

Turning first to FIG. 2, we see there an exemplary process 220 of forming a backfilled nanovoided microstructured article 250, and a corresponding system for manufacturing such articles. The process 220 includes disposing a coating solution 215 onto a substrate 216. The substrate 216 is preferably a flexible film made of a polymer and/or other suitable material, the film having a thickness, composition, and other physical characteristics that make it suitable for use as a free-standing support film or carrier film in roll-to-roll processing systems such as that depicted in FIG. 2. Typically, such a substrate or carrier film, if made with a conventional light-transmissive polymer material, has a physical thickness of at least 0.002 inches (about 50 micrometers) in order to have sufficient strength to be unwound, processed in the roll-to-roll processing system, and wound up again or subjected to one or more converting operations (such as slitting or singulating into individual sheets or pieces) without excessive unintended stretching, curling, or warping.

In some cases the coating solution 215 may be applied using a die 214 such as a slot coater die for example. The coating solution 215 includes a polymerizable material and a solvent. Then the process 220 includes polymerizing the polymerizable material while the coating solution 215 is in contact with a microreplication tool 212 to form a microstructured layer 230. Solvent is then removed, for example by an oven 235, from the microstructured layer 230 to form a nanovoided microstructured article 240. Then the process 220 includes disposing a polymeric material 245 on the nanovoided microstructured article 240 to form a backfilled nanovoided microstructured article 250. The polymeric material 245 may be applied using a die 244 such as a slot coater die for example, or by other suitable means. The polymeric material 245 may alternatively be laminated onto the nanovoided microstructured article 240 to form the nanovoided microstructured article 250.

The microreplication tool 212 can be any useful microreplication tool. The microreplication tool 212 is illustrated as a roll where the microreplication surface is on the exterior of the roll. It is also contemplated that the microreplication apparatus can include a smooth roll where the microreplication tool is a structured surface of the substrate 216 that contacts the coating solution 215. The illustrated microreplication tool 212 includes a nip roll 221 and a take-away roll 222. A curing source 225, such as a bank of UV lights, is illustrated as being directed toward the substrate 216 and coating solution 215 while the coating solution 215 is in contact with the microreplication tool 212 to form a microstructured layer 230. In some embodiments, the substrate 216 can transmit the curing light to the coating solution 215 to cure the coating solution 215 and form the microstructured layer 230. In other embodiments the curing source 225 is a heat source and the coating solution 215 includes a thermal curing material. The curing source 225 can be disposed either as illustrated or within the microreplication tool 212. When the curing source 225 is disposed within the microreplication tool 212, the microreplication tool 212 can transmit light to the coating solution 215 to cure the coating solution 215 and form the microstructured layer 230.

The processes to form the nanovoided microstructured articles can include additional processing steps such as post-cure or further polymerization steps, for example. In some cases, a post-cure step is applied to the nanovoided microstructured article following the solvent removal step. In some embodiments, these processes can include additional processing equipment common to the production of web-based materials, including, for example, idler rolls, tensioning rolls, steering mechanisms, surface treaters such as corona or flame treaters, lamination rolls, and the like. In some cases, these processes can utilize different web paths, coating techniques, polymerization apparatus, positioning of polymerization apparatus, drying ovens, conditioning sections, and the like, and some of the sections described can be optional. In some cases, one, some, or all steps of the process can be carried out as a "roll-to-roll" process wherein at least one roll of substrate is passed through a substantially continuous process and ends up on another roll or is converted via sheeting, laminating, slitting, or the like.

Turning now to FIG. 3, we see there a schematic elevational view of a portion of a nanovoided microstructured layer 300. Although the nanovoided microstructured layer 300 is illustrated having two planar outer surfaces 330, 332, it is understood that at least one of the outer surfaces 330, 332 is microstructured to form relief or extraction features as discussed further herein.

Exemplary nanovoided microstructured layers 300 include a plurality of interconnected voids or a network of voids 320 dispersed in a binder 310. At least some of the voids in the plurality or network are connected to one another via hollow tunnels or hollow tunnel-like passages. The interconnected voids may be the remnant of an interconnected mass of solvent that formed part of the originally coated film, and that was driven out of the film by the oven or other means after curing of the polymerizable material. The network of voids 320 can be regarded to include interconnected voids or pores 320A-320C as shown in FIG. 3. The voids are not necessarily free of all matter and/or particulates. For example, in some cases, a void may include one or more small fiber- or string-like objects that include, for example, a binder and/or nanoparticles. Some disclosed nanovoided microstructured layers include multiple sets of interconnected voids or multiple networks of voids where the voids in each set or network are interconnected. In some cases, in addition to multiple pluralities or sets of interconnected voids, the nanovoided microstructured layer may also include a plurality of closed or unconnected voids, meaning that the voids are not connected to other voids via tunnels. In cases where a network of voids 320 forms one or more passages that extend from a first major surface 330 to an opposed second major surface 332 of the nanovoided layer 300, the layer 300 may be described as being a porous layer.

Some of the voids can reside at or interrupt a surface of the nanovoided microstructured layer and can be considered to be surface voids. For example, in the exemplary nanovoided microstructured layer 300, voids 320D and 320E reside at second major surface 332 of the nanovoided microstructured layer and can be regarded as surface voids 320D and 320E, and voids 320F and 320G reside at first major surface 330 of the nanovoided microstructured layer and can be regarded as surface voids 320F and 320G. Some of the voids, such as voids 320B and 320C, are disposed within the interior of the optical film and away from the exterior surfaces of the optical film, and can thus be regarded as interior voids 320B and 320C even though an interior void may be connected to a major surface via one or more other voids.

Voids 320 have a size $d_1$ that can generally be controlled by choosing suitable composition and fabrication, such as coating, drying, and curing conditions. In general, $d_1$ can be any desired value in any desired range of values. For example, in some cases, at least a majority of the voids, such as at least 60% or 70% or 80% or 90% or 95% of the voids, have a size that is in a desired range. For example, in some cases, at least a majority of the voids, such as at least 60% or 70% or 80% or 90% or 95% of the voids, have a size that is not greater than about 10 micrometers, or not greater than about 7, or 5, or 4, or 3, or 2, or 1, or 0.7, or 0.5 micrometers.

In some cases, a plurality of interconnected voids 320 has an average void or pore size that is not greater than about 5 micrometers, or not greater than about 4 micrometers, or not greater than about 3 micrometers, or not greater than about 2 micrometers, or not greater than about 1 micrometer, or not greater than about 0.7 micrometers, or not greater than about 0.5 micrometers.

In some cases, some of the voids can be sufficiently small so that their primary optical effect is to reduce the effective refractive index, while some other voids can reduce the effective index and scatter light, while still some other voids can be sufficiently large so that their primary optical effect is to scatter light. In some cases the voids are sufficiently small as to reduce the effective refractive index without appreciably scattering light.

The nanovoided microstructured layer 300 may have any useful thickness t1 (linear distance between first major surface 330 and second major surface 332). In many embodiments the nanovoided microstructured layer may have a thickness t1 that is not less than about 100 nm, or not less than about 500 nm, or not less than about 1,000 nm, or in a range from 0.1 to 10 micrometers, or in a range from 1 to 100 micrometers.

In some cases, the nanovoided microstructured layer may be thick enough so that the nanovoided microstructured layer can reasonably have an effective refractive index that can be expressed in terms of the indices of refraction of the voids and the binder, and the void or pore volume fraction or porosity. In such cases, the thickness of the nanovoided microstructured layer is not less than about 500 nm, or not less than about 1,000 nm, or in a range from 1 to 10 micrometers, or in a range from 500 nm to 100 micrometers, for example.

When the voids in a disclosed nanovoided microstructured layer are sufficiently small and the nanovoided microstructured layer is sufficiently thick, the nanovoided microstructured layer has an effective permittivity $\in_{\it eff}$ that can be expressed as:

$$\in_{\it eff} = (f)\in_v + (1-f)\in_b, \quad (1)$$

where $\in_v$ and $\in_b$ are the permittivities of the voids and the binder respectively, and f is the volume fraction of the voids in the nanovoided microstructured layer. In such cases, the effective refractive index $n_{\it eff}$ of the nanovoided microstructured layer can be expressed as:

$$n_{\it eff} = (f)n_v^2 + (1-f)n_b^2, \quad (2)$$

where $n_v$ and $n_b$ are the refractive indices of the voids and the binder respectively. In some cases, such as when the difference between the indices of refraction of the voids and the binder is sufficiently small, the effective index of the nanovoided microstructured layer can be approximated by the following expression:

$$n_{\it eff} \approx (f)n_v + (1-f)n_b, \quad (3)$$

In such cases, the effective index of the nanovoided microstructured layer is the volume weighted average of the indices of refraction of the voids and the binder. For example, a nanovoided microstructured layer that has a void volume fraction of 50% and a binder that has an index of refraction of 1.5 has an effective index of about 1.25 as calculated by equation (3), and an effective index of about 1.27 as calculated by the more precise equation (2). In some exemplary embodiments the nanovoided microstructured layer may have an effective refractive index in a range from 1.15 to 1.35, or from 1.15 to 1.3, but values outside these ranges are also contemplated.

The nanovoided layer 300 of FIG. 3 is also shown to include, in addition to the plurality of interconnected voids or network of voids 320 dispersed in the binder 310, an optional plurality of nanoparticles 340 dispersed substantially uniformly within the binder 310.

Nanoparticles 340 have a size d2 that can be any desired value in any desired range of values. For example, in some cases at least a majority of the particles, such as at least 60% or 70% or 80% or 90% or 95% of the particles, have a size that is in a desired range. For example, in some cases, at least a majority of the particles, such as at least 60% or 70% or 80% or 90% or 95% of the particles, have a size that is not greater than about 1 micrometer, or not greater than about 700, or 500, or 200, or 100, or 50 nanometers. In some cases, the plurality of nanoparticles 340 may have an average particle size that is not greater than about 1 micrometer, or not greater than about 700, or 500, or 200, or 100, or 50 nanometers.

In some cases, some of the nanoparticles can be sufficiently small so that they primarily affect the effective refractive index, while some other nanoparticles can affect the effective index and scatter light, while still some other particles can be sufficiently large so that their primary optical effect is to scatter light.

The nanoparticles 340 may or may not be functionalized. In some cases, some, most, or substantially all of the nanoparticles 340, such as nanoparticle 340B, are not functionalized. In some cases, some, most, or substantially all of the nanoparticles 340 are functionalized or surface treated so that they can be dispersed in a desired solvent or binder 310 with no, or very little, clumping. In some embodiments, nanoparticles 340 can be further functionalized to chemically bond to binder 310. For example, nanoparticles such as nanoparticle 340A, can be surface modified or surface treated to have reactive functionalities or groups 360 to chemically bond to binder 310. Nanoparticles can be functionalized with multiple chemistries, as desired. In such cases, at least a significant fraction of nanoparticles 340A are chemically bound to the binder. In some cases, nanoparticles 340 do not have reactive functionalities to chemically bond to binder 310. In such cases, nanoparticles 340 can be physically bound to binder 310.

In some cases, some of the nanoparticles have reactive groups and others do not have reactive groups. An ensemble of nanoparticles can include a mixture of sizes, reactive and nonreactive particles, and different types of particles (e.g., silica and zirconium oxide). In some cases, the nanoparticles may include surface treated silica nanoparticles.

The nanoparticles may be inorganic nanoparticles, organic (e.g., polymeric) nanoparticles, or a combination of organic and inorganic nanoparticles. Furthermore, the nanoparticles may be porous particles, hollow particles, solid particles, or combinations thereof. Examples of suitable inorganic nanoparticles include silica and metal oxide nanoparticles including zirconia, titania, ceria, alumina, iron oxide, vanadia, antimony oxide, tin oxide, alumina/silica, and combinations thereof. The nanoparticles can have an average particle diameter less than about 1000 nm, or less than about 100 or 50 nm, or the average may be in a range from about 3 to 50 nm, or from about 3 to 35 nm, or from about 5 to 25 nm. If the nanoparticles are aggregated, the maximum cross sectional dimension of the aggregated particle can be within any of these ranges, and can also be greater than about 100 nm. In some embodiments, "fumed" nanoparticles, such as silica and alumina, with primary size less than about 50 nm, are also included, such as CAB-O-SPERSE® PG 002 fumed silica, CAB-O-SPERSE® 2017A fumed silica, and CAB-O-SPERSE® PG 003 fumed alumina, available from Cabot Co. Boston, Mass.

The nanoparticles may include surface groups selected from the group consisting of hydrophobic groups, hydrophilic groups, and combinations thereof. Alternatively, the nanoparticles may include surface groups derived from an agent selected from the group consisting of a silane, organic acid, organic base, and combinations thereof. In other embodiments, the nanoparticles include organosilyl surface groups derived from an agent selected from the group consisting of alkylsilane, arylsilane, alkoxysilane, and combinations thereof.

The term "surface-modified nanoparticle" refers to a particle that includes surface groups attached to the surface of the particle. The surface groups modify the character of the particle. The terms "particle diameter" and "particle size" refer to the maximum cross-sectional dimension of a particle. If the particle is present in the form of an aggregate, the terms "particle diameter" and "particle size" refer to the maximum cross-sectional dimension of the aggregate. In some cases, particles can be large aspect ratio aggregates of nanoparticles, such as fumed silica particles.

The surface-modified nanoparticles have surface groups that modify the solubility characteristics of the nanoparticles. The surface groups are generally selected to render the particle compatible with the coating solution. In one embodiment, the surface groups can be selected to associate or react with at least one component of the coating solution, to become a chemically bound part of the polymerized network.

A variety of methods are available for modifying the surface of nanoparticles including, e.g., adding a surface modifying agent to nanoparticles (e.g., in the form of a powder or a colloidal dispersion) and allowing the surface modifying agent to react with the nanoparticles. Other useful surface modification processes are described in, e.g., U.S. Pat. Nos. 2,801,185 (Iler) and 4,522,958 (Das et al.).

The nanoparticles may be provided in the form of a colloidal dispersion. Examples of useful commercially available unmodified silica starting materials include nano-sized colloidal silicas available under the product designations NALCO 1040, 1050, 1060, 2326, 2327, and 2329 colloidal silica from Nalco Chemical Co., Naperville, Ill.; the organosilica under the product name IPA-ST-MS, IPA-ST-L, IPA-ST, IPA-ST-UP, MA-ST-M, and MA-ST sols from Nissan Chemical America Co. Houston, Tex. and the SnowTex® ST-40, ST-50, ST-20L, ST-C, ST-N, ST-O, ST-OL, ST-ZL, ST-UP, and ST-OUP, also from Nissan Chemical America Co. Houston, Tex. The weight ratio of polymerizable material to nanoparticles can range from about 30:70, 40:60, 50:50, 55:45, 60:40, 70:30, 80:20 or 90:10 or more. The preferred ranges of wt % of nanoparticles range from about 10% by weight to about 60% by weight, and can depend on the density and size of the nanoparticles used.

In some cases, the nanovoided microstructured layer 300 may have a low optical haze value. In such cases, the optical haze of the nanovoided microstructured layer may be no more than about 5%, or no greater than about 4, 3.5, 3, 2.5, 2, 1.5, or 1%. For light normally incident on nanovoided microstructured layer 300, "optical haze" may (unless otherwise indicated) refer to the ratio of the transmitted light that deviates from the normal direction by more than 4 degrees to the total transmitted light. Index of refraction values of the disclosed films and layers may be measured by any suitable means, e.g., using a Metricon Model 2010 Prism Coupler, available from Metricon Corp., Pennington, N.J. Optical transmittance, clarity, and haze values of the disclosed films and layers can also be measured by any suitable means, e.g., using a Haze-Gard Plus haze meter, available from BYKGardiner, Silver Springs, Md.

In some cases, the nanovoided microstructured layer 300 may have a high optical haze. In such cases, the haze of the nanovoided microstructured layer 300 is at least about 40%, or at least about 50, 60, 70, 80, 90, or 95%.

In general, the nanovoided microstructured layer 300 can have any porosity or void volume fraction that may be desirable in an application. In some cases, the volume fraction of plurality of voids 320 in the nanovoided microstructured layer 300 is at least about 10%, or at least about 20, 30, 40, 50, 60, 70, 80, or 90%.

Binder 310 can be or include any material that may be desirable in an application. For example, binder 310 can be a light curable material that forms a polymer, such as a crosslinked polymer. In general, binder 310 can be any polymerizable material, such as a polymerizable material that is radiation-curable. In some embodiments binder 310 can be any polymerizable material, such as a polymerizable material that is thermally-curable.

Polymerizable material 310 can be any polymerizable material that can be polymerized by various conventional anionic, cationic, free radical, or other polymerization techniques, which can be initiated chemically, thermally, or by actinic radiation. Processes using actinic radiation include, e.g., visible and ultraviolet light, electron beam radiation and combinations thereof, among other means. The media that polymerizations can be carried out in include, e.g., solvent polymerization, emulsion polymerization, suspension polymerization, bulk polymerization, and the like.

Actinic radiation curable materials include monomers, and reactive oligomers, and polymers of acrylates, methacrylates, urethanes, epoxies, and the like. Representative examples of actinic radiation curable groups suitable in the practice of the present disclosure include epoxy groups, ethylenically unsaturated groups such as (meth)acrylate groups, olefinic carbon-carbon double bonds, allyloxy groups, alpha-methyl styrene groups, (meth)acrylamide groups, cyanoester groups, vinyl ether groups, combinations of these, and the like. Free radically polymerizable groups are preferred. In some embodiments, exemplary materials include acrylate and methacrylate functional monomers, oligomers, and polymers, and in particular, multifunctional monomers that can form a crosslinked network upon polymerization can be used, as known in the art. The polymerizable materials can include any mixture of monomers, oligomers, and polymers; however the materials should be at least partially soluble in at least one solvent. In some embodiments, the materials should be soluble in the solvent monomer mixture.

Solvent can be any solvent that forms a solution with the desired polymerizable material. The solvent can be a polar or a non-polar solvent, a high boiling point solvent or a low boiling point solvent, and in some embodiments the solvent includes a mixture of several solvents. The solvent or solvent mixture may be selected so that the microstructured layer 230 formed is at least partially insoluble in the solvent (or at least one of the solvents in a solvent mixture). In some embodiments, the solvent mixture can be a mixture of a solvent and a non-solvent for the polymerizable material. In one particular embodiment, the insoluble polymer matrix can be a three-dimensional polymer matrix having polymer chain linkages that provide the three dimensional framework. The polymer chain linkages can prevent deformation of the microstructured layer 230 after removal of the solvent.

In some cases, solvent can be easily removed from the solvent-laden microstructured layer 130, 230 by drying, for example, at temperatures not exceeding the decomposition temperature of either the insoluble polymer matrix or the substrate 216. In one particular embodiment, the temperature during drying is kept below a temperature at which the substrate is prone to deformation, e.g., a warping temperature or a glass-transition temperature of the substrate. Exemplary solvents include linear, branched, and cyclic hydrocarbons, alcohols, ketones, and ethers, including for example, propylene glycol ethers such as DOWANOL™ PM propylene glycol methyl ether, isopropyl alcohol, ethanol, toluene, ethyl acetate, 2-butanone, butyl acetate, methyl isobutyl ketone, methyl ethyl ketone, cyclohexanone, acetone, aromatic hydrocarbons, isophorone, butyrolactone, N-methylpyrrolidone, tetrahydrofuran, esters such as lactates, acetates, propylene glycol monomethyl ether acetate (PM acetate), diethylene glycol ethyl ether acetate (DE acetate), ethylene glycol butyl ether acetate (EB acetate), dipropylene glycol monomethyl acetate (DPM acetate), iso-alkyl esters, isohexyl acetate, isoheptyl acetate, isooctyl acetate, isononyl acetate, isodecyl acetate, isododecyl acetate, isotridecyl acetate or other iso-alkyl esters, water; combinations of these and the like.

The coating solution 215 can also include other ingredients including, e.g., initiators, curing agents, cure accelerators, catalysts, crosslinking agents, tackifiers, plasticizers, dyes, surfactants, flame retardants, coupling agents, pigments, impact modifiers including thermoplastic or thermoset polymers, flow control agents, foaming agents, fillers, glass and polymer microspheres and microparticles, other particles including electrically conductive particles, thermally conductive particles, fibers, antistatic agents, antioxidants, optical down converters such as phosphors, UV absorbers, and the like.

An initiator, such as a photoinitiator, can be used in an amount effective to facilitate polymerization of the monomers present in the coating solution. The amount of photoinitiator can vary depending upon, for example, the type of initiator, the molecular weight of the initiator, the intended application of the resulting microstructured layer, and the polymerization process including, e.g., the temperature of the process and the wavelength of the actinic radiation used. Useful photoinitiators include, for example, those available from Ciba Specialty Chemicals under the IRGACURE™ and DAROCURE™ trade designations, including IRGACURE™ 184 and IRGACURE™ 819.

The microstructured layer 230 may be cross-linked to provide a more rigid polymer network. Cross-linking can be achieved with or without a cross-linking agent by using high energy radiation such as gamma or electron beam radiation. In some embodiments, a cross-linking agent or a combination of cross-linking agents can be added to the mixture of polymerizable monomers, oligomers or polymers. The cross-linking can occur during polymerization of the polymer network using any of the actinic radiation sources described elsewhere.

Useful radiation curing cross-linking agents include multifunctional acrylates and methacrylates, such as those disclosed in U.S. Pat. No. 4,379,201 (Heilmann et al.), which include 1,6-hexanediol di(meth)acrylate, trimethylolpropane tri(meth)acrylate, 1,2-ethylene glycol di(meth)acrylate, pentaerythritol tri/tetra(meth)acrylate, triethylene glycol di(meth) acrylate, ethoxylated trimethylolpropane tri(meth) acrylate, glycerol tri(meth)acrylate, neopentyl glycol di(meth)acrylate, tetraethylene glycol di(meth)acrylate, 1,12-dodecanol di (meth)acrylate, copolymerizable aromatic ketone co-monomers such as those disclosed in U.S. Pat. No. 4,737,559 (Kellen et al.) and the like, and combinations thereof.

The coating solution 215 may also include a chain transfer agent. The chain transfer agent is preferably soluble in the monomer mixture prior to polymerization. Examples of suitable chain transfer agents include triethyl silane and mercaptans. In some embodiments, chain transfer can also occur to the solvent; however this may not be a preferred mechanism.

The polymerizing step preferably includes using a radiation source in an atmosphere that has a low oxygen concentration. Oxygen is known to quench free-radical polymerization, resulting in diminished extent of cure. The radiation source used for achieving polymerization and/or crosslinking may be actinic (e.g., radiation having a wavelength in the ultraviolet or visible region of the spectrum), accelerated particles (e.g., electron beam radiation), thermal (e.g., heat or infrared radiation), or the like. In some embodiments, the energy is actinic radiation or accelerated particles, because such energy provides excellent control over the initiation and rate of polymerization and/or crosslinking. Additionally, actinic radiation and accelerated particles can be used for curing at relatively low temperatures. This avoids degrading or evaporating components that might be sensitive to the relatively high temperatures that might be required to initiate polymerization and/or crosslinking of the energy curable groups when using thermal curing techniques. Suitable sources of curing energy include UV LEDs, visible LEDs, lasers, electron beams, mercury lamps, xenon lamps, carbon arc lamps, tungsten filament lamps, flashlamps, sunlight, low intensity ultraviolet light (black light), and the like.

In some embodiments, binder 310 includes a multifunctional acrylate and polyurethane. This binder 310 can be a polymerization product of a photoinitiator, a multifunctional acrylate, and a polyurethane oligomer. The combination of a multifunctional acrylate and a polyurethane oligomer can produce a more durable nanovoided microstructured layer 300. The polyurethane oligomer is ethylenically unsaturated. In some embodiments, the polyurethane or polyurethane oligomer is capable of reacting with acrylates or "capped" with an acrylate to be capable of reacting with other acrylates in the polymerization reaction described herein.

In one illustrative process described above in FIG. 2, a solution is prepared that includes a plurality of nanoparticles (optional), and a polymerizable material dissolved in a solvent, where the polymerizable material can include, for example, one or more types of monomers. The polymerizable material is coated onto a substrate and a tool is applied to the coating while the polymerizable material is polymerized, for example by applying heat or light, to form an insoluble polymer matrix in the solvent. In some cases, after the polymerization step, the solvent may still include some of the polymerizable material, although at a lower concentration. Next, the solvent is removed by drying or evaporating the solution resulting in nanovoided microstructured layer 300 that includes a network or plurality of voids 320 dispersed in polymer binder 310. The nanovoided microstructured layer 300 includes a plurality of nanoparticles 340 dispersed in the polymer binder. The nanoparticles are bound to the binder, where the bonding can be physical or chemical.

The fabrication of the nanovoided microstructured layer 300 and microstructured articles described herein using the processes described herein can be performed in a temperature range that is compatible with the use of organic substances, resins, films, and supports. In many embodiments, the peak process temperatures (as determined by an optical thermometer aimed at the nanovoided microstructured layer 300 and microstructured article surface) is 200 degrees centigrade or less, or 150 degrees centigrade or less or 100 degrees centigrade or less.

In general, nanovoided microstructured layer 300 can have a desirable porosity for any weight ratio of binder 310 to plurality of nanoparticles 340. Accordingly, in general, the weight ratio can be any value that may be desirable in an application. In some cases, the weight ratio of binder 310 to a plurality of nanoparticles 340 is at least about 1:2.5, or at least about 1:2.3, or 1:2, or 1:1, or 1.5:1, or 2:1, or 2.5:1, or 3:1, or 3.5:1, or 4:1, or 5:1. In some cases, the weight ratio is in a range from about 1:2.3 to about 4:1.

Figure 3A:
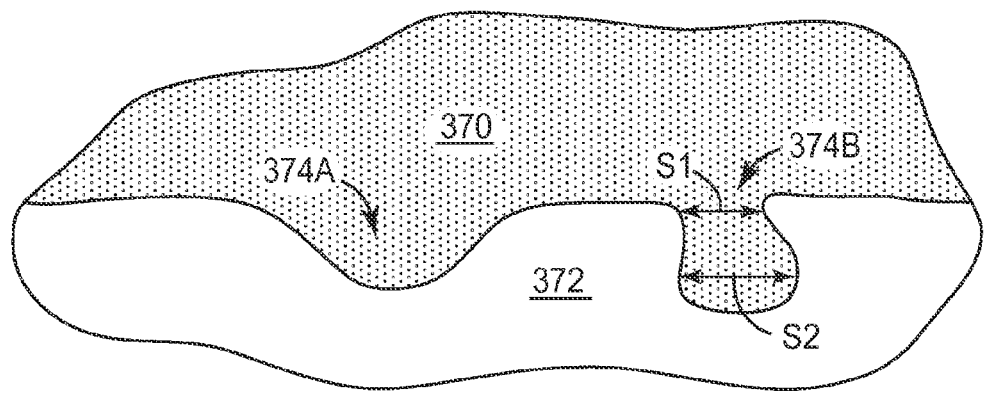
FIG. 3a is a schematic cross-sectional view of a portion of an interface between a first nanovoided layer and a second layer, demonstrating interpenetration of the second layer with the first layer.

We now pause to consider, in connection with FIG. 3a, whether there is any structural difference between (a) an article made by first forming a nanovoided layer with a microstructured surface, and then backfilling that microstructured surface with a conventional (non-nanovoided) material, e.g. a conventional polymer material, and (b) an article made by first forming a microstructured surface in a layer of conventional material, and then backfilling that microstructured surface with a nanovoided material layer. In both cases, the resulting article has an embedded interface, i.e., the microstructured surface, on one side of which is the nanovoided material layer and on the other side of which is the conventional material layer.

We have found that at least one structural difference can occur between the two articles, and that structural difference relates to the mechanism of interpenetration. In the article of case (b), where the layer of conventional material is microstructured before backfilling the microstructured surface with the nanovoided material, the nanovoided material would not typically migrate into the layer of conventional material because that layer typically presents a substantially solid, non-porous barrier at each facet or portion of the microstructured surface beyond which the nanovoided material cannot penetrate. In contrast, the article of case (a) is made in such a way that, at the time the conventional material (or precursor to such material, e.g. an uncured liquid polymer resin) is applied to the microstructured surface of the nanovoided layer, the facets or portions of the microstructured surface may contain surface voids, e.g. in the form of pits, pockets, or tunnels, into which the conventional material may migrate depending on properties of the surface voids, properties of the conventional material, and process conditions such as residence time of the conventional material in an uncured state. With suitable material properties and process conditions, the conventional material layer may interpenetrate the nanovoided layer, as shown schematically in FIG. 3a.

FIG. 3a shows in schematic cross-section a portion of an interface between a first nanovoided layer 372 and a second layer 370 of conventional material. The interface portion may, for example, be a microscopic portion of a structured surface defined between the two layers. The nanovoided layer 372 is shown to have a shallow surface void or depression 374A, as well as a deeper surface void 374B. The surface void 374B is characterized by a first transverse dimension S1 that is closer to the interface than a second transverse dimension S2, and the deeper dimension S2 is greater than the shallower dimension S1. We may characterize layer 370 as interpenetrating the layer 372 if the layer 370 not only conforms to the general shape of the layer 372 (e.g. depression 374A), but also if material from layer 370 migrates into or substantially fills at least some deep surface voids such as void 374a, in which a transverse dimension of the void nearer the interface is smaller than a transverse dimension farther from the interface. Such interpenetration can be achieved with nanovoided materials described herein.

In a first approach for characterizing an interpenetration depth of the conventional layer with the nanovoided layer, one may determine the amount by which material of the conventional layer has advanced beyond an interface average surface (along a direction or measurement axis perpendicular to the average surface), and one may characterize this amount in terms of the diameter of an average-sized void.

In a second approach for characterizing the interpenetration depth, one may again measure the amount by which the material of the conventional layer has advanced beyond the average surface, and then simply report this amount in terms of standard units of distance, e.g., micrometers or nanometers.

In a third approach for characterizing the interpenetration depth, one may again measure the amount by which the material of conventional layer has advanced beyond the average surface, but then characterize this amount in terms of the feature height of the structured surface at issue.

In exemplary embodiments, the interpenetration depth may be for example: with regard to the first approach, in a range from 1 to 10 average void diameters; with regard to the second approach, no more than 1, 10, 100, or 500 microns; with regard to the third approach, at least 5% of the feature height, or at least 10%, or at least 50%, or at least 95%, or at least 100%, or no more than 5%, or no more than 10%, or no more than 25%, or in a range from 5 to 25%, of the feature height. These exemplary ranges, however, should not be construed as limiting. The third approach of characterizing the interpenetration depth may be particularly suitable when dealing with microstructured surfaces that have particularly small feature sizes, e.g., in which the feature-to-feature pitch is less than 1 micron.

Further discussion regarding interpenetration can be found in commonly assigned provisional U.S. patent application 61/405,128, filed on Oct. 20, 2010.

That U.S. application also discusses shrinkage issues that have been observed when microreplicating nanovoided polymer materials, and how issues regarding shrinkage relate to the feature height of the structured surface (e.g., axial distance between the highest point and the lowest point on the structured surface), the aspect ratio of the features of the structured surface (e.g. feature height divided by feature pitch, where feature pitch may be the center-to-center spacing between nearest neighbor features in the structured surface), void volume fraction of the nanovoided material (the fractional volume of the nanovoided material occupied by the voids), refractive index of the nanovoided material, and formulation (e.g. weight % solids) of the coating solution precursor to the nanovoided layer. For example, in order to replicate larger microstructures using low concentration formulations of the coating solution, in the range of 30-45% solids, compensation of the microstructure geometry on the tool may be used to account for material shrinkage, so that the desired feature shape can be successfully made. The application discusses certain desirable relationships associated with a reduced amount of shrinkage or of other distortion of the microstructured surface. In one such relationship, the microstructured surface is characterized by a structure height (e.g. the difference between dimension 419b and 419a in FIG. 4a) of at least 15 microns and an aspect ratio (structure height divided by structure pitch, see e.g. pitch P1 in FIG. 4a or P2 in FIG. 4b) greater than 0.3, and: the nanovoided layer has a void volume fraction in a range from 30% to 55%; and/or the nanovoided layer has a refractive index in a range from 1.21 to 1.35, or 1.21 to 1.32; and/or the coating solution precursor to the nanovoided layer has a wt % solids in a range from 45% to 70%, or from 50% to 70%. Relationships such as these can be advantageously applied to the present disclosure as well.

Optical Extraction Films and Film/Light Source Combinations

The disclosed nanovoided layers can be advantageously incorporated into optical films that can be combined in some fashion with OLEDs or other self-emissive light sources so as to enhance light extraction and reduce losses in such sources. In some cases, the films can be designed to be applied to an exterior light-emitting surface of the light source, which is manufactured separately from the optical film. Some such films are described in connection with FIGS. 4a-c and 5a-c. In other cases, the films can be designed to function as a substrate on which the light source can then be fabricated. Some such films are described in connection with FIGS. 6a-c, 7a, and 7b.

Other aspects of the disclosed films relate to the loss mechanism of the light source that the optical film is primarily designed to reduce. In some cases, the films can be designed to primarily reduce waveguide losses. Some such films are described in connection with FIGS. 4b, 4c, 5a, 5c, 6b, 6c, 7a, and 7b. In some cases, the films can be designed to primarily reduce substrate losses associated with TIR. Some such films are described in connection with FIGS. 4a, 5a, 5b, 6a, and 7a. Note that some of the optical extraction films can be designed to reduce both waveguide losses and substrate losses.

Figure 4A:
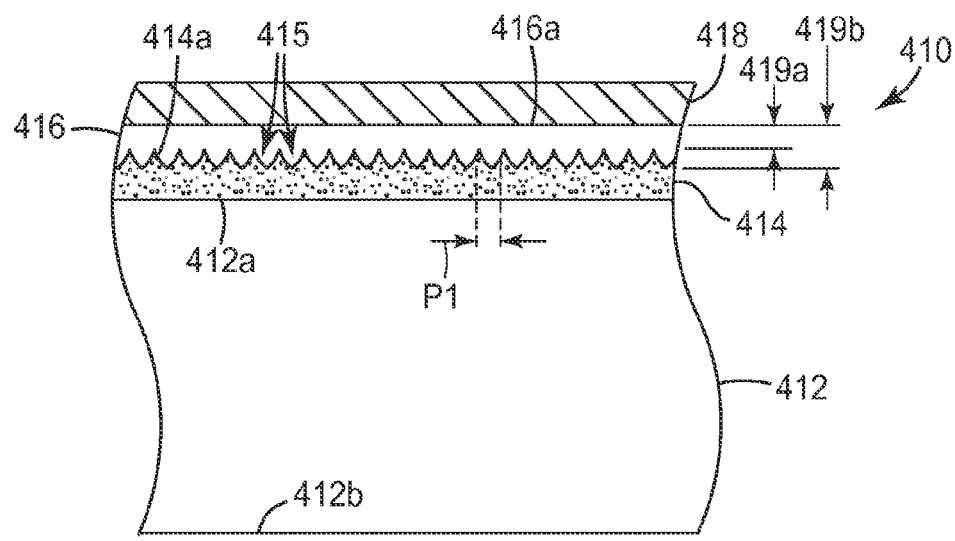
FIGS. 4a-4c are schematic side or cross-sectional views of optical extraction films that can be used with top-emitting OLEDs.
Figure 4B:
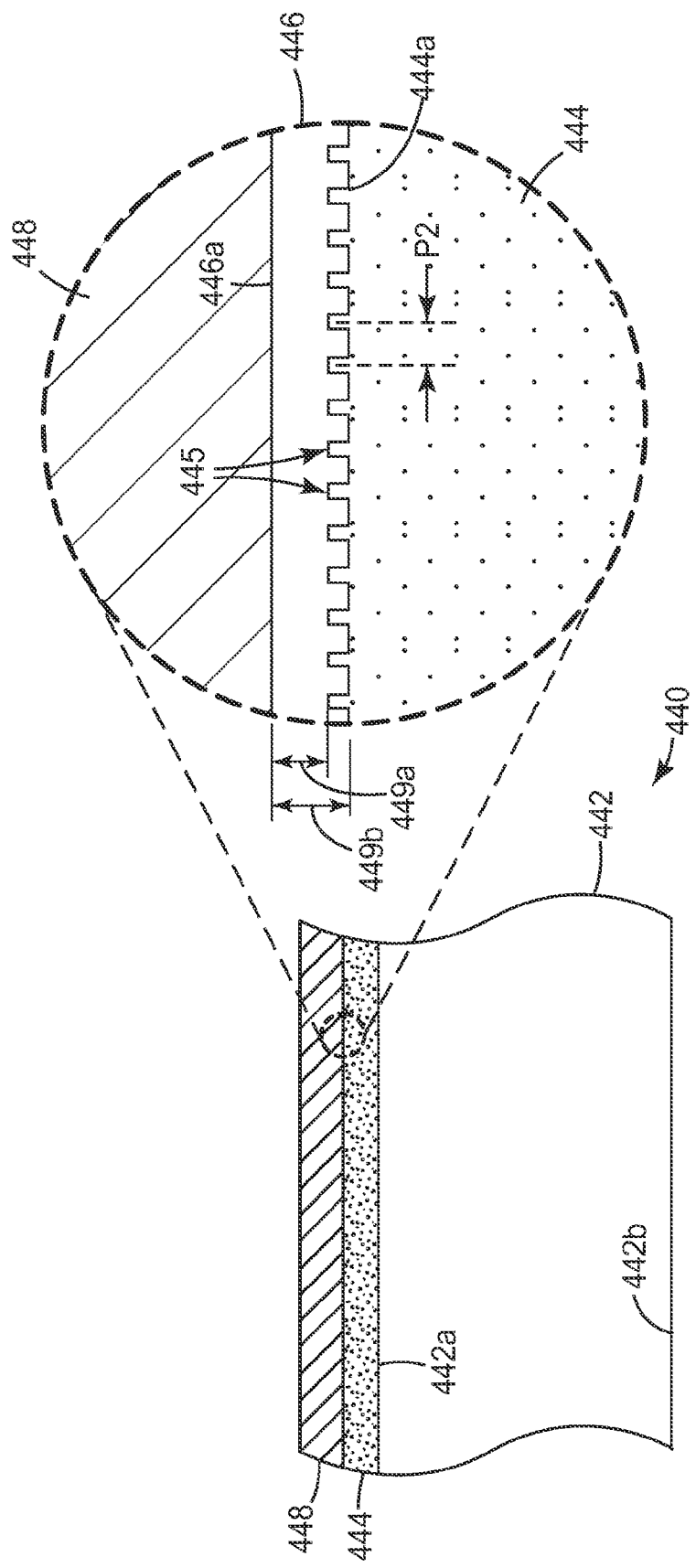
Figure 4C:
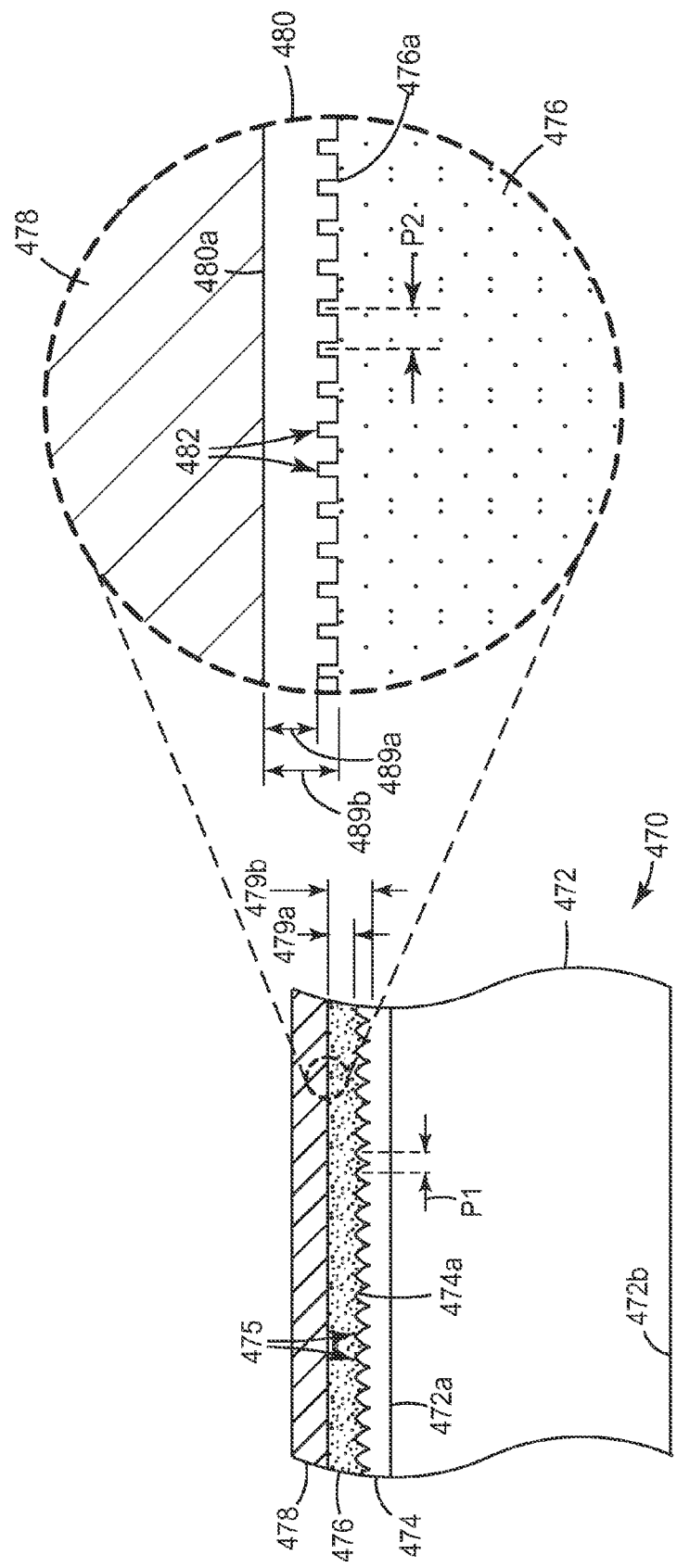

FIGS. 4a-4c are schematic side or cross-sectional views of optical extraction films that can be used with top-emitting OLEDs. In FIG. 4a, an optical extraction film 410 includes a flexible carrier film 412 and various layers carried by (e.g. attached to) the film 412. Among these layers is a nanovoided layer 414 and another layer 416, between which an embedded interface forming a structured surface 414a is formed. The nanovoided layer preferably has a refractive index for visible light well below that of conventional polymeric materials, e.g., below 1.35 or 1.3, or in a range from 1.15 to 1.3 or 1.15 to 1.35, for example. The other layer 416 is preferably composed of a polymer material or other suitable material that is not nanovoided and that has a refractive index greater than that of the nanovoided layer. The difference in refractive index between the layers 414, 416 is desirably relatively large, e.g., at least 0.2, or 0.3, or 0.4, or 0.5 or more. The difference in refractive indices allows the structured surface 414a to function as an optical interface capable of extracting light from an OLED or other self-emissive light source, as described elsewhere herein.

The structured surface 414a may be tailored to have any contour or shape that is effective in extracting light from the light source, i.e., coupling "wasted" light out of the light source so that it can be used in the intended application. Wasted light in this regard refers to light that would be trapped in the light source or otherwise lost, e.g., emitted from an edge of the light source in directions that do not contribute to useful illumination in the display or other intended lighting applications. In exemplary embodiments, the structured surface is shaped to define individual light extraction elements 415. The elements 415 are shown as having curved surfaces which may represent curved linear prisms or an array of lenticular elements arranged in two orthogonal directions (e.g., directions that define a plane along which the structured surface generally extends), but the extraction elements may in general have any suitable shape without limitation, e.g., lenticular, prismatic, 1-dimensional (linearly extending) or 2-dimensional, for example, and the extraction elements of a given structured surface need not all have the same size and/or shape, although they may have the same size and/or shape if desired. In exemplary embodiments, the extraction elements 415 are characterized by a center-to-center spacing or pitch P1 between nearest neighbors. In cases where the extraction elements are not uniformly distributed or spaced from each other, the pitch P1 may represent an average center-to-center spacing of the extraction elements.

The structured surface 414a and/or extraction elements 415 may also be characterized by a distance or thickness from a surface of the extraction film that is adapted to couple to the self-emissive light source. In the case of extraction film 410, this coupling surface is the outer major surface 416a of layer 416. A release liner 418, which is shown covering the layer 416, is preferably incorporated into the product so as to protect the coupling surface 416a from damage until the extraction film is ready to be applied to the light source. Two characteristic distances are labeled in the figure. Distance 419a is the thickness of the continuous land portion of the layer 416 between the coupling surface 416a and the structured surface 414a. The land is thus bounded on one side by the coupling surface, and on the opposite side by a plane that is parallel to the coupling surface and that intersects the structured surface at the point(s) of the structured surface that is/are closest to the coupling surface. The other characteristic distance, 419b, is the distance between the coupling surface 416a and a plane that is parallel to the coupling surface and that intersects the structured surface at the point(s) of the structured surface that is/are farthest away from the coupling surface. Stated differently, the land thickness or distance 419a can be considered to be the smallest axial distance between the coupling surface 416a and the structured surface 414a, and the distance 419b can be considered to be the largest axial distance between the coupling surface 416a and the structured surface 414a.

In cases where the extraction film 410 is intended to enhance light extraction by reducing the amount of light that is totally internally reflected at an outermost surface or boundary of the self-emissive light source, we have found it advantageous to design the extraction film 410 such that the land thickness 419a is relatively small. For example, the land thickness 419a may be less than 50 microns, or less than 25 microns, or less than 10 microns, although these values should not be construed as limiting. In some cases there may be no land. In yet other cases the structured nanovoided features may be non-contiguous. The land thickness 419a may also be less than a thickness of the flexible substrate 412. The land thickness 419a may also be so thin that the layer 416 is not suitable as a free-standing support film in roll-to-roll processing systems such as is depicted in FIG. 2. Stated differently, if the layer 416 could be separated from all the other portions of extraction film 410, it may not have sufficient physical strength or integrity to be subjected to forces ordinarily encountered in industrial roll-to-roll processing systems without excessive tearing, warping, or curling, for example. The land thickness 419a may also if desired be chosen to be large enough so that a substantial portion of the light extraction elements 415 is not disposed within an evanescent zone of the self-emissive light source.

We have also found it advantageous, again in cases where the film 410 is intended to enhance light extraction by reducing TIR, to tailor the extraction features 415 such that their pitch P1 is relatively large, e.g., greater than 1 micron. The feature heights, i.e., the difference between distance 419b and distance 419a, may also if desired be greater than 1 micron. The feature heights and transverse dimensions may be sufficiently large, e.g., greater than 1, 5, 10, or 20 microns, that the functionality of the extraction features is principally governed by principles of optical refraction rather than, for example, optical diffraction.

The optical extraction film 410 may be fabricated using a wide variety of manufacturing techniques, including without limitation continuous techniques and batch techniques. A particularly advantageous manufacturing technique is a continuous cast and cure (3C) roll-to-roll process such as that shown schematically in FIG. 2. Such a technique allows the film to be made continuously in potentially high volumes, and then converted (e.g. cut or slit) into large numbers of piece parts or sheets whose sizes are tailored for the intended end-use application(s). In such cases, the flexible carrier film 412 may have physical characteristics, such as a composition and thickness, that make it suitable as a free-standing support film similar to substrate 216 in FIG. 2. In many cases, a film composed of a conventional light-transmissive polymer such as polyethylene terephthalate (PET) or polyethylene naphthalate (PEN), or copolymers thereof, would need to have a film thickness greater than about 2 mils (about 50 microns) in order to possess the necessary film strength to allow it to be used for such a purpose.

In some cases, the structured surface 414a may be fabricated not with a casting-and-curing technique but with any other suitable technique capable of producing the desired extraction features in the desired layers. For example, imprinting, embossing, and injection molding may also be used to form the structured surface 414a in some cases. However, if the extraction film 410 is made using a process similar to that of FIG. 2, the layer 416 may constitute a backfill layer that was produced after the formation of the nanovoided layer 414 and the structured surface 414a. Consequently, depending on materials selection and process conditions, the layer 416 may interpenetrate the nanovoided layer 414 as discussed in connection with FIG. 3a.

The carrier film 412, the nanovoided layer 414, and the other layer 416 are preferably all highly transmissive to light from the light source, although small to moderate amounts of haze in one, some, or all of these layers may be tolerable and/or desirable in specific applications. The layers preferably transmit light emitted by the light source with low loss so that, after the extraction film is attached to the light source, a large fraction of light from the light source that traverses the coupling surface 416a will exit the extraction film at the opposite outer surface 412b and contribute to system illumination. The carrier film 412 may comprise PET, PEN, copolymers thereof, glass (including flexible glass), or other suitable transparent or translucent materials. The carrier film 412 may also comprise a multilayer film of alternative layer of PET, PEN, and copolymers thereof. The carrier film may additionally comprise birefringence, fluorescence, and absorption layer(s) to enable advanced optical functions such as polarization and wavelength selection/conversion. The carrier film 412 may also function as a barrier layer to prevent water vapor and oxygen from reaching the light source after the extraction film is attached to the light source. Exemplary ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446 (Shaw et al.), 5,877,895 (Shaw et al.), and 6,010,751 (Shaw et al.), which are incorporated herein by reference in their entireties. The nanovoided layer 414 may comprise any of the light-transmissive nanovoided materials disclosed herein. The other layer 416 may comprise any suitable light-transmissive material. In exemplary embodiments the layer 416 may be or comprise a light-transmissive pressure-sensitive adhesive or other visco-elastic material. Representative visco-elastic materials are discussed in the commonly assigned provisional U.S. patent application 61/405,128 referenced elsewhere herein. Use of a transparent adhesive for layer 416 allows the extraction film to be attached directly to an outer surface of the self-emissive light source with no intervening material layers. Use of a viscoelastic material for layer 416 allows the extraction film (and in particular the coupling surface 416a of the extraction film) to flow to some extent so as to conform to a non-planar emitting surface of an OLED.

The light extraction film 410 may of course include other layers in addition to those depicted in FIG. 4a, and other features or characteristics in addition to those already discussed. For example, materials may be incorporated within the film to enhance light extraction through scattering or to filter, color shift, or polarize the light. Surface coatings or structures, for example functional layers, can be applied to the air surface of the light extraction film in order to further increase the functionality and possibly the value of the light extraction film. Such surface coatings can have, for example, optical, mechanical, chemical, or electrical functions. Examples of such coatings or structures include those having the following functions or properties: antifog; antistatic; anti-glare; antireflection; antiabrasion (scratch resistance); antismudge; hydrophobic; hydrophilic; adhesion promotion; refractive elements; color filtering; ultraviolet (UV) filtering; spectral filtering; color shifting; color modification; polarization modification (linear or circular); light redirection; diffusion; or optical rotation. Other possible layers to be applied to the air surface include a barrier layer or a transparent electrically conductive material. The release liner 418 may be omitted, and/or another release liner may be provided on the other side of the extraction film to protect the output surface 412b.

FIG. 4b is a schematic side or cross-sectional view of another optical extraction film that can be used with a top-emitting OLED. In FIG. 4b, an optical extraction film 440 includes a flexible carrier film 442 and various layers carried by (e.g. attached to) the film 442. Among these layers is a nanovoided layer 444 and another layer 446, between which an embedded interface forming a structured surface 444a is formed (see inset). The nanovoided layer preferably has a refractive index for visible light well below that of conventional polymeric materials, e.g., below 1.35 or 1.3, or in a range from 1.15 to 1.3 or 1.15 to 1.35, for example. The other layer 446 is preferably composed of a polymer material or other suitable material that is not nanovoided and that has a refractive index greater than that of the nanovoided layer. The difference in refractive index between the layers 444, 446 is desirably relatively large, e.g., at least 0.2, or 0.3, or 0.4, or 0.5 or more. The difference in refractive indices allows the structured surface 444a to function as an optical interface capable of extracting light from an OLED or other self-emissive light source, as described elsewhere herein.

The structured surface 444a may be tailored to have any contour or shape that is effective in extracting light from the light source, i.e., coupling wasted light out of the light source so that it can be used in the intended application as discussed above. In exemplary embodiments, the structured surface is shaped to define individual light extraction elements 445. The elements 445 are shown as having rectangular profiles which may represent flat linear ridges or an array of box-shaped protuberances arranged in two orthogonal directions (e.g., directions that define a plane along which the structured surface generally extends), but the extraction elements may in general have any suitable shape without limitation, e.g., lenticular, prismatic, 1-dimensional (linearly extending) or 2-dimensional, for example, and the extraction elements of a given structured surface need not all have the same size and/or shape, although they may have the same size and/or shape if desired. In exemplary embodiments, the extraction elements 445 are characterized by a center-to-center spacing or pitch P2 between nearest neighbors. In cases where the extraction elements are not uniformly distributed or spaced from each other, the pitch P2 may represent an average center-to-center spacing of the extraction elements.

The structured surface 444a and/or extraction elements 445 may also be characterized by a distance or thickness from a surface of the extraction film that is adapted to couple to the self-emissive light source. In the case of extraction film 440, this coupling surface is the outer major surface 446a of layer 446. A liner 448, which is shown covering the layer 446, is preferably incorporated into the product so as to protect the coupling surface 446a from damage until the extraction film is ready to be applied to the light source. When the layer 446 comprises an adhesive, the liner 448 is preferably a release liner. When the layer 446 is not an adhesive, the liner 448 may be a premask designed to protect the surface prior to use. Two characteristic distances are labeled in the figure. Distance 449a is the thickness of the continuous land portion of the layer 446 between the coupling surface 446a and the structured surface 444a. The land is thus bounded on one side by the coupling surface, and on the opposite side by a plane that is parallel to the coupling surface and that intersects the structured surface at the point(s) of the structured surface that is/are closest to the coupling surface. The other characteristic distance, 449b, is the distance between the coupling surface 446a and a plane that is parallel to the coupling surface and that intersects the structured surface at the point(s) of the structured surface that is/are farthest away from the coupling surface. Stated differently, the land thickness or distance 449a can be considered to be the smallest axial distance between the coupling surface 446a and the structured surface 444a, and the distance 449b can be considered to be the largest axial distance between the coupling surface 446a and the structured surface 444a.

In cases where the extraction film 440 is intended to enhance light extraction by reducing the amount of light that is trapped as waveguiding modes in a high refractive index light emitting region of the self-emissive light source, we have found it advantageous to design the extraction film 440 such that the land thickness 449a is very small, e.g., small enough so that a substantial portion of the light extraction elements 445 is disposed within an evanescent zone of the self-emissive light source when the coupling surface 446a is placed against an emitting surface of the light source. The extent to which the evanescent zone extends beyond the coupling surface 446a into the layer 446 depends on a number of factors, including the refractive index of layer 446 and the refractive index of the portion of the light source against which coupling surface 446a is placed. In many cases, however, the land thickness 449a may be less than 20 microns, or less than 10 microns, or less than 5 microns, although these values should not be construed as limiting in view of the many factors that can affect the size of the evanescent zone. The land thickness 449a may also be less than a thickness of the flexible substrate 442, and may be so thin that the layer 446 is not suitable as a free-standing support film in roll-to-roll processing systems such as is depicted in FIG. 2.

With regard to the discussion concerning the evanescent zone, the reader will understand that the evanescent field of any single waveguiding mode associated with a high refractive index light emitting region of the light source typically decays exponentially as a function of distance from the boundary of the high index region. Furthermore, to the extent more than one waveguiding mode (e.g., tens or hundreds of modes) is supported by the high index region, each waveguiding mode may have a different exponentially decaying function, and the decaying function is also dependent on the refractive index of the layer 446. In view of these complications, one may choose to select a practical limit or boundary of an evanescent zone as the position (measured e.g. in the medium of layer 446) beyond which a suitably designed structured surface cannot couple an appreciable amount of light out of the high index region.

We have also found it advantageous, again in cases where the film 440 is intended to enhance light extraction by reducing light trapped as waveguiding modes, to tailor the extraction features 445 such that their pitch P2 is relatively small, e.g., less than 1 micron, in order to couple light out of the waveguiding modes. The feature heights, i.e., the difference between distance 449b and distance 449a, may also, if desired, be less than 1 micron. The feature heights and transverse dimensions may be sufficiently small that the functionality of the extraction features is principally governed by principles of optical diffraction rather than, for example, optical refraction. The structured surface 444a may have a periodic, quasi-periodic, or random distribution of extraction features, and the extraction features may in some cases be arranged to form a photonic crystal structure. In some cases, the structured surface 444a may comprise multiple pitches, for example to tune the extraction of red, green, and blue sub-pixels of an OLED display. In may also be useful to have a "chirped" or periodic structure to provide broadband extraction from a broadband emitter.

The optical extraction film 440 may be fabricated using many different manufacturing techniques as discussed in connection with FIG. 4a. The flexible carrier film 442 may have physical characteristics that make it suitable as a free-standing support film similar to substrate 216 in FIG. 2.

In some cases, the structured surface 444a may be fabricated not with a casting-and-curing technique but with other suitable techniques capable of producing the desired extraction features in the desired layers. For example, imprinting, embossing, and injection molding may also be used to form the structured surface 444a in some cases. However, if the extraction film 440 is made using a process similar to that of FIG. 2, the layer 446 may constitute a backfill layer that was produced after the formation of the nanovoided layer 444 and the structured surface 444a. Consequently, depending on materials selection and process conditions, the layer 446 may interpenetrate the nanovoided layer 444 as discussed in connection with FIG. 3a.

The carrier film 442, the nanovoided layer 444, and the other layer 446 are preferably all highly transmissive to light from the light source, although small to moderate amounts of haze in one, some, or all of these layers may be tolerable and/or desirable in specific applications. The layers preferably transmit light emitted by the light source with low loss so that, after the extraction film is attached to the light source, a large fraction of light from the light source that traverses the coupling surface 446a will exit the extraction film at the opposite outer surface 442b and contribute to system illumination. The carrier film 442, nanovoided layer 444, and other layer 446 may all have similar compositions and characteristics as corresponding elements of the carrier film of FIG. 4a. For example, the carrier film 442 may comprise PET, PEN, copolymers thereof, glass (including flexible glass), or other suitable transparent or translucent materials, and it may also function as a barrier layer to prevent water vapor and oxygen from reaching the light source.

Similar to extraction film of FIG. 4a, the extraction film 440 may also include other layers in addition to those depicted in FIG. 4b, and other features or characteristics in addition to those already discussed. Refer e.g. to the discussion above regarding the film of FIG. 4a. The release liner 448 may be omitted, and/or another release liner or premask may be provided on the other side of the extraction film to protect the output surface 442b.

FIG. 4c is a schematic side or cross-sectional view of still another optical extraction film that can be used with a top-emitting OLED. In FIG. 4c, an optical extraction film 470 includes a flexible carrier film 472 and various layers carried by (e.g. attached to) the film 472. Among these layers is a nanovoided layer 476 and another layer 474, between which an embedded interface forming a structured surface 474a is formed. A second embedded interface forming a second structured surface 476a (see inset) is formed between the nanovoided layer 476 and another layer 480. The nanovoided layer preferably has a refractive index for visible light well below that of conventional polymeric materials, e.g., below 1.35 or 1.3, or in a range from 1.15 to 1.3 or 1.15 to 1.35, for example. The other layers 474, 480 are preferably composed of polymer materials or other suitable materials that are not nanovoided and that have refractive indices greater than that of the nanovoided layer. The difference in refractive index between the layers 474, 476, and between the layers 476, 480, is desirably relatively large, e.g., at least 0.2, or 0.3, or 0.4, or 0.5 or more. The differences in refractive indices allow each of the structured surfaces 474a, 476a to function as an optical interface capable of extracting light from an OLED or other self-emissive light source, as described elsewhere herein.

The structured surfaces 474a, 476a may each be tailored to have any contour or shape that is effective in extracting light from the light source, i.e., coupling wasted light out of the light source so that it can be used in the intended application as discussed above. In exemplary embodiments, the structured surfaces 474a, 476a are each shaped to define individual light extraction elements 475, 482 respectively. The elements 475 are shown as having curved surfaces which may represent curved linear prisms or an array of lenticular elements arranged in two orthogonal directions, but the extraction elements 475 may in general have any suitable shape without limitation. The elements 482 are shown as having rectangular profiles which may represent flat linear ridges or an array of box-shaped protuberances arranged in two orthogonal directions, but the extraction elements 482 may in general have any suitable shape without limitation. The extraction elements of a given structured surface 474a, 476a need not all have the same size and/or shape, although they may have the same size and/or shape if desired. In exemplary embodiments, the extraction elements 475 are characterized by a center-to-center spacing or pitch P1 between nearest neighbors, and the extraction elements 482 are characterized by a center-to-center spacing or pitch P2 between nearest neighbors. In cases where the extraction elements are not uniformly distributed or spaced from each other, the pitches P1 and/or P2 may represent an average center-to-center spacing of the respective extraction elements.

Each of structured surfaces 474a, 476a (and/or their respective extraction elements 475, 482) may also be characterized by a distance or thickness from a surface of the extraction film that is adapted to couple to the self-emissive light source. In the case of extraction film 470, this coupling surface is the outer major surface 480a of layer 480. A release liner or premask 478, which is shown covering the layer 480, is preferably incorporated into the product so as to protect the coupling surface 480a from damage until the extraction film is ready to be applied to the light source. Four characteristic distances are labeled in the figure, two for each of the embedded structured surfaces. With regard to structured surface 474a, distance 479a is the axial distance from the coupling surface 480a to the nearest portion of the structured surface 474a. Despite the fact that this distance does not precisely correspond to the thickness of a continuous land of layer 476 (due to the presence of layer 480 and structured surface 476a), it may nevertheless be considered to substantially correspond to the continuous land portion of layer 476 if the layer 480 is much thinner than the layer 476. Distance 479b is the axial distance from the coupling surface 480a to the farthest portion of the structured surface 474a. With regard to structured surface 476a, distance 489a is the thickness of the continuous land portion of the layer 480 between the coupling surface 480a and the structured surface 476a. The land of layer 480 is thus bounded on one side by the coupling surface, and on the opposite side by a plane that is parallel to the coupling surface and that intersects the portion(s) of the structured surface closest to the coupling surface. The distance 489b is the axial distance from the coupling surface 480a to the farthest portion of the structured surface 476a.

Preferably, the extraction film 470 combines aspects of extraction films 410 and 440. For example, the extraction film 470 can be tailored to enhance light extraction from an OLED or other self-emissive light source both by reducing the amount of light that is totally internally reflected at an outer-most surface or boundary of the self-emissive light source (via structured surface 474a), and by reducing the amount of light that is trapped as waveguiding modes in a high refractive index light emitting region of the self-emissive light source (via structured surface 476a). In this regard we have found it advantageous to design the extraction film 470 such that the substantial land thickness 479a is relatively small, e.g., less than 50 microns, or less than 25 microns, or less than 10 microns, and to further design the film 470 such that the land thickness 489a is smaller still, e.g., small enough so that a substantial portion of the light extraction elements 482 is disposed within an evanescent zone of the self-emissive light source when the coupling surface 480a is placed against an emitting surface of the light source. The land thickness 489a may, for example, be less than 20 microns, or less than 10 microns, or less than 5 microns, and it may be a small fraction of the substantial land thickness 479a associated with the larger structured surface 474a. The thicknesses 479a, 489a may each be less than a thickness of the flexible substrate 472, and each may be so small that neither of the layers 476, 480 is suitable as a free-standing support film in roll-to-roll processing systems such as is depicted in FIG. 2. The thickness 479a may also if desired be chosen to be large enough so that a substantial portion of the light extraction elements 475 is not disposed within an evanescent zone of the self-emissive light source.

We have also found it advantageous to tailor the extraction features 475 such that their pitch P1 is relatively large, e.g., greater than 1 micron, while also tailoring the extraction features 482 such that their pitch P2 is relatively small, e.g., less than 1 micron. The corresponding feature heights may if desired be similarly sized, e.g., the feature heights of structured surface 474a may be greater than 1 micron, and the feature heights of structured surface 476a may be less than 1 micron. The feature heights and transverse dimensions of the extraction features 475 may be sufficiently large (e.g., greater than 5, or greater than 10, or greater than 20 microns) such that their functionality is principally governed by principles of optical refraction rather than optical diffraction, while the feature heights and transverse dimensions of extraction features 482 may be sufficiently small that the functionality of the extraction features is principally governed by principles of optical diffraction rather than optical refraction.

The optical extraction film 470 may be fabricated using many different manufacturing techniques as discussed in connection with FIGS. 4a and 4b. The flexible carrier film 472 may have physical characteristics that make it suitable as a free-standing support film similar to substrate 216 in FIG. 2.

In some cases, the structured surface 474a and/or the structured surface 476a may be fabricated not with a casting-and-curing technique but with other suitable techniques capable of producing the desired extraction features in the desired layers. For example, imprinting, embossing, and injection molding may also be used to form the structured surface 474a and/or the structured surface 476a in some cases. However, if the extraction film 470 is made using a process similar to that of FIG. 2, the nanovoided layer 476 may constitute a backfill layer that was produced after the formation of the layer 474 and the structured surface 474a, and the layer 480 may likewise constitute another backfill layer that was produced after the formation of nanovoided layer 476 and structured surface 476a. Consequently, depending on materials selection and process conditions, the layer 480 may interpenetrate the nanovoided layer 476 as discussed in connection with FIG. 3a, while the nanovoided layer 476 may not interpenetrate the layer 474.

The carrier film 472, the nanovoided layer 476, and the other layers 474, 480 are preferably all highly transmissive to light from the light source, although small to moderate amounts of haze in one, some, or all of these layers may be tolerable and/or desirable in specific applications. The layers preferably transmit light emitted by the light source with low loss so that, after the extraction film is attached to the light source, a large fraction of light from the light source that traverses the coupling surface 480a will exit the extraction film at the opposite outer surface 472b and contribute to system illumination. The carrier film 472, nanovoided layer 476, and other layers 474, 480 may all have similar compositions and characteristics as corresponding elements of the carrier films of FIGS. 4a and 4b. For example, the carrier film 472 may comprise PET, PEN, copolymers thereof, glass (including flexible glass), or other suitable transparent or translucent materials, and it may also function as a barrier layer to prevent water vapor and oxygen from reaching the light source.

Similar to extraction films of FIGS. 4a and 4b, the extraction film 470 may also include other layers in addition to those depicted in FIG. 4c, and other features or characteristics in addition to those already discussed. Refer e.g. to the discussion above regarding the films of FIGS. 4a and 4b. The release liner 478 may be omitted, and/or another release liner or premask may be provided on the other side of the extraction film to protect the output surface 472b.

Figure 5A:
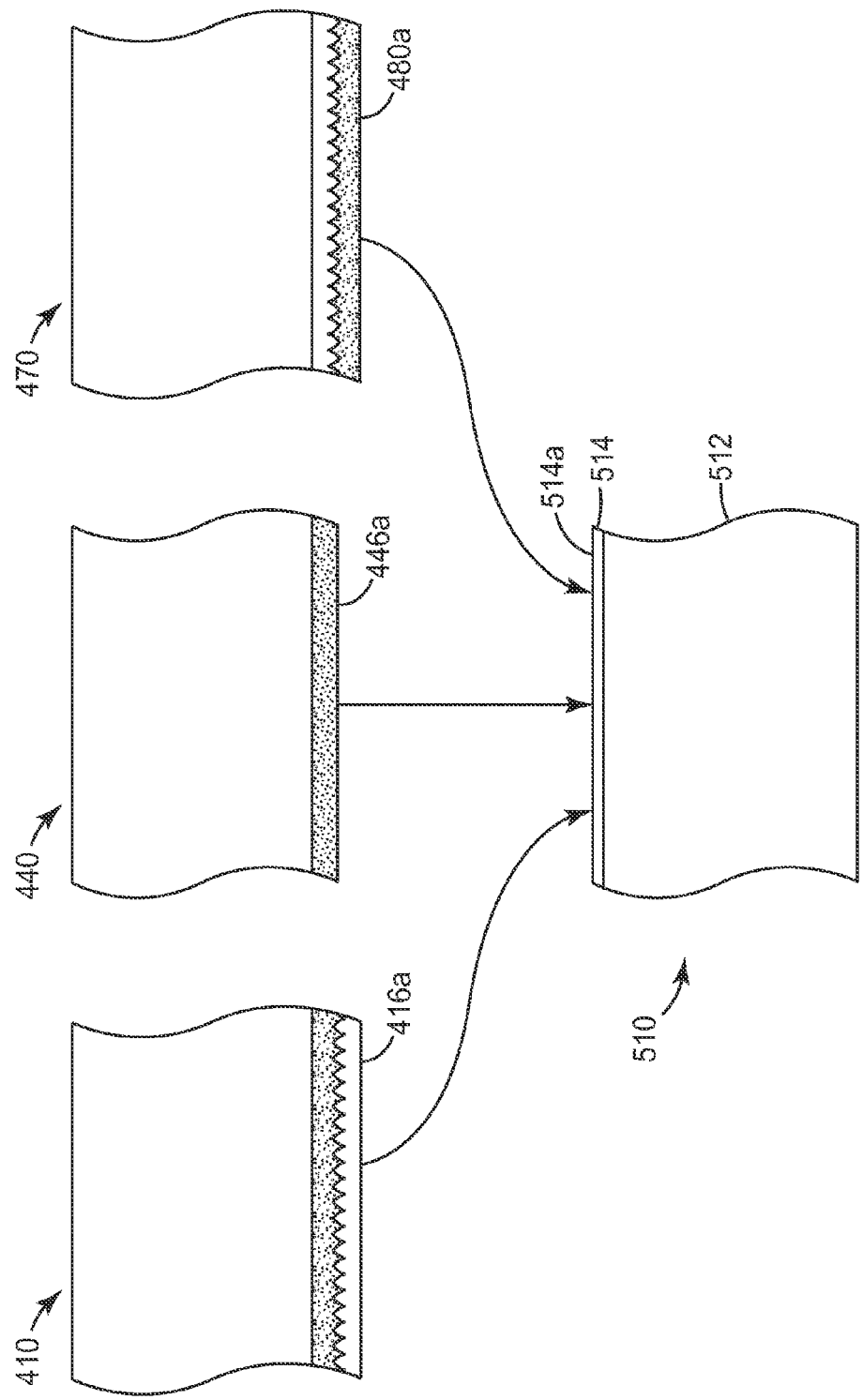
FIG. 5a is a schematic side or cross-sectional view which shows how any of three different optical extraction films can be applied to a top-emitting OLED.

FIG. 5a shows how any of the optical extraction films of FIGS. 4a-c can be applied to a top-emitting OLED or other suitable self-emissive light source which is fabricated separately from the extraction film, so as to produce an enhanced light-emitting optical device. A top-emitting OLED 510 is depicted only schematically for ease of discussion. The OLED includes at least a substrate 512 and a thin, high refractive index light emitting core or region 514. The substrate may function as a barrier layer to prevent water vapor and oxygen from reaching the region 514 from one side, and the substrate may also have mechanical and thermal functionality, such as a heat sink to draw heat away from the region 514. The substrate 512 may also comprise a backplane. Individual layers that make up the region 514 may be deposited, formed, or applied in a suitable sequence atop the substrate 510. The high index region 514 typically includes at least one organic layer tailored to emit light of a desired wavelength in response to an applied electric current or field, and at least one transparent electrode. Other high refractive index layers can also be included in the thin high index region 514. An outer surface 514a of the region 514 can be considered to be a light emitting surface of the OLED 510.

In order to provide enhanced optical performance of the OLED, one of the desired optical extraction films 410, 440, 470 is applied to the light emitting surface 514a of the OLED. Before application, the appropriate release liner or premask (see items 418, 448, 478 in FIGS. 4a-c) is removed from the film to expose a pristine optical coupling surface (see items 416a, 446a, 480a). In some cases, the optical coupling surface of the optical extraction film may be placed directly against the light emitting surface 514a of the OLED. If the outermost layer of the extraction film is a pressure sensitive adhesive or other suitable light transmissive adhesive, the direct contact between the optical coupling surface of the optical extraction film and the light emitting surface of the OLED may be sufficient to produce a firm bond between the two components with no significant air gap therebetween.

In other cases, a thin optical coupling layer may be provided between the optical coupling surface of the optical extraction film and the light emitting surface 514a of the OLED. The optical coupling layer may serve several functions. One function may be to planarize the emitting surface of the OLED. In many pixelated top-emissive OLEDs, for example, the substrate may have surface features associated with pixel and sub-pixel wells. The optical coupling layer may be used to fill the wells or other surface features so as to provide a planar surface that the coupling surface of the optical extraction film (see e.g. 416a, 446a, 480a) can attach to with no air gaps or pockets. Another function of the optical coupling layer may be to attach the optical extraction film to the OLED, e.g., in cases where the outermost layer of the extraction film is not a pressure sensitive adhesive or other suitable adhesive. In some cases, the optical coupling layer, if included in the construction, may have a refractive index as close to that of the high index region 514 of the OLED as possible so that waveguiding modes within the high index region, or their associated evanescent zone, can be extended closer to the coupling surface of the extraction film. The optical coupling layer may, for example, have a refractive index between that of the high index region 514 and the layer whose outer surface corresponds to the coupling surface of the optical extraction film. Suitable optical coupling layers comprise light-transmissive material such as high-index adhesives and nanoparticle-filled polymers. Suitable optical coupling layers are also typically as thin as possible while performing their necessary function(s) so as to minimize the distance between the coupling surface of the extraction film and the light emitting surface of the OLED. A typical optical coupling layer may, for example, have a thickness in a range from 0.5 to 5 microns, or from 0.5 to 20 microns, but other thicknesses may also be used.

Whether or not an optical coupling layer is used, attachment of the optical extraction film to the OLED results in enhanced operation of the resulting OLED device. The optical extraction film, whether by reducing waveguiding modes, reducing total internal reflection of light, or by other mechanisms, can provide increased useful illumination, sometimes also referred to as increased gain, of the OLED when used in a given optical system. The increased illumination or gain may be characterized or measured in terms of the total luminance integrated over the hemisphere of possible output directions from the output surface of the OLED device, or may be measured in other ways such as increased illumination along a particular direction of interest, e.g., increased on-axis illumination or gain along the direction perpendicular to the OLED output surface.

Besides increasing the useful illumination or gain of the OLED device, exemplary optical extraction films also have the advantage that they can provide a flat or planar outer surface that serves as the output surface of the OLED/film combination. Each of extraction films 410, 440, 470 is shown as having a flat surface (labeled in FIGS. 4*a*-*c* as surfaces 412*b*, 442*b*, 472*b* respectively), and it is this surface that may become the output surface of the OLED device after the film is applied. Advantageously, the delicate structured surface(s) responsible for the increased output of the OLED, e.g., structured surfaces 414*a*, 444*a*, 474*a*, and 476*a*, are in each case embedded within the film and within the device, being safely protected from abrasion, dirt, dust, oils, and other detrimental agents by the flexible carrier layer (labeled in FIGS. 4*a*-*c* as 412, 442, 472). A flat output surface can thus be seen to be beneficial in many applications, but in some cases it may be desirable to emboss or otherwise pattern the output surface of the OLED/film combination (e.g. surfaces 412*b*, 442*b*, 472*b*) to provide an exposed structured surface that further modifies the light distribution emitted by the device.

Figure 5B:
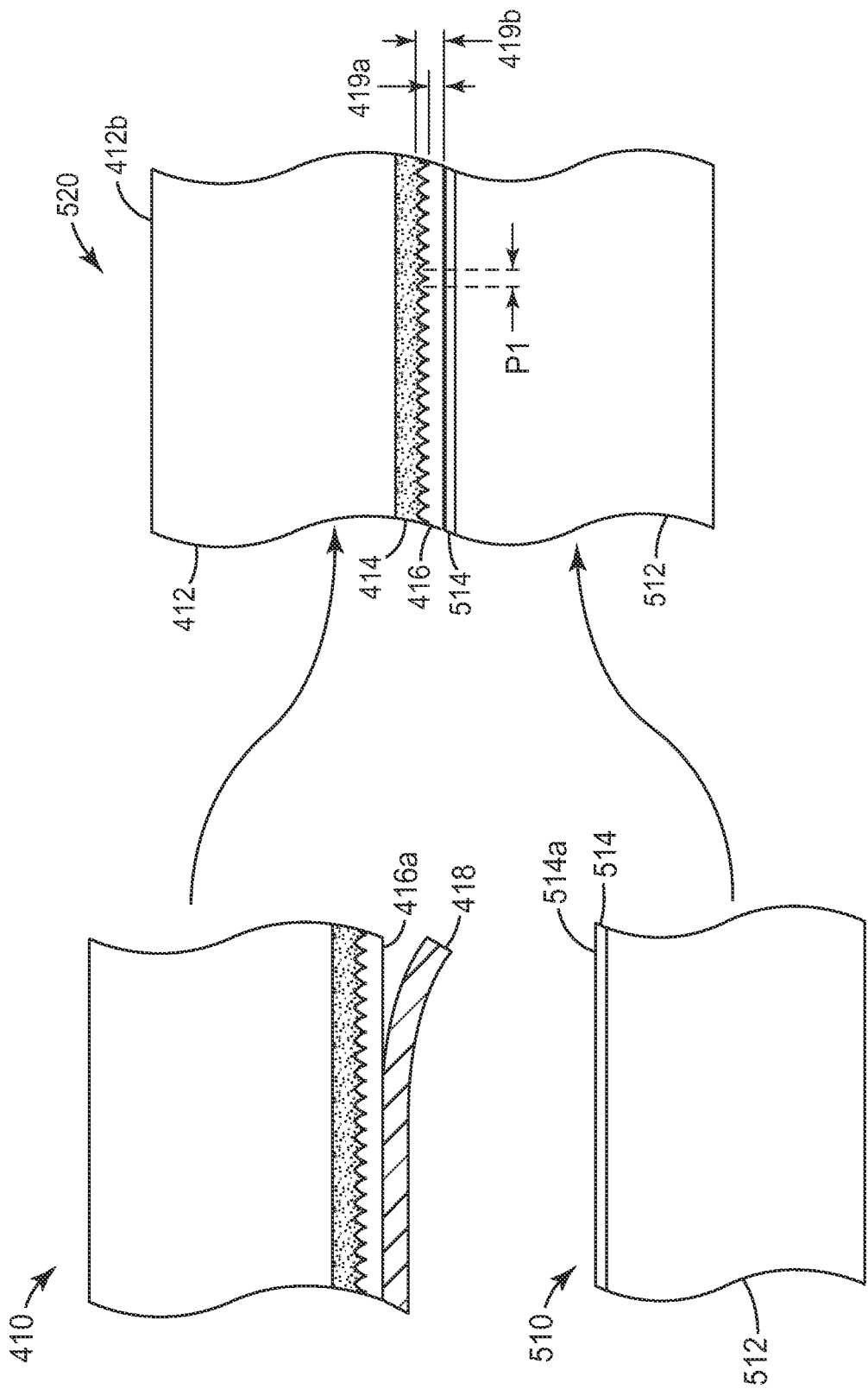
FIG. 5b is a schematic side or cross-sectional view which shows how a particular optical extraction film can be applied to a top-emitting OLED.

FIG. 5*b* demonstrates the application of one specific optical extraction film to a top-emitting OLED. Initially, the optical extraction film 410, described in detail elsewhere herein, and the top-emitting OLED 510, also described elsewhere herein, are separately manufactured and provided as starting elements. The release liner 418 is removed from the extraction film to expose the optical coupling surface 416*a*. The extraction film 410 and the OLED 510 are then pressed together to form the combined OLED device 520 with enhanced output. The extraction film is preferably firmly bonded to the OLED, e.g., by use of a pressure sensitive adhesive or other suitable adhesive to form layer 416, or by use of a suitable light-transmissive adhesive as an optical coupling layer.

In the device 520, the optical coupling surface 416*a* of the extraction film and the light emitting surface 514*a* of the OLED contact or coincide with each other. As a result, the distances 419*a*, 419*b* represent not only the minimum and maximum axial distance from the structured surface 414*a* to the optical coupling surface 416*a*, but also the minimum and maximum axial distance (respectively) from the structured surface 414*a* to the light emitting surface 514*a* of the OLED. Note that in alternative embodiments, a thin optical coupling layer as described above may be included between surface 416*a* and surface 514*a*. In any case, light generated within the high index region 514 is refractively coupled out of the OLED device by the extraction elements of the embedded structured surface, and eventually exits the device 520 through surface 412*b*, which may now be considered the output surface of the device 520.

Figure 5C:
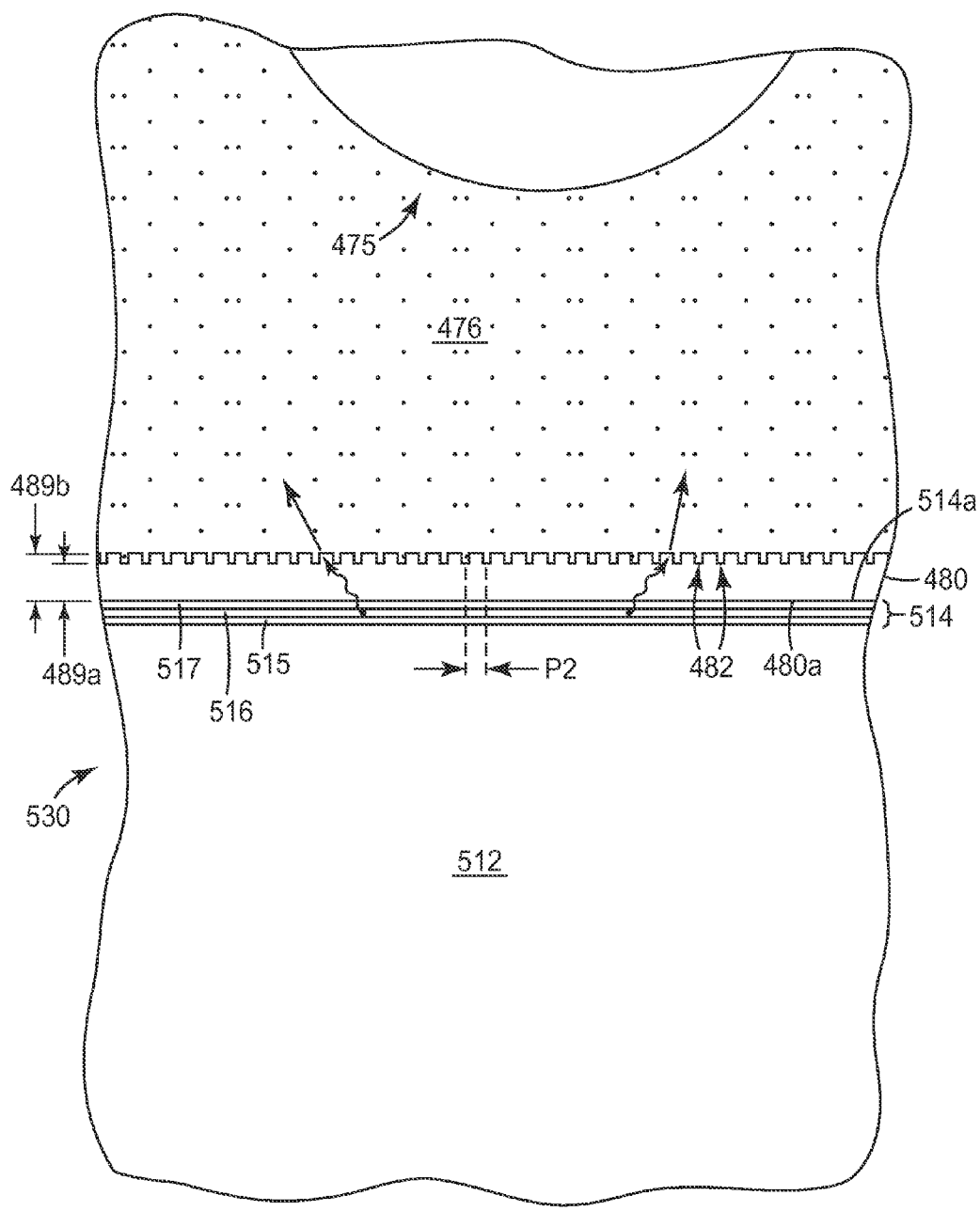
FIG. 5c is a schematic side or cross-sectional view of an optical device in which a top-emitting OLED has been combined with a particular optical extraction film.

FIG. 5*c* is a schematic side or cross-sectional view of an OLED device 530 in which a top-emitting OLED, such as OLED 510 described in connection with FIG. 5*a*, has been combined with another optical extraction film, in this case, the extraction film 470 of FIG. 4*c*. In producing this combination, the release liner 478 has been removed from the extraction film to expose the optical coupling surface 480*a*, which surface is then pressed against the light emitting surface 514*a* of the OLED 510. In this enlarged view, both light extraction elements 482 from structured surface 476*a*, and one of the light extraction elements 475 from the structured surface 474*a*, can be seen so as to give the reader some sense of size and thickness differences that may be realized between refractive elements and diffractive elements in some embodiments. The enlarged view of FIG. 5*c* also shows some additional detail regarding the high index region 514. Region 514 is shown as comprising at least three separate layers, 515, 516, and 517. The layer 516 may be an organic light generating layer, and one or both of layers 515, 517 may be a transparent electrode layer, e.g. composed of a transparent conductive oxide (TCO) such as indium tin oxide (ITO). In any case, all of the layers 515, 516, 517 are composed of high refractive index materials, e.g., in a range from 1.6 to 1.8.

In the device 530, the optical coupling surface 480*a* of the extraction film and the light emitting surface 514*a* of the OLED contact or coincide with each other. As a result, the distances 489*a*, 489*b* represent not only the minimum and maximum axial distance from the structured surface 476*a* to the optical coupling surface 480*a*, but also the minimum and maximum axial distance (respectively) from the structured surface 476*a* to the light emitting surface 514*a* of the OLED. Note that in alternative embodiments, a thin optical coupling layer as described above may be included between surface 416*a* and surface 514*a*. In any case, light generated within the high index region 514 is refractively coupled out of the OLED device by the extraction elements of the embedded structured surface, and eventually exits the device 520 through surface 412*b*, which may now be considered the output surface of the device 520.

Figure 6A:
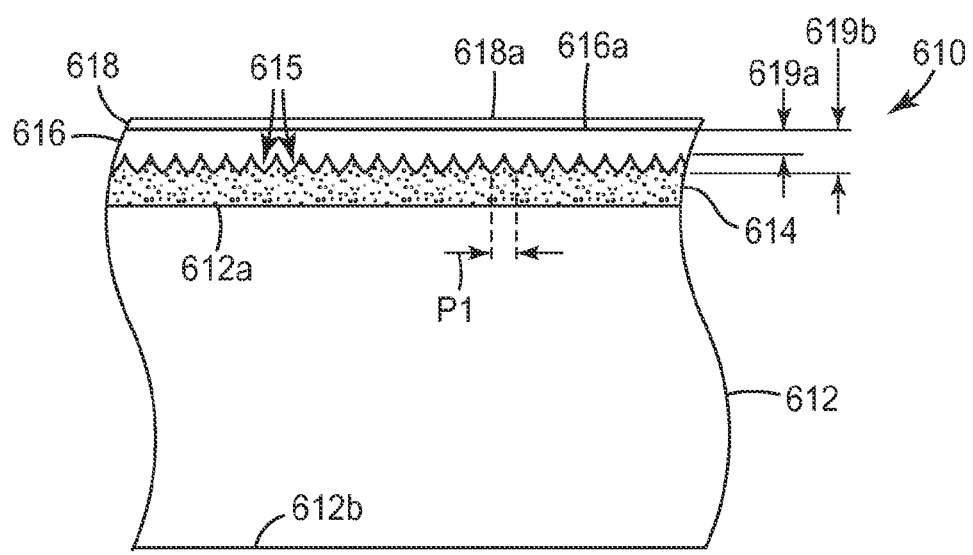
Figure 6C:
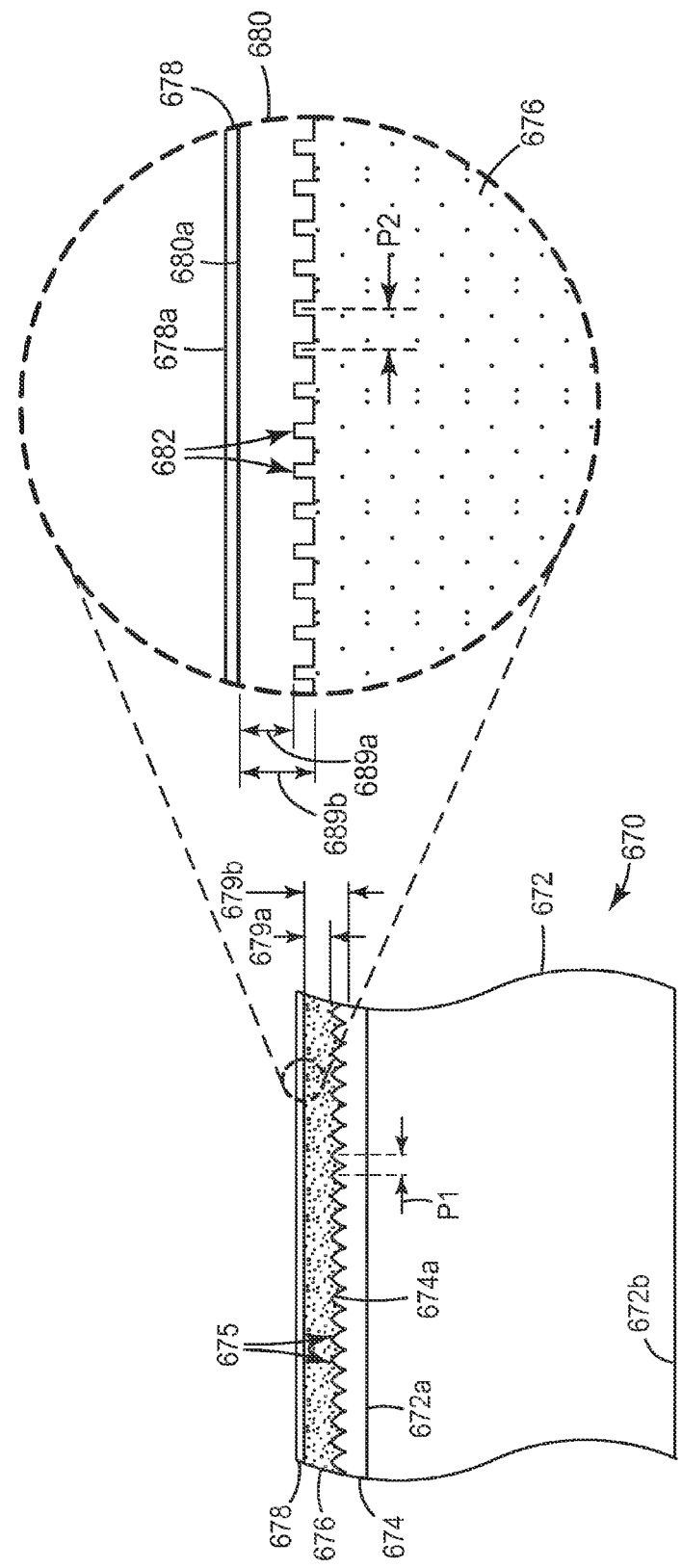

FIGS. 6*a*-6*c* are schematic side or cross-sectional views optical extraction films that can be used with bottom-emitting OLEDs. Many of the elements and features of these films are direct counterparts to corresponding elements and features of the extraction films described in connection with FIGS. 4*a*-*c*. For example, the flexible carrier films of FIGS. 6*a*-*c* may substantially correspond to the flexible carrier films discussed in connection with FIGS. 4*a*-*c*. Larger structured surfaces adapted for refractive coupling of TIR light, and smaller structured surfaces adapted for diffractive coupling of waveguiding modes, and their constituent light extraction elements, are depicted in FIGS. 6*a*-*c*, and may substantially correspond to the analogous structured surfaces described in connection with FIGS. 4*a*-*c*. Nanovoided layers, and other layers that interface with a nanovoided layer at a structured surface, are depicted in FIGS. 6*a*-*c*, and may substantially correspond to the nanovoided layers and other layers discussed in connection with FIGS. 4*a*-*c*. To avoid unnecessary repetition, details of such common elements and features will not be repeated here but will be understood as applying equally to these embodiments.

In contrast to the extraction films of FIGS. 4*a*-*c*, which are adapted to be applied to a self-emissive light source that is fabricated separately from the extraction film, the extraction films of FIGS. 6*a*-*c* are adapted to be used as a substrate on which the self-emissive light source can be fabricated. In the former cases, light from the OLED is emitted out of the "top" of the structure, i.e., through and out of the optical extraction film (acting as a "cover"), while in the latter cases, light from the OLED is emitted out of the "bottom" of the structure, i.e., again through and out of the optical extraction film (but now acting as a "substrate"). The reader will understand that "top", "bottom", "cover", "substrate", "carry", and "atop" should not be construed for purposes of this application to require any particular orientation with respect to gravity, unless otherwise clearly indicated to the contrary.

In FIG. 6*a*, an optical extraction film 610 includes a flexible carrier film 612 and various layers carried by (e.g. attached to) the film 612. Among these layers is a nanovoided layer 614 and another layer 616, between which an embedded interface forming a structured surface 614*a* is formed. The nanovoided layer preferably has a refractive index for visible light well below that of conventional polymeric materials, e.g., below 1.35 or 1.3, or in a range from 1.15 to 1.3 or 1.15 to 1.35, for example. The other layer 616 is preferably composed of a polymer material or other suitable material that is not nano-voided and that has a refractive index greater than that of the nanovoided layer. The difference in refractive index between the layers 614, 616 is desirably relatively large, e.g., at least 0.2, or 0.3, or 0.4, or 0.5 or more. The difference in refractive indices allows the structured surface 614a to function as an optical interface capable of extracting light from an OLED or other self-emissive light source.

The structured surface 614a may be tailored to have any contour or shape that is effective in extracting light from the light source, i.e., coupling wasted light out of the light source so that it can be used in the intended application. In exemplary embodiments, the structured surface is shaped to define individual light extraction elements 615. The elements 615 are shown as having curved surfaces which may represent curved linear prisms or an array of lenticular elements, but the extraction elements may in general have any suitable shape without limitation. In exemplary embodiments, the extraction elements 615 are characterized by a center-to-center spacing or pitch P1 between nearest neighbors. In cases where the extraction elements are not uniformly distributed or spaced from each other, the pitch P1 may represent an average center-to-center spacing of the extraction elements.

Unlike the extraction films of FIGS. 4a-c, the extraction films of FIGS. 6a-c are all depicted as having a transparent electrode layer as an outermost layer on one side of the film. The transparent electrode may be composed of ITO or other suitable light transmissive electrically conductive material. In the case of extraction film 610 of FIG. 6a, this layer is transparent electrode layer 618, disposed atop layer 616. Such a transparent electrode layer in the embodiments of FIGS. 6a-c is preferably adapted to function as an electrode on which one or more organic light generating layer can be formed so as to provide a high refractive index light generating region or core of an OLED. Thus, the transparent electrode layer may initially be considered to be part of the optical extraction film, and, after formation of the OLED atop the extraction film, may later be considered to be part of the high index region or core of the resulting OLED device.

The structured surface 614a and/or extraction elements 615 may also be characterized by a distance or thickness from a surface of the extraction film that is adapted to couple to the self-emissive light source. In the case of extraction film 610, this coupling surface may be considered to be the major surface 616a of layer 616 because it adjoins the outer surface of what will later become the high refractive index light generating region of the OLED. Unlike surface 618a of electrode layer 618, surface 616a is not an exterior surface. Two characteristic distances are labeled in the figure. Distance 619a is the thickness of the continuous land portion of the layer 616 between the coupling surface 616a and the structured surface 614a. The other characteristic distance, 619b, is the distance between the coupling surface 616a and a plane that is parallel to the coupling surface and that intersects the structured surface at the point(s) of the structured surface that is/are farthest away from the coupling surface.

In cases where the extraction film 610 is intended to enhance light extraction by reducing the amount of light that is totally internally reflected at an outermost surface or boundary of the self-emissive light source, we have found it advantageous to design the extraction film 610 such that the land thickness 619a is relatively small. For example, the land thickness 619a may be less than 50 microns, or less than 25 microns, or less than 10 microns, although these values should not be construed as limiting. The land thickness 619a may also be less than a thickness of the flexible substrate 612. The land thickness 619a may also be so thin that the layer 616 is not suitable as a free-standing support film in roll-to-roll processing systems such as is depicted in FIG. 2. The land thickness 619a may also if desired be chosen to be large enough so that a substantial portion of the light extraction elements 615 is not disposed within an evanescent zone of the self-emissive light source.

We have also found it advantageous, again in cases where the film 610 is intended to enhance light extraction by reducing TIR, to tailor the extraction features 615 such that their pitch P1 is relatively large, e.g., greater than 1 micron. The feature heights, i.e., the difference between distance 619b and distance 619a, may also if desired be greater than 1 micron. The feature heights and transverse dimensions may be sufficiently large, e.g., greater than 1, 5, 10, or 20 microns, that the functionality of the extraction features is principally governed by principles of optical refraction rather than, for example, optical diffraction.

The optical extraction film 610 may be fabricated using a wide variety of manufacturing techniques, including without limitation continuous techniques and batch techniques. A particularly advantageous manufacturing technique is a continuous cast and cure (3C) roll-to-roll process such as that shown schematically in FIG. 2. Other suitable manufacturing techniques are also contemplated. However, if the extraction film 610 is made using a process similar to that of FIG. 2, the layer 616 may constitute a backfill layer that was produced after the formation of the nanovoided layer 614 and the structured surface 614a. Consequently, depending on materials selection and process conditions, the layer 616 may interpenetrate the nanovoided layer 614 as discussed in connection with FIG. 3a.

The carrier film 612, the nanovoided layer 614, the layer 616, and the electrode layer 618 are preferably all highly transmissive to light from the light source, although small to moderate amounts of haze in one, some, or all of these layers may be tolerable and/or desirable in specific applications. The layers preferably transmit light emitted by the light source with low loss so that, after the light source is fabricated atop the extraction film, a large fraction of light from the light source that traverses the coupling surface 616a will exit the extraction film at the opposite outer surface 612b and contribute to system illumination.

The light extraction film 610 may of course include other layers in addition to those depicted in FIG. 6a, and other features or characteristics in addition to those already discussed. For example, materials may be incorporated within the film to enhance light extraction through scattering or to filter, color shift, or polarize the light. Surface coatings or structures, for example functional layers, can be applied to the air surface of the light extraction film in order to further increase the functionality and possibly the value of the light extraction film. Such surface coatings can have, for example, optical, mechanical, chemical, or electrical functions. Examples of such coatings or structures include those having the following functions or properties: antifog; antistatic; antiglare; antireflection; antiabrasion (scratch resistance); antismudge; hydrophobic; hydrophilic; adhesion promotion; refractive elements; color filtering; ultraviolet (UV) filtering; spectral filtering; color shifting; color modification; polarization modification (linear or circular); light redirection; diffusion; or optical rotation. Other possible layers to be applied to the air surface include a barrier layer or a transparent electrically conductive material. If desired, a release liner may be provided on the one side of the extraction film to protect the output surface 612b, and another release liner may be provided on the opposite side of the extraction film 610 to protect the electrode layer 618 from damage until access to that surface is needed.

FIG. 6b is a schematic side or cross-sectional view of another optical extraction film that can be used with a bottom-emitting OLED. In FIG. 6b, an optical extraction film 640 includes a flexible carrier film 642 and various layers carried by (e.g. attached to) the film 642. Among these layers is a nanovoided layer 644 and another layer 646, between which an embedded interface forming a structured surface 644a is formed (see inset). A transparent electrode layer 648 is also provided atop layer 646. The nanovoided layer preferably has a refractive index for visible light well below that of conventional polymeric materials, e.g., below 1.35 or 1.3, or in a range from 1.15 to 1.3 or 1.15 to 1.35, for example. The other layer 646 is preferably composed of a polymer material or other suitable material that is not nanovoided and that has a refractive index greater than that of the nanovoided layer. The difference in refractive index between the layers 644, 646 is desirably relatively large, e.g., at least 0.2, or 0.3, or 0.4, or 0.5 or more. The difference in refractive indices allows the structured surface 644a to function as an optical interface capable of extracting light from an OLED or other self-emissive light source, as described elsewhere herein.

The structured surface 644a may be tailored to have any contour or shape that is effective in extracting light from the light source, i.e., coupling wasted light out of the light source so that it can be used in the intended application as discussed above. In exemplary embodiments, the structured surface is shaped to define individual light extraction elements 645. The elements 645 are shown as having rectangular profiles which may represent flat linear ridges or an array of box-shaped protuberances arranged in two orthogonal directions, but the extraction elements may in general have any suitable shape without limitation. In exemplary embodiments, the extraction elements 645 are characterized by a center-to-center spacing or pitch P2 between nearest neighbors. In cases where the extraction elements are not uniformly distributed or spaced from each other, the pitch P2 may represent an average center-to-center spacing of the extraction elements.

The structured surface 644a and/or extraction elements 645 may also be characterized by a distance or thickness from a surface of the extraction film that is adapted to couple to the self-emissive light source. In the case of extraction film 640, this coupling surface is the major surface 646a of layer 646 because it adjoins the outer surface of what will later become the high refractive index light generating region of the OLED. Unlike surface 648a of electrode layer 648, surface 646a is not an exterior surface. Two characteristic distances are labeled in the figure. Distance 649a is the thickness of the continuous land portion of the layer 646 between the coupling surface 646a and the structured surface 644a. The other characteristic distance, 649b, is the distance between the coupling surface 646a and a plane that is parallel to the coupling surface and that intersects the structured surface at the point(s) of the structured surface that is/are farthest away from the coupling surface.

In cases where the extraction film 640 is intended to enhance light extraction by reducing the amount of light that is trapped as waveguiding modes in a high refractive index light emitting region of the self-emissive light source, we have found it advantageous to design the extraction film 640 such that the land thickness 649a is very small, e.g., small enough so that a substantial portion of the light extraction elements 645 is disposed within an evanescent zone of the self-emissive light source when the coupling surface 646a is disposed against an emitting surface of the light source (e.g., against a surface of the electrode layer 618 after the remaining portions of the OLED have been fabricated atop such layer 618). In many cases, the land thickness 649a may be less than 20 microns, or less than 10 microns, or less than 5 microns, although these values should not be construed as limiting. The land thickness 649a may also be less than a thickness of the flexible substrate 642, and may be so thin that the layer 646 is not suitable as a free-standing support film in roll-to-roll processing systems such as is depicted in FIG. 2.

We have also found it advantageous to tailor the extraction features 645 such that their pitch P2 is relatively small, e.g., less than 1 micron, in order to couple light out of the waveguiding modes. The feature heights may also if desired be less than 1 micron. The feature heights and transverse dimensions may be sufficiently small that the functionality of the extraction features is principally governed by principles of optical diffraction rather than, for example, optical refraction. The structured surface 644a may have a periodic, quasi-periodic, or random distribution of extraction features, and the extraction features may in some cases be arranged to form a photonic crystal structure.

The optical extraction film 640 may be fabricated using many different manufacturing techniques. If the film 640 is made using a process similar to that of FIG. 2, the layer 646 may constitute a backfill layer that was produced after the formation of the nanovoided layer 644 and the structured surface 644a. Consequently, depending on materials selection and process conditions, the layer 646 may interpenetrate the nanovoided layer 644 as discussed in connection with FIG. 3a.

The carrier film 642, the nanovoided layer 644, the layer 646, and the electrode layer 648 are preferably all highly transmissive to light from the light source, although small to moderate amounts of haze in one, some, or all of these layers may be tolerable and/or desirable in specific applications. The extraction film 640 may also include other layers in addition to those depicted in FIG. 6b, and other features or characteristics in addition to those already discussed. Release liners may be provided on one or both sides of the film 640.

FIG. 6c is a schematic side or cross-sectional view of still another optical extraction film that can be used with a bottom-emitting OLED. In FIG. 6c, an optical extraction film 670 includes a flexible carrier film 672 and various layers carried by (e.g. attached to) the film 672. Among these layers is a nanovoided layer 676 and another layer 674, between which an embedded interface forming a structured surface 674a is formed. A second embedded interface forming a second structured surface 676a (see inset) is formed between the nanovoided layer 676 and another layer 680. A transparent electrode layer 678 is also provided atop layer 680. The nanovoided layer preferably has a refractive index for visible light well below that of conventional polymeric materials, e.g., below 1.35 or 1.3, or in a range from 1.15 to 1.3 or 1.15 to 1.35, for example. The other layers 674, 680 are preferably composed of polymer materials or other suitable materials that are not nanovoided and that have refractive indices greater than that of the nanovoided layer. The difference in refractive index between the layers 674, 676, and between the layers 676, 680, is desirably relatively large, e.g., at least 0.2, or 0.3, or 0.4, or 0.5 or more. The differences in refractive indices allow each of the structured surfaces 674a, 676a to function as an optical interface capable of extracting light from an OLED or other self-emissive light source, as described elsewhere herein.

The structured surfaces 674a, 676a may each be tailored to have any contour or shape that is effective in extracting light from the light source, i.e., coupling wasted light out of the light source so that it can be used in the intended application as discussed above. The structured surfaces 674a, 676a may be each shaped to define individual light extraction elements 675, 682 respectively. The elements 675 are shown as having curved surfaces which may represent curved linear prisms or an array of lenticular elements, but the extraction elements 675 may in general have any suitable shape without limitation. The elements 682 are shown as having rectangular profiles which may represent flat linear ridges or an array of box-shaped protuberances, but the extraction elements 682 may in general have any suitable shape without limitation. The extraction elements 675 may be characterized by a center-to-center spacing or pitch P1 between nearest neighbors, and the extraction elements 682 may be characterized by a center-to-center spacing or pitch P2 between nearest neighbors. In cases where the extraction elements are not uniformly distributed or spaced from each other, the pitches P1 and/or P2 may represent an average center-to-center spacing of the respective extraction elements.

The structured surfaces 674a, 676a and/or their respective extraction elements 675, 682 may also be characterized by a distance or thickness from a surface of the extraction film that is adapted to couple to the self-emissive light source. In the case of extraction film 670, this coupling surface is the major surface 680a of layer 680 because it adjoins the outer surface of what will later become the high refractive index light generating region of the OLED. Unlike surface 678a of electrode layer 678, surface 680a is not an exterior surface. Four characteristic distances are labeled in the figure, two for each of the embedded structured surfaces. With regard to structured surface 674a, distance 679a is the axial distance from the coupling surface 680a to the nearest portion of the structured surface 674a. Despite the fact that this distance does not precisely correspond to the thickness of a continuous land of layer 676 (due to the presence of layer 680 and structured surface 676a), it may nevertheless be considered to substantially correspond to the continuous land portion of layer 676 if the layer 680 is much thinner than the layer 676. Distance 679b is the axial distance from the coupling surface 680a to the farthest portion of the structured surface 674a. With regard to structured surface 676a, distance 689a is the thickness of the continuous land portion of the layer 680 between the coupling surface 680a and the structured surface 676a. The distance 689b is the axial distance from the coupling surface 680a to the farthest portion of the structured surface 676a.

Preferably, the extraction film 670 combines aspects of extraction films 610 and 640. For example, the extraction film 670 can be tailored to enhance light extraction from an OLED or other self-emissive light source both by reducing the amount of light that is totally internally reflected at an outermost surface or boundary of the self-emissive light source (via structured surface 674a), and by reducing the amount of light that is trapped as waveguiding modes in a high refractive index light emitting region of the self-emissive light source (via structured surface 676a). In this regard we have found it advantageous to design the extraction film 670 such that the substantial land thickness 679a is relatively small, e.g., less than 50 microns, or less than 25 microns, or less than 10 microns, and to further design the film 670 such that the land thickness 689a is smaller still, e.g., small enough so that a substantial portion of the light extraction elements 682 is disposed within an evanescent zone of the self-emissive light source when the coupling surface 680a is disposed against an emitting surface of the light source. The land thickness 689a may, for example, be less than 20 microns, or less than 10 microns, or less than 5 microns, and it may be a small fraction of the substantial land thickness 679a associated with the larger structured surface 674a.

We have also found it advantageous to tailor the extraction features 675 such that their pitch P1 is relatively large, e.g., greater than 1 micron, while also tailoring the extraction features 682 such that their pitch P2 is relatively small, e.g., less than 1 micron. The feature heights and transverse dimensions of the extraction features 675 may be sufficiently large that their functionality is principally governed by principles of optical refraction, while the feature heights and transverse dimensions of extraction features 682 may be sufficiently small that the functionality of the extraction features is principally governed by principles of optical diffraction.

The optical extraction film 670 may be fabricated using many different manufacturing techniques. The flexible carrier film 672 may have physical characteristics that make it suitable as a free-standing support film similar to substrate 216 in FIG. 2.

In some cases, the structured surface 674a and/or the structured surface 676a may be fabricated not with a casting-and-curing technique but with other suitable techniques capable of producing the desired extraction features in the desired layers. However, if the extraction film 670 is made using a process similar to that of FIG. 2, the nanovoided layer 676 may constitute a backfill layer that was produced after the formation of the layer 674 and the structured surface 674a, and the layer 680 may constitute another backfill layer that was produced after the formation of nanovoided layer 676 and structured surface 676a. Consequently, depending on materials selection and process conditions, the layer 680 may interpenetrate the nanovoided layer 676 as discussed in connection with FIG. 3a, while the nanovoided layer 676 may not interpenetrate the layer 674.

The carrier film 672, the nanovoided layer 676, the layers 474, 480, and transparent electrode layer 678 are preferably all highly transmissive to light from the light source, although small to moderate amounts of haze in one, some, or all of these layers may be tolerable and/or desirable in specific applications. The extraction film 470 may include other layers in addition to those depicted in FIG. 6c, and other features or characteristics in addition to those already discussed. A release liner may be provided on one or both sides of the extraction film 670.

Figure 7A:
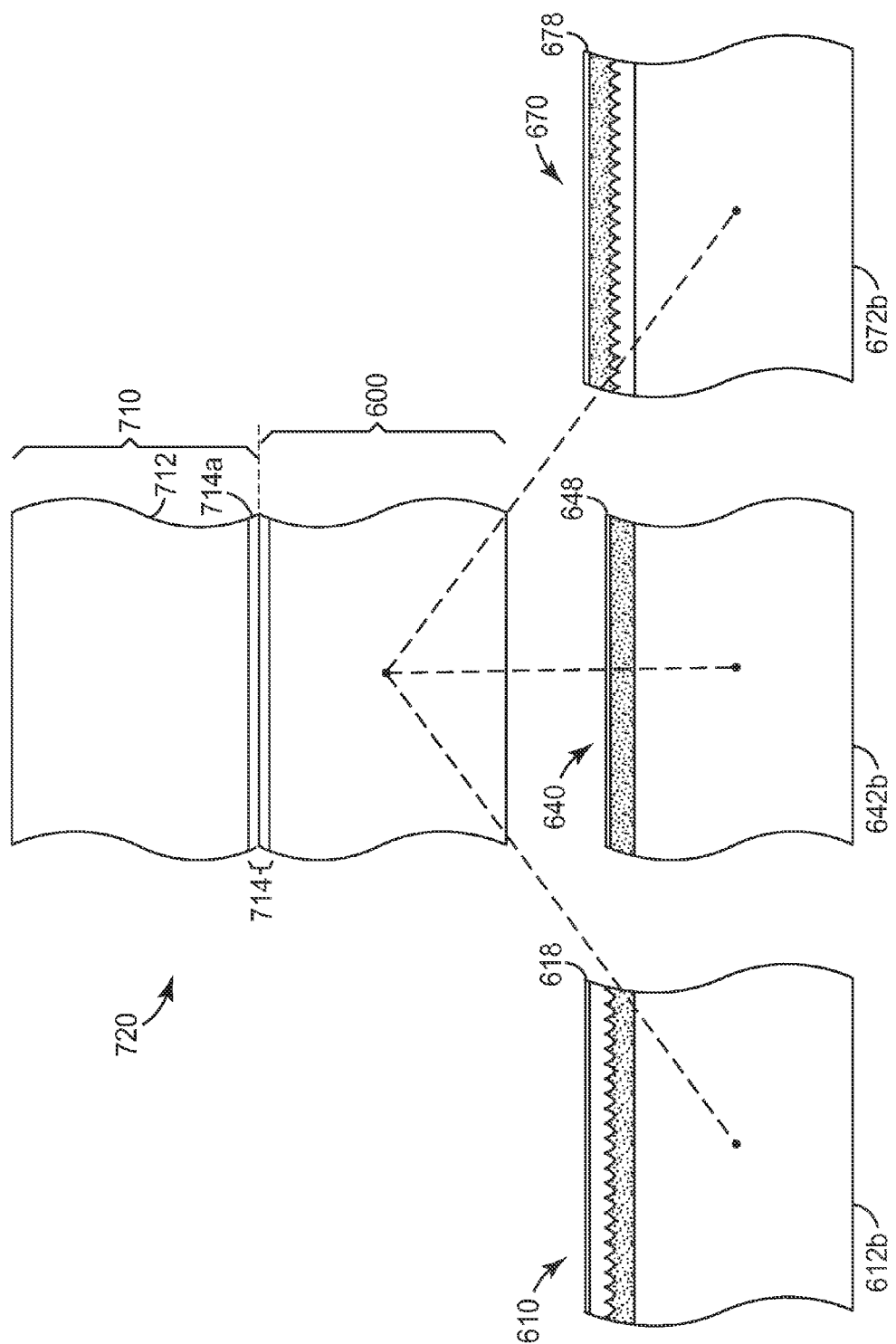
FIG. 7a is a schematic side or cross-sectional view which shows how any of three different optical extraction films can be used as substrates on which a bottom-emitting OLED can be formed.

FIG. 7a shows how any of the optical extraction films of FIGS. 6a-c can be combined with a bottom-emitting OLED or other suitable self-emissive light source which is fabricated on the extraction film, so as to produce an enhanced light-emitting optical device 720.

A first step in producing such a combination may be to provide a light extraction film 600, which may be any of the extraction films 610, 640, 670 described above or variations thereof. These films each include on one side thereof a transparent electrode layer. Atop this layer other high refractive index layers may be provided, including at least one organic light generating layer and an optional second electrode layer which may or may not be transparent. These additional high refractive index layers are represented in the figure by a schematic layer 714a. Those layers, in combination with the transparent electrode layer from the optical extraction film, may form a high refractive index light emitting region 714 that generates light of a desired wavelength in response to an applied electrical current or field. The region is typically very thin, e.g. on the order of a wavelength of light, or less than 1 or 2 microns, for example, although other thicknesses may be used.

One or more other layers, represented schematically in the figure by layer 712, may be formed or applied atop the high index region 714. The layer 712 may for example comprise a support film and/or a barrier film. In an exemplary embodiment, the layer 712 may comprise an ultrabarrier film such as those described in U.S. Pat. Nos. 5,440,446 (Shaw et al.), 5,877,895 (Shaw et al.), and 6,010,751 (Shaw et al.), or a sputtered layer of diamond-like glass. Alternatively, the layer 712 may be omitted and replaced with an inert gas or vacuum, which may be maintained in a sealed chamber between the OLED and a suitable cover glass member.

Since the device 720 is a bottom-emitting OLED, light generated in the high index region 714 travels through the extraction film 600 and exits the device through the "bottom" surface as seen from the perspective of FIG. 7a, e.g., from surface 612b, or surface 642b, or surface 672b. In some cases, the device 720 may be designed to emit little or no light emitted from the opposite side of the device. In those cases, one, some, or all of the constituent components of layer 712 may be substantially opaque. In other cases the device 720 may emit light from both sides, whereupon the components of layer 712 may all be light-transmissive. In such cases, where the device is emitting from both sides, it would be useful to apply extraction features on both sides of the device.

Figure 7B:
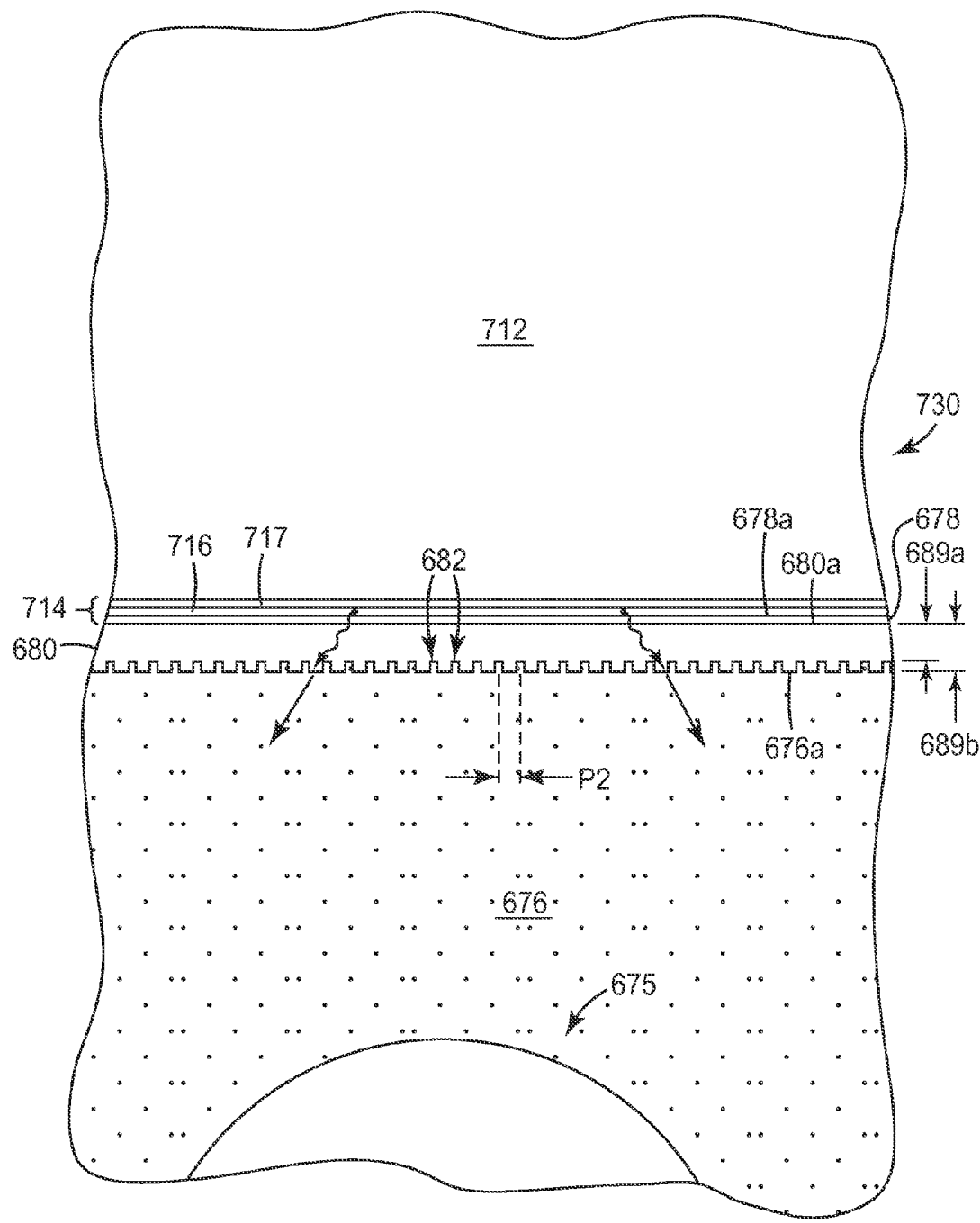
FIG. 7b is a schematic side or cross-sectional view of an optical device in which a bottom-emitting OLED has been formed on a particular optical extraction film.

Turning now to FIG. 7b, we see there a schematic side or cross-sectional view of an optical device 730 in which a bottom-emitting OLED has been formed on a particular optical extraction film, namely, the extraction film 670 of FIG. 6c. Atop the outermost layer (transparent electrode layer 678) of the extraction film has been formed or otherwise added thin high refractive index layers 716, 717, and one or more other layers depicted schematically (again) by layer 712. At least one of the layers 716, 717 comprise an organic light generating layer as described elsewhere herein, and one of the layers 716, 717 may also comprise an electrode which may or may not be transparent. The layers 717, 718, in combination with the transparent electrode layer 678 of the extraction film, form a high refractive index light emitting region 714 that generates light of a desired wavelength in response to an applied electrical current or field. The refractive indices of the constituent layers of region 714 may for example all fall within a range from 1.6 to 1.8. The region 714 is also typically very thin, e.g. on the order of a wavelength of light, or less than 1 or 2 microns, for example, although other thicknesses may be used. The layer(s) comprising layer 712, if present, are typically of substantially lower refractive index than those of the high index region 714, and they are typically much thicker.

In the enlarged view of FIG. 7b, both light extraction elements 682 from structured surface 676a, and one of the light extraction elements 675 from the structured surface 674a, can be seen so as to give the reader some sense of size and thickness differences that may be realized between refractive elements and diffractive elements in some embodiments.

In the device 730, the optical coupling surface 680a of the extraction film is coincident with the light emitting surface of the OLED, since the outer boundary of the high index light emitting region 714 corresponds to a major surface of the transparent electrode layer 678. As a result, the distances 689a, 689b represent not only the minimum and maximum axial distance from the structured surface 676a to the optical coupling surface 680a, but also the minimum and maximum axial distance (respectively) from the structured surface 676a to the light emitting surface 680a of the OLED. Some of the light generated within the high index region 714 is trapped in waveguiding modes for that region, and may be diffractively coupled out of the region 714 by light extraction elements 682, and thereafter may be refractively coupled out of the OLED device by light extraction elements 675, such light eventually exiting the device 730 through surface 672b, which may now be considered the output surface of the device 730.

Since the device 730 is a bottom-emitting OLED, light generated in the high index region 714 travels through the extraction film 670 and exits the device through the "bottom" surface as seen from the perspective of FIG. 7b, i.e., from surface 672b. In some cases, the device 720 may be designed to emit little or no light emitted from the opposite side of the device. In those cases, one, some, or all of the constituent components of layer 712 may be substantially opaque. In other cases the device 720 may emit light from both sides, whereupon the components of layer 712 may all be light-transmissive. In such cases, where the device is emitting from both sides, it would be useful to apply extraction features on both sides of the device.

Pixelated OLED Devices

Figure 8:
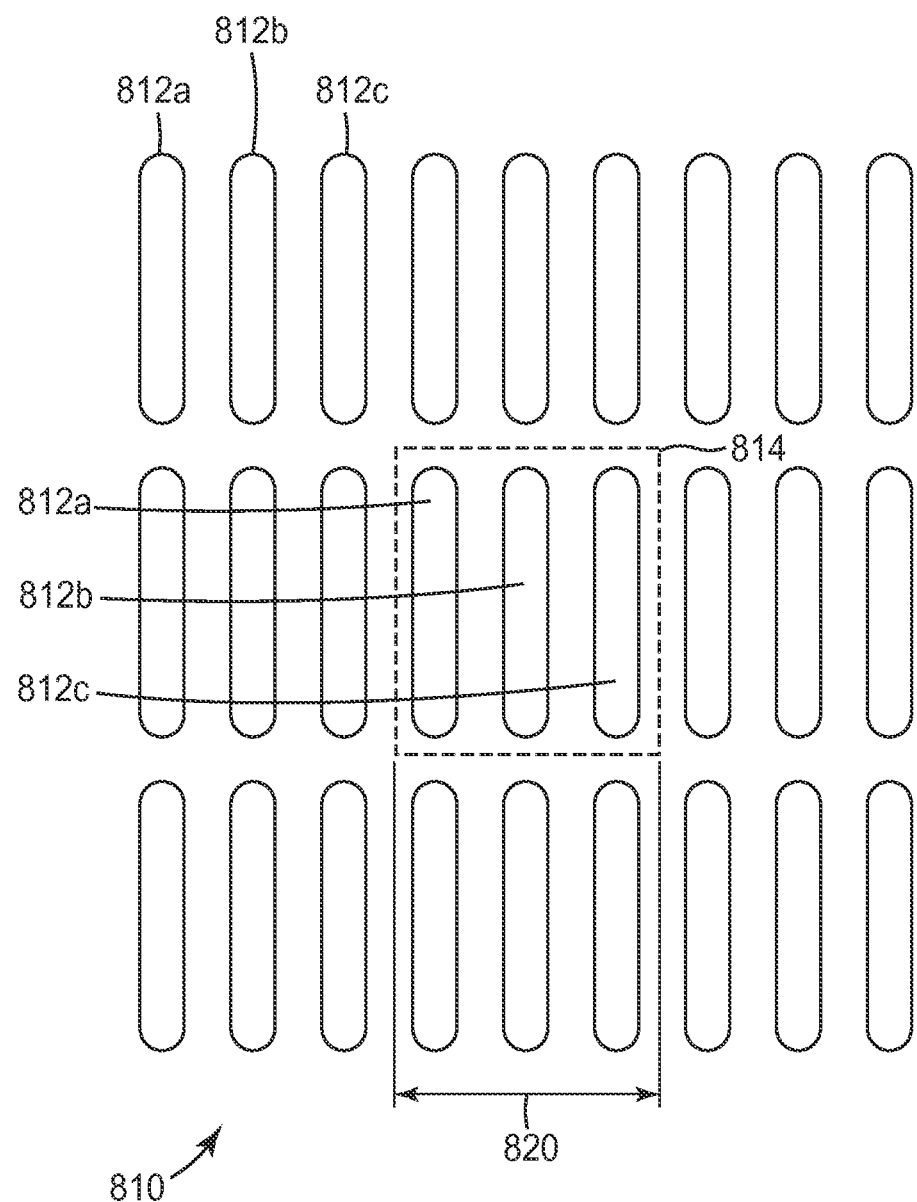
FIG. 8 is a schematic top view of a representative pixelated OLED device.

The disclosed optical extraction films and film/OLED combinations can be practiced with a wide variety of different types of known OLEDs, including non-pixelated OLEDS that may typically be used in lighting applications, and pixelated OLEDS that may typically be used to generate images in an electronic display. FIG. 8 is a schematic top view of a typical pixelated OLED 810. The OLED 810 is patterned to form distinct light-emitting areas 812a, 812b, 812c, and non-emitting areas between the emitting areas. Each of the emitting areas is preferably individually electronically addressable. The light-emitting areas are arranged in a repeating pattern to form a large array, such that any given light-emitting area or set of areas within the array can be illuminated at any given time to provide a static or video image.

In a monochrome display, the areas 812a-c may emit light of the same spectral content or color. In this case, each individual area 812a, 812b, 812c may represent a single pixel. In a color display, the areas 812a-c may emit light of different colors, e.g., areas 812a may emit red light, areas 812b may emit green light, and areas 812c may emit blue light. Other colors and color combinations are also possible, and the OLED may include more or fewer than three different colored areas, as is known in the pixelated display arts. In color displays, the different colored areas are typically grouped together to form pixels, in which case each individual emitting area within a given pixel may be referred to as a subpixel. In the case where OLED 810 is adapted for a color display, and where area 812a emits red light, area 812b emits green light, and area 812c emits blue light, the area 814 may in one embodiment be considered to be a single pixel. The size of that pixel may be characterized by various transverse dimensions, i.e., dimensions measured in the plane of the figure. In cases where the pixel has a nominally rectangular shape, two relevant dimensions may be the length (span of the longer side) and the width (span of the shorter side) of the rectangle. Dimension 820 represents the width of pixel 814. Another relevant dimension may be the maximum transverse dimension, such as the length of the diagonal of a rectangular pixel. Note that if OLED 810 emitted monochrome light such that each individual area 812a, etc. was a pixel, then that smaller pixel would have the same length as pixel 814, but one-third the width of pixel 814. Alternatively, if OLED 810 required four (rather than three) neighboring emitting areas to constitute a pixel, that pixel would have the same length as pixel 814, but a width that was 4/3 times the width of pixel 814.

Figure 9A:
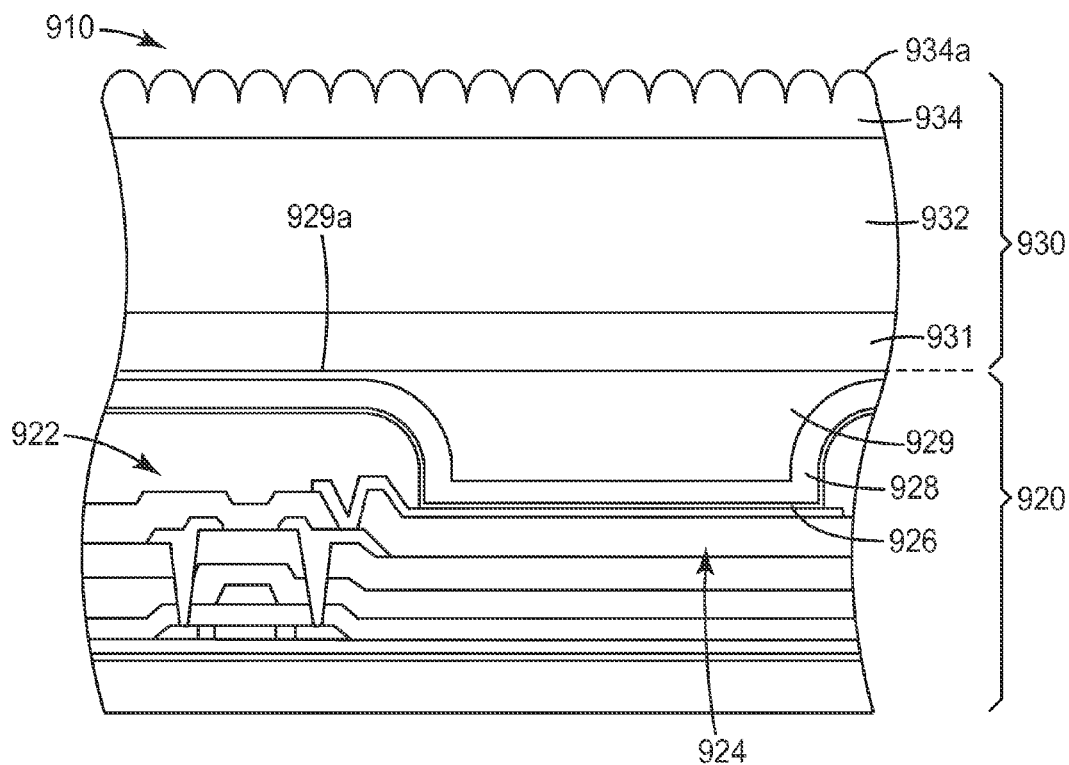
FIG. 9a is a schematic side or cross-sectional view of a device that results from an ordinary optical extraction film being applied to a pixelated top-emitting OLED.
Figure 9B:
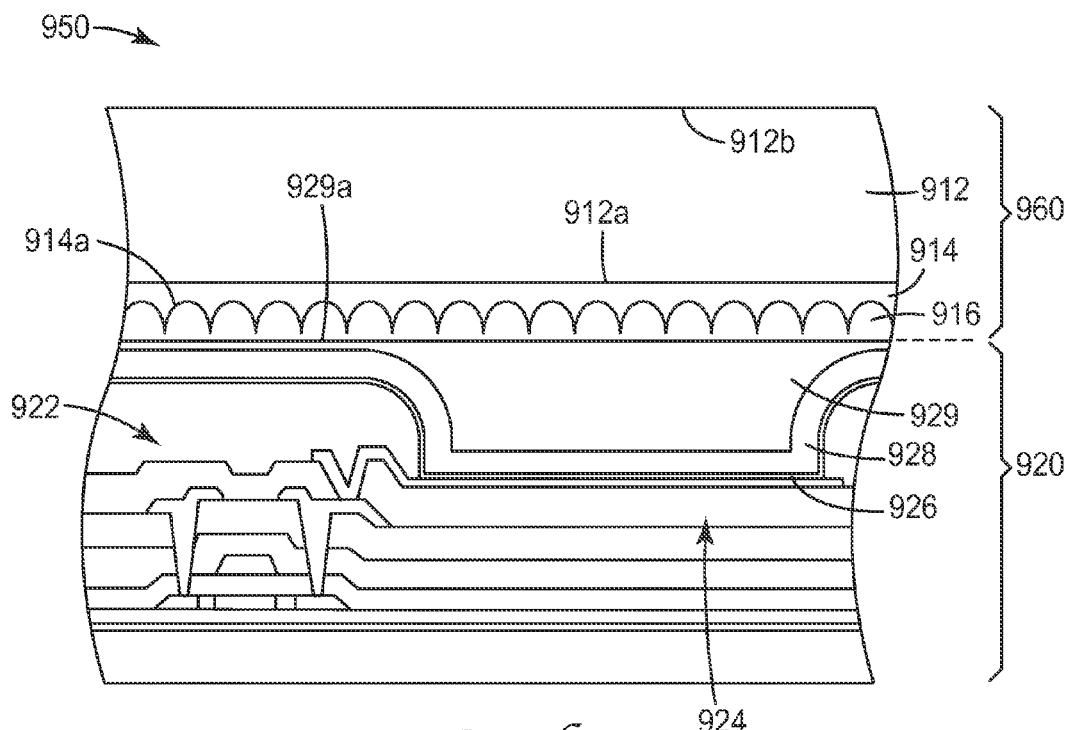
FIG. 9b is a schematic side or cross-sectional view of a device that results from an optical extraction film as disclosed herein being applied to the pixelated top-emitting OLED.

FIGS. 9a and 9b demonstrate the difference between extracting light from a pixelated top-emitting OLED with an ordinary structured surface film, whose structured surface is exposed to air (non-embedded), and extracting light from the same pixelated top-emitting OLED with an extraction film that incorporates the disclosed nanovoided layer and embedded structured surface. Stated simply, use of the nanovoided layer and embedded structured surface allows the structured surface to be disposed much closer to the OLED than that of the other film. This is because the nanovoided layer allows the extraction film of FIG. 9b to be flipped over relative to that of FIG. 9a, such that the carrier film need not be interposed between the OLED and the structured surface. Instead, the (embedded) structured surface can be disposed between the carrier film and the OLED, and the land portion of the extraction film between the (embedded) structured surface and the OLED can be made to have a thickness (e.g., less than 50, 25, or 10 microns) that is substantially less than that of a typical carrier film. Positioning the structured surface closer to the pixelated OLED can have significant advantages for reducing blurring of the pixels, particularly for OLEDs with small pixel sizes. Blurring of the pixels can arise when the structured surface of the extraction film contains refractive structures that scatter light in different directions.

An analogy can be drawn between such scattering and the scattering produced by an ordinary sheet of waxed paper. If a sheet of waxed paper is placed directly atop a page of printed text, an observer may still be able to discern the text through the waxed paper. However, if the waxed paper is slowly lifted so that the distance between the text and the scattering waxed paper increases, the text quickly becomes illegible because the boundaries of the letters of text become too blurred by the scattering action of the waxed paper. Analogous to this, the embedded structured surface of FIG. 9b may produce little to no blurring of the pixelated OLED compared to the structured surface of FIG. 9a, as a result of the much closer proximity of the former structured surface to the OLED compared to that of the latter structured surface.

Thus, FIG. 9a depicts a portion of a device 910 that results from an ordinary optical extraction film 930 being applied to a pixelated top-emitting OLED 920, and FIG. 9b depicts a portion of a device 950 that results from an optical extraction film 960, which incorporates a nanovoided layer and an embedded structured surface, being applied to the same pixelated top-emitting OLED 920. In the figures, the labeled components of the OLED 920 include: a driver/controller 922; a light emitting area (such as a pixel) 924; an organic light generating layer 926; a transparent conductor 928; and an optical coupling layer 929 that planarizes the OLED to provide a flat light-emitting surface 929a. In FIG. 9a, an extraction film 930 having an exposed structured surface 934a is applied to the OLED. The extraction film 930 includes: a carrier film 932; an adhesive layer 931 to attach the carrier film to the OLED; and a coating layer 934 that has been embossed or otherwise formed to provide a structured surface 934a, which may be shaped to define light extraction elements such as lenticular prisms or lenses that are large enough to function based on principles of refraction. None of the individual layers of extraction film 930 are nanovoided layers. In contrast, the extraction film 960 may have a construction similar to that described in connection with FIG. 4a, for example. Film 960 thus includes: a carrier film 912; a nanovoided layer 914, which may have a refractive index in a range from 1.15 to 1.35, or 1.15 to 1.3; a layer 916 of higher refractive index than the nanovoided layer 914, the layer 916 preferably being a backfill and having an interface with the nanovoided layer that defines a structured surface 914a with extraction elements 915, which elements 915 may be lenticular prisms or lenses that are large enough to function based on principles of refraction. A land portion of the layer 916 between the structured surface 914a and the surface 916a may be less than 50 microns, or less than 25 microns, or less than 10 microns, for example. Light from the pixelated OLED is in each case emitted from an uppermost (from the viewpoint of FIGS. 9a and 9b) surface of the extraction film, i.e., from structured surface 934a in FIG. 9a, and from planar surface 912b in FIG. 9b.

Further information on optical extraction films suitable for use with pixelated OLEDs can be found in commonly assigned U.S. patent application publication US 2012/0099323 (Thompson) and incorporated herein by reference in its entirety.

As explained above, the capability of the extraction film 960 to position the structured surface closer to the pixelated OLED than the extraction film 930 results in an advantage of reduced blurring for the extraction film 960. Furthermore, the embedded nature of the structured surface of film 960 provides advantage of robustness or resistance to damage from abrasion or other detrimental agents relative to the exposed nature of the structured surface of film 930.

EXAMPLES

In the following examples, all parts, percentages, ratios, etc. are by weight, unless noted otherwise. Solvents and other reagents used were obtained from Sigma-Aldrich Chemical Company, Milwaukee, Wis. unless specified differently.

Example 1

50/60 Bullet-Shaped Extractors, Adhesive Backfill, No Haze in ULI

A computer simulation was performed of an OLED with an embedded extraction layer using ray tracing methods and the modeling package LIGHTTOOLS (commercially available from Optical Research Associates, Pasadena, Calif.). The configuration that was simulated is shown generally as OLED device 520 in FIG. 5b. The microreplicated nanovoided material of Ultra Low Index (ULI) (see e.g. layer 414 in FIG. 5b) was modeled as having a refractive index of 1.2 and zero haze. The refractive index of the carrier film or substrate (see e.g. layer 412 in FIG. 5b) was selected to be 1.65 to model a polyethylene terephthalate (PET) substrate. The refractive index of the backfill layer (see e.g. layer 416 of FIG. 5b) was selected to be 1.48 to model Soken 2032 pressure sensitive adhesive (commercially available from Soken Chemical & Engineering Co., Ltd, Japan). The substrate was assumed to have a thickness of 100 μm.

Figure 10A:
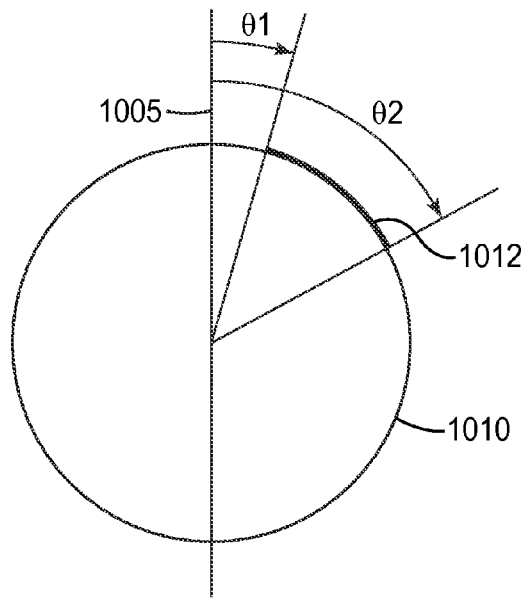
FIG. 10a is an illustration that shows how an arc of circle can be defined.
Figure 10B:
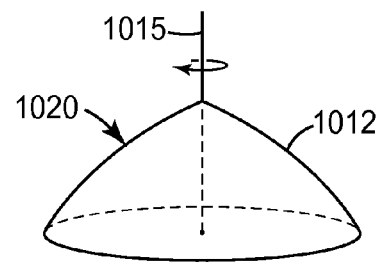
FIG. 10b is an illustration that shows how that defined arc can be used to define a three-dimensional bullet-like shape useable as an extraction element.

The extraction structure (see e.g. the structured surface in FIG. 5b) was an array of bullet-shaped extraction elements with a 50 μm pitch, the array having a hexagonal arrangement of extraction elements in top or plan view. The shape of each extraction element is given by a surface of revolution generated by rotating a segment of a circle about an axis, explained more fully by reference to FIGS. 10a and 10b. The curved segment 1012 used to define the bullet-shapes in Example 1 was the segment of a circle 1010 lying between an angle $\theta 1$ and an angle $\eta 2$ as measured from an axis 1005 in the plane of the circle that passes through the center of the circle. In the bullet shapes of Example 1, $\theta 1$ was 50 degrees and $\theta 2$ was 60 degrees. The segment 1012 was then rotated about an axis 1015, the axis 1015 being parallel to axis 1005 but intersecting the endpoint of the curved segment, so as to generate the bullet-shaped surface of revolution 1020.

The optical performance of this optical extraction film bonded onto the substrate side of an OLED was simulated and the color uniformity was determined as the maximum angular color deviation in the CIE 1976 L* u* v* color space (CIE Standard S 014-5/E:2009). In terms of the (u', v') chromaticity coordinates, the color deviation is given by $$\Delta u'v' = \sqrt{(u'-u'_0)^2 + (v'-v'_0)^2},$$

where $(u'_0, v'_0)$ are the chromaticity coordinates of a reference source—in this case the axial luminance of the OLED—to evaluate the angular color uniformity. The integral gain was determined as the integrated power ratio of the OLED with the extraction film and the OLED without the extraction film. The parameters of the OLED used in the simulation were based on experimental measurements of a Philips Lumiblade OLED (available from Philips Lighting U.S., Somerset, N.J.). We used experimentally measured OLED characteristics in the model and optimization. The OLED was first apertured down to 1 cm×1 cm surface area, and then optically coupled at the substrate side with index-matching oil to a 2.5-inch-diameter BK7 half ball lens, whose spherical surface was antireflection-coated. Because the refractive index of the OLED substrate closely matches the BK7 half-ball lens, the reflection and refraction at the outer substrate surface are eliminated, allowing accurate measurement of the OLED emission into the substrate and the OLED reflection at the OLED/substrate interface. Specifically, the angular-spectral luminance and reflectivity of the OLED were characterized and used in the simulation. When combined with computer-designed extraction layer profiles, the OLED device can be modeled accurately. The computed color deviation as a function of angle is given in Table 1 below, where the angle is the observation angle in air relative to the optical axis or surface normal of the modeled device. The maximum angular color non-uniformity with and without the embedded extraction film was 0.0115 and 0.0242, respectively. The integral gain with the modeled extraction film was 1.48.

TABLE 1

| Angle (degrees) | Δu'v' OLED with Extraction Film | Δu'v' Original OLED |
|---|---|---|
| 88.5 | 0.0060 | 0.0242 |
| 85.5 | 0.0053 | 0.0219 |
| 82.5 | 0.0058 | 0.0202 |
| 79.5 | 0.0057 | 0.0193 |
| 76.5 | 0.0072 | 0.0189 |
| 73.5 | 0.0055 | 0.0182 |
| 70.5 | 0.0065 | 0.0178 |
| 67.5 | 0.0075 | 0.0174 |
| 64.5 | 0.0072 | 0.0171 |
| 61.5 | 0.0080 | 0.0166 |
| 58.5 | 0.0090 | 0.0158 |
| 55.5 | 0.0091 | 0.0150 |
| 52.5 | 0.0105 | 0.0143 |
| 49.5 | 0.0115 | 0.0134 |
| 46.5 | 0.0108 | 0.0124 |
| 43.5 | 0.0115 | 0.0115 |
| 40.5 | 0.0108 | 0.0102 |
| 37.5 | 0.0108 | 0.0088 |
| 34.5 | 0.0098 | 0.0073 |
| 31.5 | 0.0105 | 0.0061 |
| 28.5 | 0.0089 | 0.0048 |
| 25.5 | 0.0072 | 0.0036 |
| 22.5 | 0.0055 | 0.0027 |
| 19.5 | 0.0059 | 0.0015 |
| 16.5 | 0.0049 | 0.0010 |
| 13.5 | 0.0051 | 0.0005 |
| 10.5 | 0.0042 | 0.0005 |
| 7.5 | 0.0018 | 0.0003 |
| 4.5 | 0.0032 | 0.0006 |
| 1.5 | 0.0000 | 0.0000 |

Figure 11A:
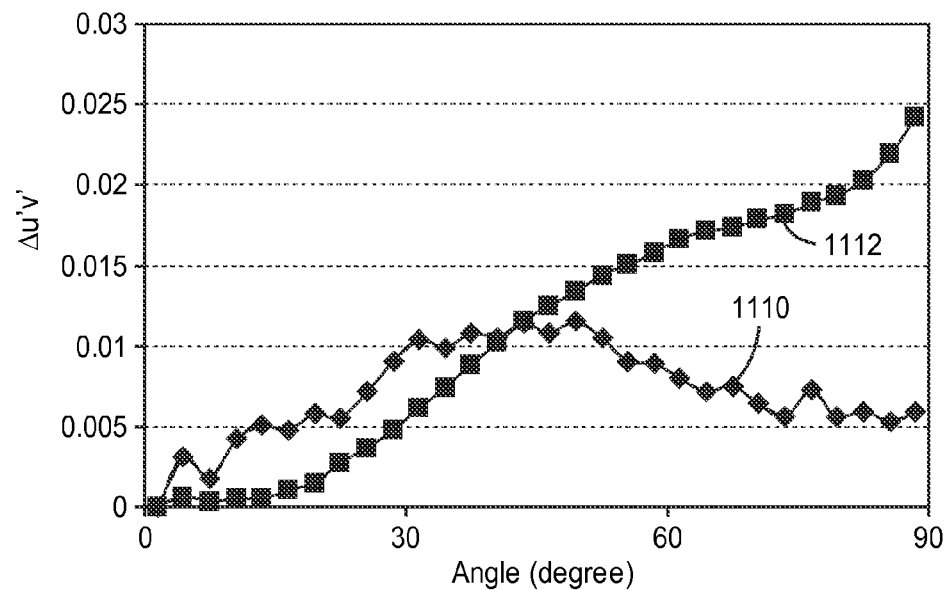
FIG. 11a is a graph that compares the actual measured color variation of a particular top-emitting OLED with the calculated color variation of a modeled device in which an optical extraction film is applied to that same OLED.

These results are plotted in FIG. 11a, where curve 1110 is the color deviation of the modeled OLED/extraction film combination, and curve 1112 is the color deviation of the OLED with no extraction film.

Example 2

50/60 Bullet-Shaped Extractors, Adhesive Backfill, Haze in ULI

An OLED with an optical extraction film was simulated in the same way as in Example 1, except that some haze was included in the nanovoided Ultra Low Index (ULI) layer. This was simulated by adding scattering centers to the simulated nanovoided layer, where the scattering centers scattered light primarily in the forward 45° cone angle, and with a scattering probability set at 20% (i.e., the probability for a light ray to be scattered at least once upon traveling through the layer was set to 20%). With this built-in haze in the nanovoided layer of the simulated extraction film, the angular color non-uniformity was reduced to 0.010, and the integral gain was improved to 1.51.

Example 3

50/60 Bullet-Shaped Extractors, HRI Backfill, No Haze in ULI

An OLED with an optical extraction film was simulated in the same way as in Example 1, except that the refractive index of the nanovoided ULI material was set to 1.26 (rather than 1.2), and the refractive index of the backfill material (see e.g. layer 416 in FIG. 5b) was chosen to be 1.65 (rather than 1.48) which is representative of a high refractive index curable resin such as a nanozirconia-filled UV curable acrylate resin, such as those described in U.S. Pat. No. 7,547,476 (Jones et al.).

The color non-uniformity and integral gain were determined as in Example 1. The calculated color deviation is given in Table 2. The maximum angular color non-uniformity with and without the optical extraction film was 0.0083 and 0.0242, respectively. The integral gain with the extraction film was 1.55.

TABLE 2

| Angle (degrees) | Δu'v' OLED with Extraction Film | Δu'v' Original OLED |
|---|---|---|
| 88.5 | 0.0022 | 0.0242 |
| 85.5 | 0.0030 | 0.0219 |
| 82.5 | 0.0053 | 0.0202 |
| 79.5 | 0.0083 | 0.0193 |
| 76.5 | 0.0072 | 0.0189 |
| 73.5 | 0.0072 | 0.0182 |
| 70.5 | 0.0072 | 0.0178 |
| 67.5 | 0.0060 | 0.0174 |
| 64.5 | 0.0059 | 0.0171 |
| 61.5 | 0.0054 | 0.0166 |
| 58.5 | 0.0060 | 0.0158 |
| 55.5 | 0.0058 | 0.0150 |
| 52.5 | 0.0048 | 0.0143 |
| 49.5 | 0.0065 | 0.0134 |
| 46.5 | 0.0058 | 0.0124 |
| 43.5 | 0.0075 | 0.0115 |
| 40.5 | 0.0062 | 0.0102 |
| 37.5 | 0.0067 | 0.0088 |
| 34.5 | 0.0068 | 0.0073 |
| 31.5 | 0.0070 | 0.0061 |
| 28.5 | 0.0055 | 0.0048 |
| 25.5 | 0.0040 | 0.0036 |

TABLE 2-continued

| Angle (degrees) | Δu'v' OLED with Extraction Film | Δu'v' Original OLED |
|---|---|---|
| 22.5 | 0.0037 | 0.0027 |
| 19.5 | 0.0020 | 0.0015 |
| 16.5 | 0.0014 | 0.0010 |
| 13.5 | 0.0013 | 0.0005 |
| 10.5 | 0.0008 | 0.0005 |
| 7.5 | 0.0002 | 0.0003 |
| 4.5 | 0.0010 | 0.0006 |
| 1.5 | 0.0000 | 0.0000 |

Figure 11B:
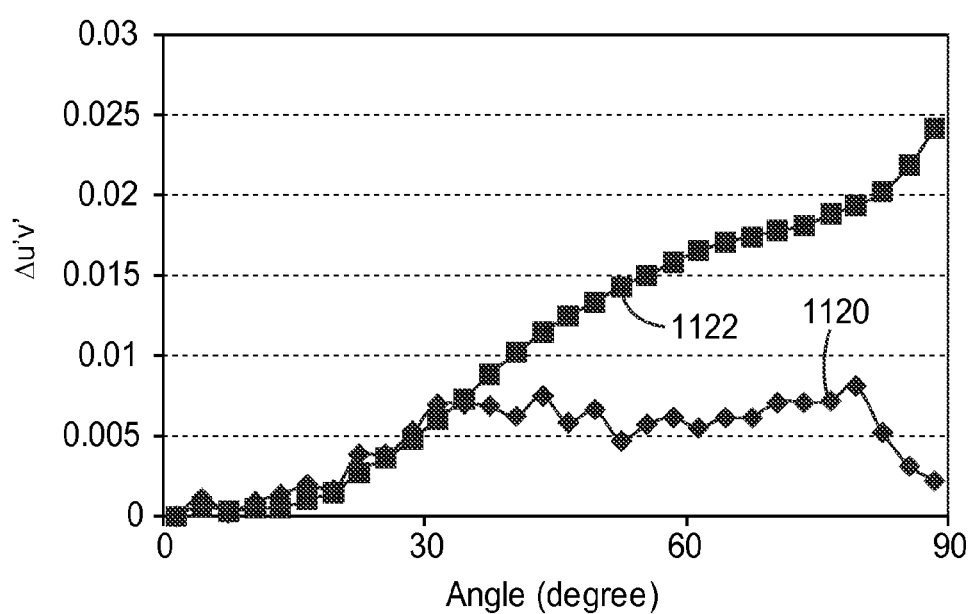
FIGS. 11b and 11c are graphs similar to that of FIG. 11a but for modeled devices in which different optical extraction films are applied to the OLED.

These results are plotted in FIG. 11b, where curve 1120 is the color deviation of the modeled OLED/extraction film combination, and curve 1122 is the color deviation of the OLED with no extraction film.

Example 4

50/60 Bullet-Shaped Extractors, HRI Backfill, Haze in ULI

An OLED with an optical extraction film was simulated in the same way as in Example 3, except that some haze was included in the nanovoided Ultra Low Index (ULI) layer, the same haze as described in Example 2. The color non-uniformity and integral gain were determined as in Example 1. The angular color non-uniformity was reduced to 0.007, and the integral gain was improved to 1.57.

Example 5

Bullet-Shaped Extractors Plus 1-D Prism Array

An OLED with an extraction film was simulated in the same way as in Example 1, except that a 1-dimensional (i.e., linearly extending) prism film was added to the substrate on the side opposite the OLED layer (see e.g. surface 412b in FIG. 5b), with the peaks of the prisms facing away from the OLED layer. The pitch of the prism array was 50 μm. The refractive index of the prism material was chosen to be the same as the substrate (n=1.65) and all other device parameters were the same as those in Example 1.

The calculated color deviation is given in Table 3. The maximum color non-uniformity was 0.0126 and the integrated gain was 1.34. Although the integrated gain is lower than that of Examples 1 and 2, the emitted light was substantially collimated in this example.

TABLE 3

| Angle (degrees) | Δu'v' OLED with Extraction Film | Δu'v' Original OLED |
|---|---|---|
| 88.5 | 0.008 | 0.0242 |
| 85.5 | 0.0105 | 0.0219 |
| 82.5 | 0.0074 | 0.0202 |
| 79.5 | 0.0066 | 0.0193 |
| 76.5 | 0.005 | 0.0189 |
| 73.5 | 0.0079 | 0.0182 |
| 70.5 | 0.0067 | 0.0178 |
| 67.5 | 0.0084 | 0.0174 |
| 64.5 | 0.01 | 0.0171 |
| 61.5 | 0.0126 | 0.0166 |
| 58.5 | 0.0118 | 0.0158 |
| 55.5 | 0.0122 | 0.0150 |
| 52.5 | 0.0119 | 0.0143 |
| 49.5 | 0.0098 | 0.0134 |

TABLE 3-continued

| Angle (degrees) | Δu'v' OLED with Extraction Film | Δu'v' Original OLED |
|---|---|---|
| 46.5 | 0.0111 | 0.0124 |
| 43.5 | 0.011 | 0.0115 |
| 40.5 | 0.01 | 0.0102 |
| 37.5 | 0.009 | 0.0088 |
| 34.5 | 0.0085 | 0.0073 |
| 31.5 | 0.0062 | 0.0061 |
| 28.5 | 0.0048 | 0.0048 |
| 25.5 | 0.0035 | 0.0036 |
| 22.5 | 0.0036 | 0.0027 |
| 19.5 | 0.0029 | 0.0015 |
| 16.5 | 0.0024 | 0.0010 |
| 13.5 | 0.0029 | 0.0005 |
| 10.5 | 0.0023 | 0.0005 |
| 7.5 | 0.0018 | 0.0003 |
| 4.5 | 0.0002 | 0.0006 |
| 1.5 | 0.0000 | 0.0000 |

Figure 11C:
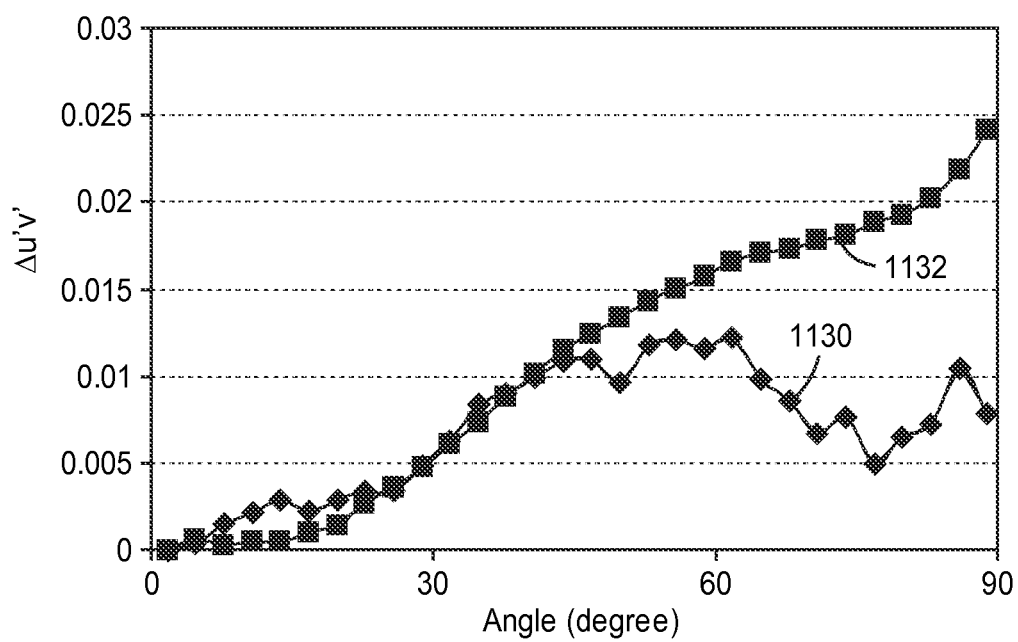

These results are plotted in FIG. 11c, where curve 1130 is the color deviation of the modeled OLED/extraction film combination, and curve 1132 is the color deviation of the OLED with no extraction film.

Example 6

Low Haze ULI, Soken PSA Backfill

Light extraction films were made with microreplicated nanovoided material (also referred to as Ultra Low Index or ULI material) as described below. Detailed information about microreplicated ULI and the process for making microreplicated ULI structures can be found in the commonly assigned provisional U.S. patent application 61/405,128, referenced elsewhere herein.

Bullet-Shaped Microreplication Tooling

Bullet-shaped microreplication tooling was made for this Example 6 using an excimer laser machining process as described in U.S. Pat. No. 6,285,001 (Fleming et al.). The resulting pattern was translated into a copper roll having an inverted bullet shape where the bullet features were arranged in a closely packed hexagon pattern with 50 μm pitch and the shape of the bullet was substantially as described in Example 1, except that the curved arc that defines the surface of revolution was bounded by angles θ1=25 degrees and θ2=65 degrees. The copper roll was then used as a replication master for a continuous cast and cure process using Accentrim resin (a urethane containing UV curable acrylate resin with a composition of 75% by weight PHOTOMER 6210 available from Cognis and 25% 1,6-hexanedioldiacrylate available from Aldrich Chemical Co., and a photoinitiator, 1% by weight Darocur 1173 from Ciba Specialty Chemicals). The Accentrim resin was cast onto a PET support film (DuPont 618 PET Film, 5 mil thickness) and then cured against a precision cylindrical tool using ultraviolet light.

A-174 Treated Silica Nanoparticles

In a 2 liter three-neck flask, equipped with a condenser and a thermometer, 960 grams of IPA-ST-UP organosilica elongated particles (available from Nissan Chemical Inc., Houston, Tex.), 19.2 grams of deionized water, and 350 grams of 1-methoxy-2-propanol were mixed under rapid stirring. The elongated particles had a diameter in a range from about 9 nm to about 15 nm and a length in a range of about 40 nm to about 100 nm. The particles were dispersed in a 15.2% wt IPA. Next, 22.8 grams of Silquest A-174 silane (available from GE Advanced Materials, Wilton, Conn.) was added to the flask. The resulting mixture was stirred for 30 minutes.

The mixture was kept at 81° C. for 16 hours. Next, the solution was allowed to cool down to room temperature. Next, about 950 grams of the solvent in the solution were removed using a rotary evaporator under a 40° C. water-bath, resulting in a 41.7 wt % A-174-modified elongated silica clear dispersion in 1-methoxy-2-propanol.

Low Haze, Low Index Formulation (ULI Resin)

To an amber glass jar was added 194.1 g of a 41.78 wt % solution of A-174 treated silica nanoparticles IPA-ST-UP in 1-methoxcy-2-propanol. To the jar was also added 64.87 g of Sartomer SR 444 and 40.5 g of Sartomer CN 9893 (both available from Sartomer Company, Exton, Pa.) as a 40% solution in ethyl acetate, 1.458 g of Irgacure 184, 0.48 g of Irgacure 819 (both available from Ciba Specialty Chemicals Company, High Point, N.C.), and 1.5 g of TEGO® Rad 2250 (available from Evonik Tego Chemie GmbH, Essen, Germany). The contents of the formulation were mixed thoroughly, giving a UV curable ULI resin with 50.5% solids by weight.

Ultra Low Index (ULI) Structures

Figure 10C:
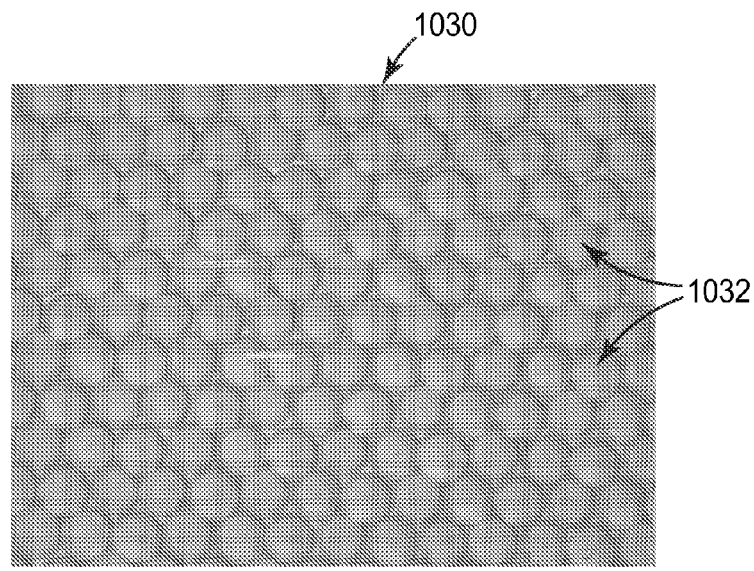
FIG. 10c is a micrograph showing a top view of a fabricated material having a structured surface comprising an array of such extraction elements.

The bullet film from the above-mentioned continuous cast and cure process was taken and treated for release. The release treatment consisted of first an oxygen plasma treatment of the film 500 ccm $O_2$ at 200 W for 20 seconds followed by a tetramethylsilane (TMS) plasma treatment, 200 ccm TMS at 150 W for 90 seconds. This film was then used as the replication master for a continuous cast and cure process to micro-replicate ultra low index (ULI) structures. The ULI resin was 50.5% solids by weight and was replicated on 3 mil thick primed PET film. The resin was cured using an LED curing system running at 35.3V and 5.85 amps. The microreplicated ULI films were postcured using a Fusion Lamp (H-Bulb). The refractive index of the microreplicated ULI layer was measured using a Metricon Model 2010 Prism Coupler (available from Metricon Corporation, Pennington, N.J.) and was found to be about 1.25. FIG. 10c shows an optical micrograph of the structured surface 1030 of the ULI replica that was made, where individual bullet-shaped extraction elements 1032 are clearly visible.

Extraction Film

The ULI film was backfilled with Soken 2032 pressure sensitive adhesive (commercially available from Soken Chemical & Engineering Co., Ltd, Japan) by lamination under pressure using a heated roller laminator with rollers at 230° F. Full filling of the PSA into the ULI bullet template was confirmed by optical microscopy. The film was also interrogated with a laser pointer and a similar refraction pattern was observed as for the bullet film tool that was replicated from the original copper tool.

The optical performance of this light extraction film was evaluated by bonding the backfilled adhesive layer of the extraction film to the substrate side of a Philips Lumiblade OLED test vehicle (available from Philips Lighting U.S., Somerset, N.J.). The integral gain was measured as the integrated power ratio of the OLED with the extraction film and the OLED without the extraction film. The maximum angular color non-uniformity with the embedded extraction film showed an improvement relative to the OLED without the embedded extraction film. The integral gain with the embedded extraction film was 1.28.

Example 7

OLED with ULI-Based Internal Extraction Film 400 nm 1D Structures

Figure 12:
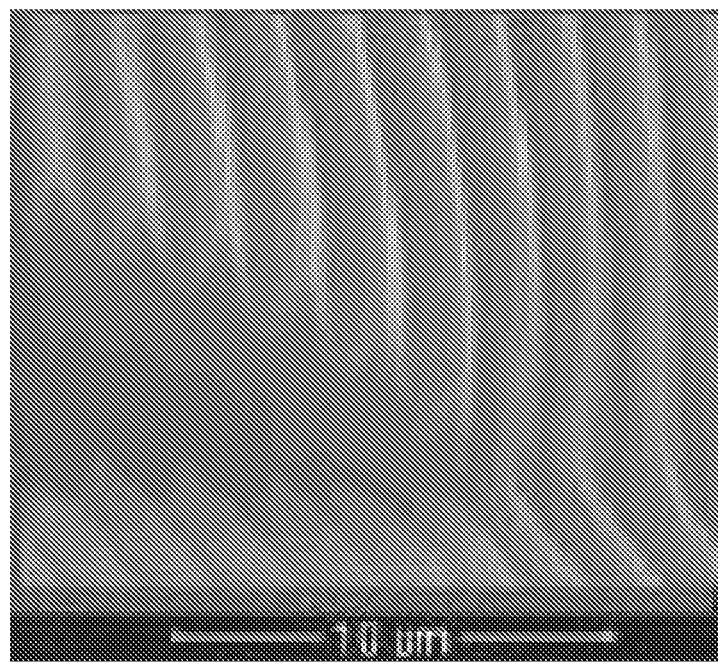
FIG. 12 is an SEM photograph showing a perspective view of a structured surface cut into a copper substrate.

The microreplication tool used for this experimental example 7 was a film replicate made by a cast and cure process from a metallic cylindrical tool pattern. The tool used for making the "sawtooth" 1-dimensional structured film tool (linearly extending prisms with a 400 nm pitch) was a modified diamond-turned metallic cylindrical tool pattern that was cut into the copper surface of the tool using a precision diamond turning machine. The resulting copper cylinder with precision sawtooth cut features (an SEM image of which is shown in FIG. 12) was nickel plated and coated with PA11-4. The plating and coating process of the copper master cylinder is a common practice used to promote release of cured resin during the microreplication process. The film replicate was made using an acrylate resin composition comprising acrylate monomers (75% by weight PHOTOMER 6210 available from Cognis and 25% by weight 1,6-hexanedioldiacrylate available from Aldrich Chemical Co.) and a photoinitiator (1% by weight Darocur 1173, Ciba Specialty Chemicals) that was cast onto a PET support film (5 mil thicknesses) and then cured against the precision cylindrical tool using ultraviolet light.

The surface of the resulting structured film was coated with a silane release agent (tetramethylsilane) using a plasma-enhanced chemical vapor deposition (PECVD) process. The release treatment consisted of an oxygen plasma treatment of the film with 500 ccm $O_2$ at 200 W for 20 seconds followed by a tetramethylsilane (TMS) plasma treatment with 200 ccm TMS at 150 W for 90 seconds. The surface-treated structured film was then used as a tool by wrapping and securing a piece of the film, structured side out, to the surface of a casting roll.

Low Haze, Low Index Formulation

A-174 treated IPA-ST-UP silica nanoparticles were prepared as in Example 6. To an amber glass jar was added 131.25 g of a 40 wt % solution of A-174 treated silica nanoparticles IPA-ST-UP in 1-methoxcy-2-propanol. To the jar was also added 42 g of Sartomer SR 444 and 10.5 g of Sartomer CN 9893 (both available from Sartomer Company, Exton, Pa.), 0.2875 g of Irgacure 184, 0.8 g of Irgacure 819 (both available from Ciba Specialty Chemicals Company, High Point, N.C.), 1 g of TEGO® Rad 2250 (available from Evonik Tego Chemie GmbH, Essen, Germany) and 25.5 grams of ethyl acetate. The contents of the formulation were mixed thoroughly giving a UV curable ULI resin with 50.5% solids by weight.

1D-ULI (Ultra Low Index) Structures

The 400 nm pitch saw tooth film described above under "400 nm 1D Structures" was taken and treated for release. The release treatment consisted of first an oxygen plasma treatment of the film with 500 ccm $O_2$ at 200 W for 20 seconds followed by a tetramethylsilane (TMS) plasma treatment with 200 ccm TMS at 150 W for 90 seconds. The surface-treated structured film was then used as a tool by wrapping and securing a piece of the film, structured side out, to the surface of a casting roll.

A film microreplication apparatus was employed to create microstructured nanovoided structures on a continuous film substrate. The apparatus included: a needle die and syringe pump for applying the coating solution; a cylindrical microreplication tool; a rubber nip roll against the tool; a series of UV-LED arrays arranged around the surface of the microreplication tool; and a web handling system to supply, tension, and take up the continuous film. The apparatus was configured to control a number of coating parameters manually including tool temperature, tool rotation, web speed, rubber nip roll/tool pressure, coating solution flow rate, and UV-LED irradiance. An example process is illustrated in FIG. 2.

The coating solution (see above) was applied to a 3 mil PET film (DuPont Melinex film primed on both sides) adjacent to the nip formed between the tool and the film. The flow rate of the solution was adjusted to about 0.25 ml/min and the web speed was set to 1 ft/min so that a continuous, rolling bank of solution was maintained at the nip.

The UV-LED bank used 8 rows with 16 LEDs (Nichia NCCU001, peak wavelength=385 nm) per row. The LEDs were configured on 4 circuit boards that were positioned such that the face of each circuit board was mounted at a tangent to the surface of the microreplication tool roll and the distance of the LEDs could be adjusted to distance of between 0.5 and 1.5 inches. The LEDs were driven 16 parallel strings of 8 LEDs in series. The UV-LED bank was controlled by adjusting the device current. For the experiments described herein the current was set to approximately 5.6 amps at 35.4 V with a distance of the LEDs to the microreplication tooling being between 0.5 and 1.0 inches. The irradiance was uncalibrated. The coating solution was cured with the solvent present as the film and tool rotated past the banks of UV LEDs, forming micro-replicated nano-porous structure arrays corresponding to the negative or 3-dimensional inverse or complement of the tool structure.

The structured film separated from the tool and was collected on a take-up roll. The nano-structured coating was further cured (post-process curing) by UV radiation to improve the mechanical characteristics of the coating. The post-process curing was accomplished using a Fusion Systems Model 1300P (Gaithersburg Md.) fitted with an H-bulb. The UV chamber was nitrogen-inerted to approximately 50 ppm oxygen.

OLED with ULI Based Internal Extraction Film

The nanoreplicated ULI layer on PET was backfilled and roughly planarized with a 1000 nm thick layer of silicon nitride by plasma-enhanced chemical vapor deposition (PECVD, Model PlasmaLab™ System100 available form Oxford Instruments, Yatton, UK). The parameters used in the PECVD process are set forth in Table 4.

TABLE 4

| Reactant/Condition: | Value: |
|---|---|
| SiH4 | 400 sccm |
| NH3 | 20 sccm |
| N2 | 600 sccm |
| Pressure | 650 mTorr |
| Temperature | 100° C. |
| High frequency (HF) power | 20 W |
| Low frequency (LF) power | 20 W |

The refractive index of the silicon nitride layer was measured using a Metricon Model 2010 Prism Coupler (available from Metricon Corporation, Pennington, N.J.) and was found to be 1.78. The refractive index contrast (difference in refractive indices) between the ULI and silicon nitride backfill in the nanostructured layer was about 0.5.

OLED fabrication on the planarized substrate began with approximately 110 nm-thick ITO deposited onto the silicon nitride backfill-coated 1D structures through a shadow mask to define the anode geometry with a 5×5 mm active area. Subsequently, a green organic emitting stack and cathode were deposited to complete the OLED. The OLEDs were fabricated by standard thermal deposition through a set of shadow masks in a vacuum system at base pressure of ca. $10^{-6}$ Torr.

The following OLED construction was deposited:

HIL (300 nm)/HTL (40 nm)/EML (30 nm, 6%)/ETL (20 nm)/LiF (1 nm)/Al (200 nm), where HIL is a hole-injection layer, HTL is a hole-transport layer, EML is an emissive layer, and ETL is an electron transport layer.

After completion, the OLED was encapsulated by laminating a barrier encapsulation film as described in U.S. Pat. No. 7,018,713 (Padiyath et al.) under inert atmosphere using SAES moisture and oxygen scavenging getters (available from SAES Getters USA, Inc., Colorado Springs, Colo.) in between the encapsulation film and the OLED cathode.

Samples were tested on an Autronic conoscope (available from Autronic-Melchers GmbH, Karlsruhe, Germany) to measure luminance and angularity. Table 5 shows the results of the measurement of several samples.

TABLE 5

| Example | Voltage at 10 mA/cm² | Axial Lum. (cm/m²) | Max. Lum. (cm/m²) | θ at Max Lum. | Φ at Max Lum. | Integrated Intensity (lm/m²) | Axial Lum. (cm/m²) | Total Gain | On-axis Gain |
|---|---|---|---|---|---|---|---|---|---|
| Example 7, Sample A | 7 | 6186 | 6486 | 8 | 104 | 14953 | 6186 | 1.56 | 1.44 |
| Example 7, Sample B | 7.1 | 5866 | 6092 | 10 | 296 | 13938 | 5866 | 1.46 | 1.37 |

TABLE 5-continued

| Example | Voltage at 10 mA/cm² | Axial Lum. (cm/m²) | Max. Lum. (cm/m²) | θ at Max Lum. | Φ at Max Lum. | Integrated Intensity (lm/m²) | Axial Lum. (cm/m²) | Total Gain | On-axis Gain |
|---|---|---|---|---|---|---|---|---|---|
| Example 7, Sample C | 7 | 6156 | 6313 | 13 | 245 | 14797 | 6156 | 1.55 | 1.43 |
| Example 7, Sample D | 7 | 5943 | 6214 | 9 | 251 | 14815 | 5943 | 1.55 | 1.38 |
| Example 7, Sample E | 7 | 5693 | 5845 | 9 | 290 | 13801 | 5693 | 1.44 | 1.33 |
| Example 7, Sample F | 7.1 | 5624 | 6049 | 10 | 285 | 14293 | 5624 | 1.49 | 1.31 |
| Example 7, Sample G | 7.6 | 5404 | 5673 | 14 | 291 | 13601 | 5404 | 1.66 | 1.47 |
| Example 7, Sample H | 6.5 | 5153 | 5321 | 5 | 69 | 12455 | 5153 | 1.52 | 1.41 |
| Example 7, Sample I | 7 | 5088 | 5291 | 11 | 271 | 12748 | 5088 | 1.56 | 1.39 |
| Example 7, Sample J | 6.9 | 5283 | 5451 | 4 | 28 | 12621 | 5283 | 1.54 | 1.44 |
| Example 7, Sample K | 7.1 | 5225 | 5347 | 2 | 53 | 12387 | 5225 | 1.51 | 1.42 |

Figure 13A:
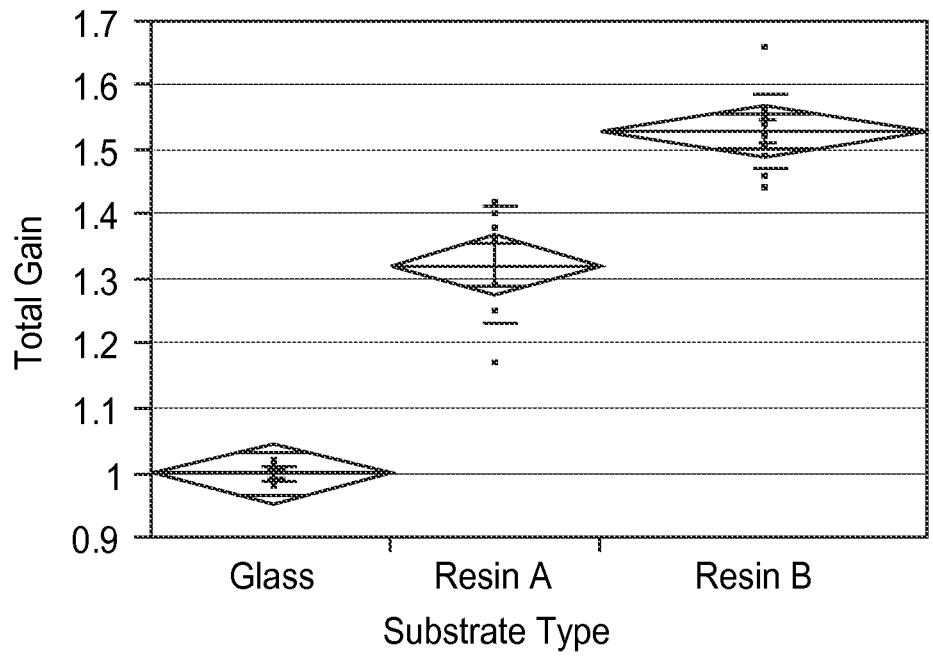
FIG. 13a is a graph that compares the total gain of an OLED device made with an optical extraction film as disclosed herein with that of two other OLED devices.
Figure 13B:
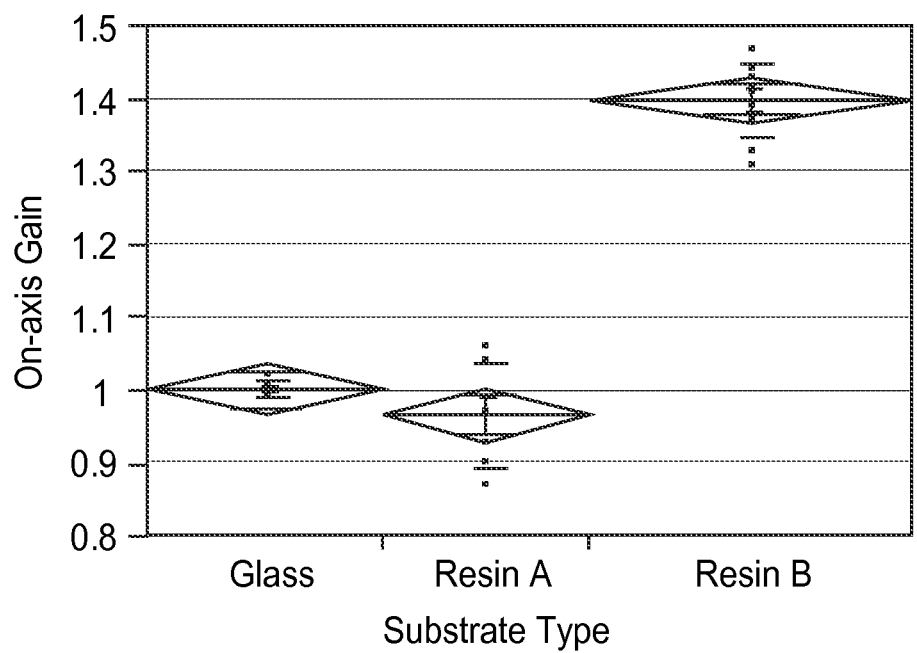
FIG. 13b is a graph that compares the on-axis gain of that OLED device made with the optical extraction film as disclosed herein (see FIG. 9a) with that of the two other OLED devices.

The measured values of the total gain and the on-axis gain are summarized in the right-most columns of FIGS. 13a and 13b, respectively, labeled as "Resin B". The diamond-shaped markings in the figure represent statistical measures of the group of data.

Comparative Example 1

OLED with Accentrim-Based Internal Extraction Film

A nanoreplicated film was made as described in Example 7, except that a non-nanovoided Accentrim resin (an urethane containing UV curable acrylate resin with a composition of 75% by weight PHOTOMER 6210 available from Cognis and 25% 1,6-hexanedioldiacrylate available from Aldrich Chemical Co. and a photoinitiator, 1% by weight Darocur 1173 from Ciba Specialty Chemicals) was used instead of the nanovoided ULI material. The 400 nm pitch sawtooth structured surface was formed in the Accentrim resin, which was then backfilled and roughly planarized with a 1000 nm thick layer of silicon nitride by plasma-enhanced chemical vapor deposition (PECVD, Model PlasmaLab™ System100 available form Oxford Instruments, Yatton, UK). The parameters used in the PECVD process are as described in Example 7.

The refractive index of the silicon nitride layer was measured using a Metricon Model 2010 Prism Coupler (available from Metricon Corporation, Pennington, N.J.), and was found to be 1.78. The refractive index of the Accentrim resin was about 1.48. The refractive index contrast between the Accentrim-based nanostructure and silicon nitride backfill in the nanostructured layer was about 0.2.

An OLED was fabricated on the backfilled substrate and encapsulated with a barrier film as described in Example 7. Samples were tested on an Autronic conoscope (available from Autronic-Melchers GmbH, Karlsruhe, Germany) to measure luminance and angularity. Table 6 shows the measurement results of several samples.

TABLE 6

| Example | Voltage at 10 mA/cm² | Axial Lum. (cm/m²) | Max. Lum. (cm/m²) | θ at Max Lum. | Φ at Max Lum. | Integrated Intensity (lm/m²) | Axial Lum. (cm/m²) | Total Gain | On-axis Gain |
|---|---|---|---|---|---|---|---|---|---|
| Comp. Ex. 1, Sample A | 10.1 | 3721 | 5763 | 11 | 110 | 12299 | 3721 | 1.29 | 0.87 |
| Comp. Ex. 1, Sample B | 7.2 | 3973 | 6155 | 11 | 71 | 13242 | 3973 | 1.38 | 0.93 |
| Comp. Ex. 1, Sample C | 8.5 | 4265 | 5921 | 10 | 296 | 12979 | 4265 | 1.36 | 0.99 |
| Comp. Ex. 1, Sample D | 6.9 | 4459 | 6155 | 10 | 296 | 13588 | 4459 | 1.42 | 1.04 |
| Comp. Ex. 1, Sample E | 10.3 | 4535 | 5927 | 14 | 316 | 13362 | 4535 | 1.4 | 1.06 |
| Comp. Ex. 1, Sample F | 7.1 | 3290 | 4264 | 12 | 288 | 9586 | 3290 | 1.17 | 0.9 |
| Comp. Ex. 1, Sample G | 6.6 | 3565 | 4503 | 12 | 276 | 10268 | 3565 | 1.25 | 0.97 |

The measured values of the total gain and the on-axis gain of these comparative examples are summarized in the middle columns of FIGS. 13a and 13b, respectively, labeled as "Resin A".

Comparative Example 2

OLED on Glass

A control sample OLED was fabricated on glass for comparison with the 1-D nanostructure samples. The fabrication and encapsulation was as described in Example 7, except that no optical extraction film was used. Samples were tested on an Autronic conoscope (available from Autronic-Melchers GmbH, Karlsruhe, Germany) to measure luminance and angularity. Table 7 shows the results of the measurement results of several samples.

TABLE 7

| Example | Voltage at 10 mA/cm² | Axial Lum. (cm/m²) | Max. Lum. (cm/m²) | θ at Max Lum. | Φ at Max Lum. | Integrated Intensity (lm/m²) | Axial Lum. (cm/m²) | Total Gain | On-axis Gain |
|---|---|---|---|---|---|---|---|---|---|
| Comp. Ex. 2, Sample A | 7.7 | 4236 | 4250 | 2 | 67 | 9458 | 4236 | 0.99 | 0.99 |
| Comp. Ex. 2, Sample B | 7.8 | 4311 | 4324 | 2 | 24 | 9671 | 4311 | 1.01 | 1 |
| Comp. Ex. 2, Sample C | 7.8 | 4309 | 4334 | 2 | 53 | 9560 | 4309 | 1 | 1 |
| Comp. Ex. 2, Sample D | 7.9 | 4315 | 4331 | 2 | 53 | 9570 | 4315 | 1 | 1.01 |
| Comp. Ex. 2, Sample E | 7 | 3621 | 3637 | 0 | 271 | 8010 | 3621 | 0.98 | 0.99 |
| Comp. Ex. 2, Sample F | 7.2 | 3735 | 3755 | 2 | 53 | 8323 | 3735 | 1.02 | 1.02 |
| Comp. Ex. 2, Sample G | 7.2 | 3690 | 3708 | 2 | 53 | 8283 | 3690 | 1.01 | 1.01 |
| Comp. Ex. 2, Sample H | 7.1 | 3622 | 3634 | 0 | 271 | 8115 | 3622 | 0.99 | 0.99 |

The measured values of the total gain and the on-axis gain of these comparative examples are summarized in the leftmost columns of FIGS. 13a and 13b, respectively, labeled as "glass".

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. An optical extraction film for enhancing light extraction from a self-emissive light source, comprising:

a flexible carrier film; and a first and second layer carried by the carrier film, the first and second layers defining therebetween a first embedded interface;

wherein the first embedded interface forms a first structured surface of first light extraction elements;

wherein the first layer has a nanovoided morphology and comprises a polymer binder, the first layer also having a refractive index less than 1.35;

wherein the second layer has a refractive index greater than that of the first layer; and wherein the first layer is disposed between the carrier film and the second layer.

2. The extraction film of claim 1, wherein the first layer has a refractive index less than 1.3.

3. The extraction film of claim 1, wherein the second layer has a refractive index greater than 1.4.

4. The extraction film of claim 1, wherein a refractive index difference between the first and second layers is at least 0.3, or at least 0.4, or at least 0.5.

5. The extraction film of claim 1, wherein the first light extraction elements are small enough and the second layer is thin enough so that a substantial portion of the extraction elements are disposed within an evanescent zone of the self-emissive light source when the extraction film is combined with the self-emissive light source.

6. The extraction film of claim 1, wherein the first light extraction elements comprise diffractive elements.

7. The extraction film of claim 1, wherein the first light extraction elements have a pitch of less than 1 micrometer.

8. The extraction film of claim 1, wherein the first light extraction elements have a pitch of greater than 1 micrometer.

9. The extraction film of claim 8, wherein the first light extraction elements comprise refractive elements.

10. The extraction film of claim 8, wherein the first light extraction elements have associated therewith a land, and the land has a thickness of less than 50 microns.

11. The extraction film of claim 10, wherein the land thickness is less than 25 microns.

12. The extraction film of claim 1, wherein the second layer comprises a light transmissive viscoelastic material.

13. The extraction film of claim 12, further comprising a release liner covering a major surface of the second layer opposite the first structured surface.

14. The extraction film of claim 1, wherein the extraction film is adapted for application to the self-emissive light source which is fabricated separately from the extraction film.

15. The extraction film of claim 1, wherein the extraction film is adapted as a substrate on which the self-emissive light source can be fabricated.

16. The extraction film of claim 1, wherein the carrier film has physical characteristics making it suitable as a free-standing support film in roll-to-roll processing.

17. The extraction film of claim 1, wherein neither the first layer nor the second layer has physical characteristics making it suitable as a free-standing support film in roll-to-roll processing.

18. An optical extraction film for enhancing light extraction from a self-emissive light source, comprising:
   a flexible carrier film; and
   a first and second layer carried by the carrier film, the first and second layers defining therebetween a first embedded interface;
   a third layer carried by the carrier film, the first and third layers defining therebetween a second embedded interface;
   wherein the first embedded interface forms a first structured surface of first light extraction elements;
   wherein the first layer has a nanovoided morphology and comprises a polymer binder, the first layer also having a refractive index less than 1.35;
   wherein the second layer has a refractive index greater than that of the first layer; and
   wherein the second embedded interface forms a second structured surface of second light extraction elements.

19. The extraction film of claim 18, wherein the first light extraction elements have a pitch less than 1 micron and the second light extraction elements have a pitch greater than 1 micron.

20. The extraction film of claim 18, wherein a substantial portion of the first light extraction elements are adapted to be disposed within an evanescent zone of the self-emissive light source when the extraction film is combined with the self-emissive light source.

21. The extraction film of claim 18, wherein the second light extraction elements have associated therewith a land, and the land has a thickness of less than 50 microns.

22. The extraction film of claim 21, wherein the land thickness is less than 25 microns.

23. The extraction film of claim 1, wherein the self-emissive light source comprises an OLED.

24. The extraction film of claim 1 in combination with the self-emissive light source, wherein the first and second layers are disposed between the flexible carrier film and the self-emissive light source.

25. A device, comprising:
   an OLED; and
   an optical extraction film attached to the OLED;
   wherein the optical extraction film includes a flexible carrier film and a first and second layer carried by the carrier film, the first and second layers defining therebetween a first embedded interface that forms a first structured surface of first light extraction elements;
   wherein the first layer has a nanovoided morphology and comprises a polymer binder, the first layer also having a refractive index less than 1.35; and
   wherein the second layer has a refractive index greater than that of the first layer and is disposed between the first layer and the OLED.

26. The device of claim 25, wherein a high refractive index region is associated with the OLED, the high refractive index region comprising at least one organic light generating layer and at least one transparent electrode layer, and wherein a substantial portion of the first light extraction elements are disposed within an evanescent zone of the high refractive index region.

27. The device of claim 26, wherein the at least one transparent electrode layer is part of the optical extraction film.

28. The device of claim 25, wherein the first light extraction elements comprise refractive elements and have a pitch of greater than 1 micron.

29. The device of claim 28, wherein the first light extraction elements have associated therewith a land, and the land has a thickness of less than 50 microns.

30. The device of claim 28, wherein the land has a thickness of less than 25 microns.

* * * * *

UNITED STATES PATENT AND TRADEMARK OFFICE
CERTIFICATE OF CORRECTION

PATENT NO. : 8,547,015 B2
APPLICATION NO. : 12/908798
DATED : October 1, 2013
INVENTOR(S) : Martin B. Wolk et al.

Page 1 of 1

It is certified that error appears in the above-identified patent and that said Letters Patent is hereby corrected as shown below:

In the Specification

Column 9, line 47,

Delete "$n_{eff} = (f)n_v^2 + (1-f)n_b^2,$" and insert -- $n_{eff}^2 = (f)n_v^2 + (1-f)n_b^2,$ --.

Signed and Sealed this
First Day of April, 2014

Michelle K. Lee
*Deputy Director of the United States Patent and Trademark Office*